United States Patent
Lue et al.

(10) Patent No.: US 7,948,799 B2
(45) Date of Patent: May 24, 2011

(54) STRUCTURE AND METHOD OF SUB-GATE NAND MEMORY WITH BANDGAP ENGINEERED SONOS DEVICES

(75) Inventors: Hang-Ting Lue, Hsinchu (TW); Hao Ming Lien, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 304 days.

(21) Appl. No.: 12/175,297

(22) Filed: Jul. 17, 2008

(65) Prior Publication Data
US 2009/0045452 A1    Feb. 19, 2009

Related U.S. Application Data

(63) Continuation-in-part of application No. 11/419,977, filed on May 23, 2006, now Pat. No. 7,414,889.

(60) Provisional application No. 60/968,076, filed on Aug. 27, 2007, provisional application No. 60/019,178, filed on Jan. 4, 2008.

(51) Int. Cl.
*G11C 11/34*    (2006.01)
*G11C 16/04*    (2006.01)
*G11C 16/06*    (2006.01)

(52) U.S. Cl. ......... 365/185.17; 365/185.28; 365/185.29; 257/321

(58) Field of Classification Search ............. 365/185.17, 365/185.28, 185.29; 257/321, 315
See application file for complete search history.

(56) References Cited

U.S. PATENT DOCUMENTS

| | | | |
|---|---|---|---|
| 4,630,086 | A | 12/1986 | Sato et al. |
| 5,286,994 | A | 2/1994 | Ozawa et al. |
| 5,319,229 | A | 6/1994 | Shimoji et al. |
| 5,952,692 | A | 9/1999 | Nakazato et al. |
| 6,011,725 | A | 1/2000 | Eitan et al. |
| 6,026,026 | A | 2/2000 | Chan et al. |
| 6,074,917 | A | 6/2000 | Chang et al. |
| 6,169,693 | B1 | 1/2001 | Chan et al. |
| 6,218,700 | B1 | 4/2001 | Papadas et al. |

(Continued)

FOREIGN PATENT DOCUMENTS

EP    0016246    10/1980

(Continued)

OTHER PUBLICATIONS

Search Report mailed Mar. 2, 2010 for a corresponding European Appln. No. 07252039.8, 5 pages.

(Continued)

*Primary Examiner* — Tuan T Nguyen
*Assistant Examiner* — Toan Le
(74) *Attorney, Agent, or Firm* — Kenta Suzue Haynes Beffel & Wolfeld LLP

(57) ABSTRACT

A bandgap engineered SONOS device structure for design with various AND architectures. The BE-SONOS device structure comprises a spacer oxide disposed between a control gate overlaying an oxide-nitride-oxide-nitride-oxide stack and a sub-gate overlaying a gate oxide. In one example, a BE-SONOS sub-gate-AND array architecture has multiple strings of SONONOS devices with sub-gate lines and diffusion bit lines. In another example, a BE-SONOS sub-gate-AND architecture has multiple strings of SONONOS devices with sub-gate lines, relying on the sub-gate lines that create inversions to substitute for the diffusion bit lines.

13 Claims, 50 Drawing Sheets

U.S. PATENT DOCUMENTS

| | | | |
|---|---|---|---|
| 6,512,696 | B1 | 1/2003 | Fan et al. |
| 6,709,928 | B1 | 3/2004 | Jenne et al. |
| 6,720,630 | B2 | 4/2004 | Mandelman et al. |
| 6,784,480 | B2 | 8/2004 | Bhattacharyya |
| 6,818,558 | B1 | 11/2004 | Rathor et al. |
| 6,897,533 | B1 | 5/2005 | Yang et al. |
| 6,912,163 | B2 | 6/2005 | Zheng et al. |
| 6,977,201 | B2 | 12/2005 | Jung et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,151,692 | B2 | 12/2006 | Wu et al. |
| 7,158,420 | B2 | 1/2007 | Lung |
| 7,164,603 | B2 | 1/2007 | Shih et al. |
| 7,187,590 | B2 | 3/2007 | Zous et al. |
| 7,190,614 | B2 | 3/2007 | Wu et al. |
| 7,209,390 | B2 | 4/2007 | Lue et al. |
| 7,348,625 | B2 * | 3/2008 | Liu et al. .............. 257/315 |
| 7,414,889 | B2 | 8/2008 | Lue et al. |
| 7,518,912 | B2 * | 4/2009 | Hung et al. .............. 365/185.03 |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0047755 | A1 | 3/2003 | Lee et al. |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183122 | A1 | 9/2004 | Mine et al. |
| 2004/0183126 | A1 | 9/2004 | Bae et al. |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0074937 | A1 | 4/2005 | Jung |
| 2005/0093054 | A1 | 5/2005 | Jung |
| 2005/0093057 | A1 | 5/2005 | Shone |
| 2005/0122783 | A1 | 6/2005 | Kim et al. |
| 2005/0219906 | A1 | 10/2005 | Wu |
| 2005/0224858 | A1 | 10/2005 | Hung et al. |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0001081 | A1 * | 1/2006 | Sasago et al. .............. 257/316 |
| 2006/0091444 | A1 | 5/2006 | Shone |
| 2006/0118858 | A1 | 6/2006 | Jeon et al. |
| 2006/0171207 | A1 * | 8/2006 | Kawamura et al. ....... 365/185.28 |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0226467 | A1 * | 10/2006 | Lue et al. .............. 257/315 |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0001210 | A1 | 1/2007 | Hsu et al. |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2009/0039417 | A1 | 2/2009 | Chen et al. |

FOREIGN PATENT DOCUMENTS

| | | |
|---|---|---|
| EP | 1411555 | 4/2004 |
| JP | 11040682 | 2/1999 |
| JP | 2004363329 | 12/2004 |
| KR | 2005-0003540 | 1/2005 |

OTHER PUBLICATIONS

European Search Report dated Jun. 9, 2010 for European Appln. No. 07252039.8.

Office Action mailed Nov. 23, 2007 in U.S. Appl. No. 11/197,668.

Office Action mailed Oct. 19, 2007 in U.S. Appl. No. 11/324,495.

White et al., "On the Go with SONOS" IEEE Circuits and Devices, Jul. 22-31, 2000.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38 (11) Nov. 1991 2519-2526.

Ito et al., "A Novel MNOS Technology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "Phines: A Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4, IEEE 2003.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4. IEEE 2003.

Baik, Seung, et al.,"High Speed and Nonvolatile Si Nanocrystal Memory for Scaled Flash Technology using Highly Field-Sensitive Tunnel Barrier," IEEE IEDM 03-545, 22.3.1-22.3.4. IEEE 2003.

Lee, Chang, et al., "A Novel SONOS Structure of SiO2/SiN/Al2O3 with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Research Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "Variot: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Sung, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," Int'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Y. Sasago et al. "90-nm-node Multi-Level AG-AND Type Flash Memory with Cell Size of True 2 F.sup.2/bit and Programming Throughput of 10 MB/s" IEEE 2003, consisting of 4 pages.

Y. Sasago et al. "10-MB/s Multi-Level Programming of Gb-Scale Flash Memory Enabled by New AG-AND Cell Technology" IEEE 2002, pp. 952-954.

H. Lue et al. "BE-SONOS: A Bandgap Engineered SONOS with Excellent Performance and Reliability" Electron Devices Meeting, 2005, IEDM Technical Digest, IEEE International, Dec. 5-7, 2005, pp. 547-550.

M. Kato et al. "A 0.4-um2 Self-Aligned Contactless Memory Cell Technology Suitable for 256-Mbit Flash Memories" Electron Devices Meeting, 1994, Technical Digest, International, Dec. 1994, pp. 921-923.

\* cited by examiner

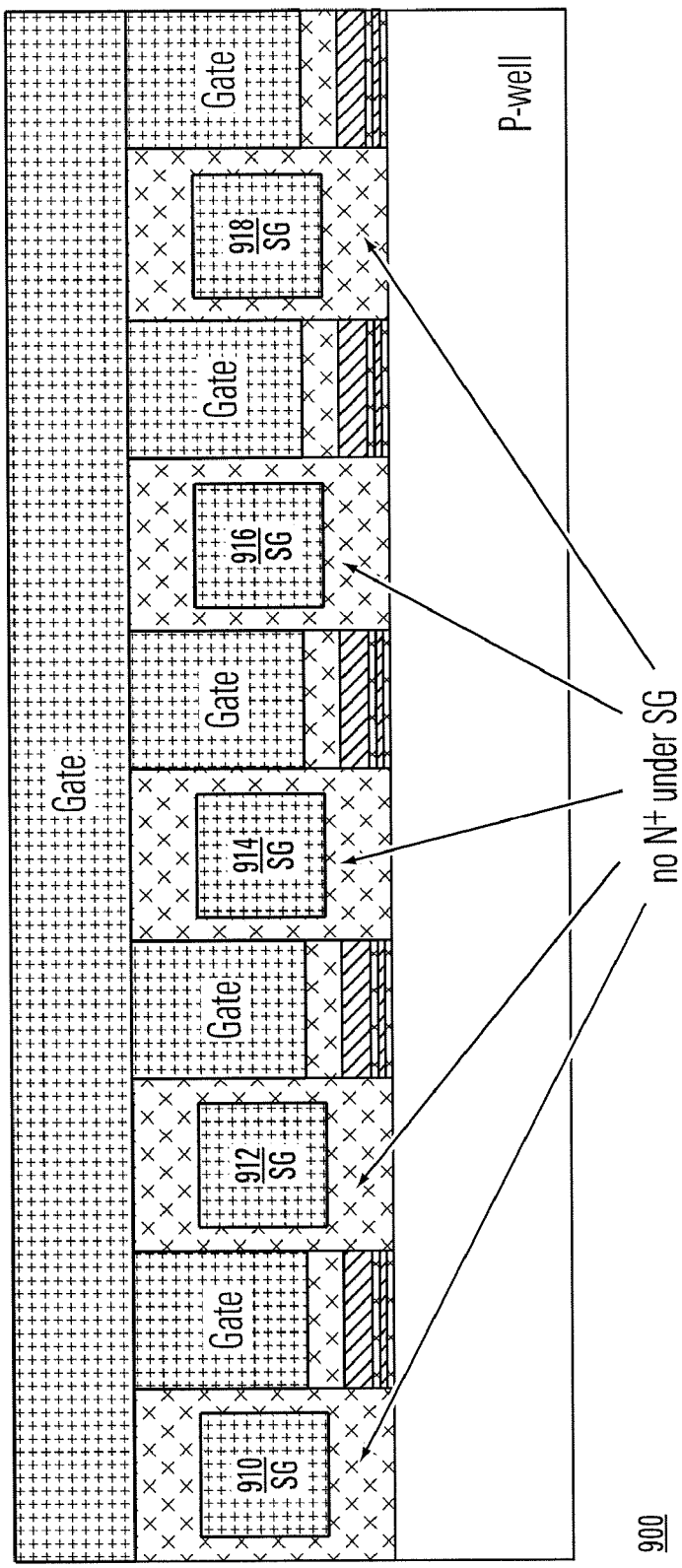

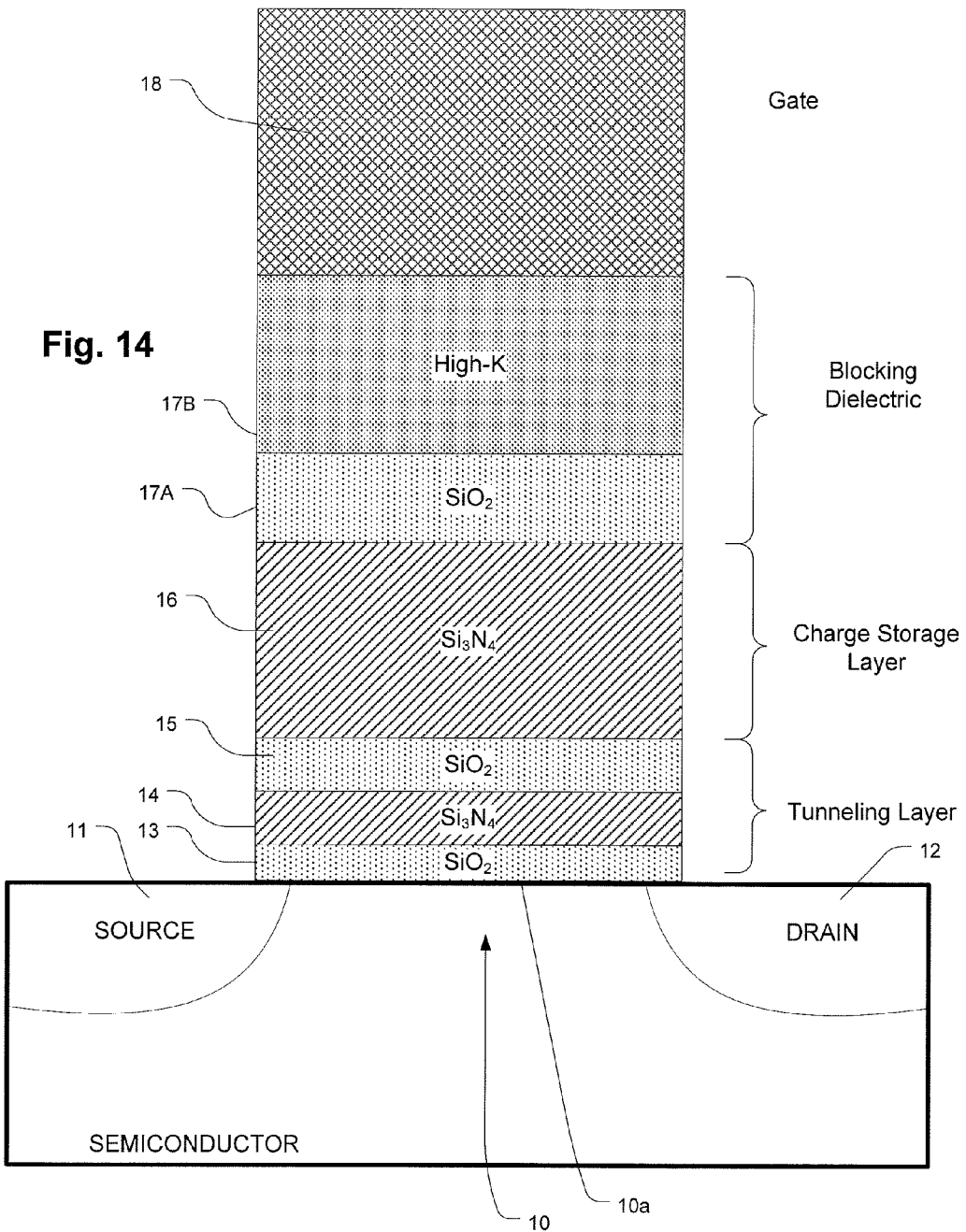

STRUCTURE AND METHOD OF SUB-GATE NAND MEMORY WITH BANDGAP ENGINEERED SONOS DEVICES

RELATED APPLICATIONS

This application is a continuation-in-part of U.S. application Ser. No. 11/419,977, filed 23 May 2006 by inventors Hang-Ting Lue and Hao Ming Lien entitled Structure and Method of Sub-Gate and Architectures Employing Bandgap Engineered SONOS Devices. This application is incorporated herein by reference.

This application claims the benefit of U.S. Provisional Patent Application No. 60/968,076, filed on 27 Aug. 2007, and claims the benefit of U.S. Provisional Patent Application No. 61/019,178, filed on 4 Jan. 2008, each of which is incorporated by reference as if fully set forth herein.

BACKGROUND OF THE INVENTION

1. Field of the Invention

The present invention relates generally to non-volatile memory devices, and more particularly, to nitride-based NAND memories.

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by various industry names such as (Poly)Silicon-Oxide-Nitride-Oxide-Silicon (SONOS), and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Another nitride device uses a relatively thick bottom oxide, e.g. greater than 3 nanometers, and typically about 5 to 9 nanometers, to prevent charge loss. Instead of direct tunneling, band-to-band tunneling induced hot hole injection (BT-BTHH) can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during sector erase, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A traditional floating gate device stores 1 bit of charge in a conductive floating gate. The advent of nitride memory cells in which each cell provides 2 bits of flash cells that store charge in an Oxide-Nitride-Oxide (ONO) dielectric. In a typical structure of a nitride memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of a cell.

Floating gate devices encounter substantial scaling challenges due to inter-floating gate coupling. Nitride trapping device replace the floating gates with charge trapping material. Some nitride trapping device include: one that stores charges locally and is sensitive to hot-hole induced damages, and SONOS that uses channel program/erase and suffers from retention problems caused by direct tunneling leakage through the thin tunnel oxide.

A conventional NAND-type floating gate flash memory is suitable for many commercial applications because the memory device possesses the characteristics of high-density, low-power and fast speed programming. However, due to the inter-floating gate coupling effect, the scaling of NAND-type floating gate devices is limited. When the space parameter for the floating gate device is shrunk, a high floating gate coupling effect may cause undesirable and severe disturbance. The conventional NAND-type floating gate device also suffers from tunnel oxide scaling issues and erratic bits where a local defect, or trapped charge, in a tunnel oxide can result in the leakage of the charge in the floating gate.

To address the scaling issue in floating gate devices, charge trapping devices such as SONOS, MNOS or nano-crystal trapping devices are suggested. However, these devices all suffer serious charge retention problems. For a SONOS device, the ultra-thin tunnel oxide is unable to properly preserve a charge storage. For a MNOS device, the structure does not provide a top oxide to block the charge loss. A nano-crystal device cannot be well-controlled because of the randomly distributed nano particles.

Accordingly, it is desirable to design NAND-type floating gate flash memories that provide scalability while overcoming the retention problems as well as maintaining efficient erase.

SUMMARY OF THE INVENTION

A bandgap engineered SONOS (referred to as "BE-SONOS" or "SONONOS") with adjacent sub-gate device structure is described, individually and for design with various NAND architectures. The BE-SONOS with sub-gate device comprises: a sub-gate, adjacent to a structure including an oxide disposed between a control gate overlaying an oxide-nitride-oxide-nitride-oxide ($O_3$—$N_2$—$O_2$—$N_1$—$O_1$) stack and a sub-gate overlaying a gate oxide. The device belongs to an integrated circuit.

An example device comprises a semiconductor body including a channel with a channel surface; a first BE-SONOS device structure positioned to create a read current in the semiconductor body under the first device structure; a second device structure proximate to the first device structure and including a sub-gate positioned to create an inversion layer in the semiconductor body under the second device structure to control read access of the adjacent first device structure without controlling read access of nonadjacent device structures; and circuitry providing a bias arrangement to cause hole tunneling across the tunneling dielectric layer.

In a first embodiment, a BE-SONOS SG-AND (sub-gate-AND) array architecture has multiple strings of SONONOS devices with sub-gate lines and diffusion bit lines. In a second embodiment, a BE-SONOS SGIB-AND (sub-gate-inversion-bitline-AND) architecture has multiple strings of SONONOS devices with sub-gate lines, and relying on the sub-gate lines that create inversions to substitute for the diffusion bit lines.

Various embodiments of the present technology provide greater scalability over floating gate AND-type memory devices, provide a uniform and self-converging hole tunneling erase operation, eliminate the inter-floating gate coupling effect, excellent charge retention, and/or small degradation despite numerous after program and erase cycles.

The structures and methods regarding to the present invention are disclosed in the detailed description below. This summary does not purport to define the invention defined by the claims. These and other embodiments, features, aspects, and advantages of the invention will become better understood with regard to the following description, appended claims and accompanying drawings.

BRIEF DESCRIPTION OF THE DRAWINGS

FIG. 9A is a layout diagram illustrating the cross sectional view in channel length direction of the SONONOS SGIB-AND array architecture in the second embodiment in accordance with the present invention.

FIG. 14 is a simplified diagram of an embodiment of a memory cell according to the present invention.

DETAILED DESCRIPTION OF EMBODIMENTS OF THE INVENTION

Figure 1:
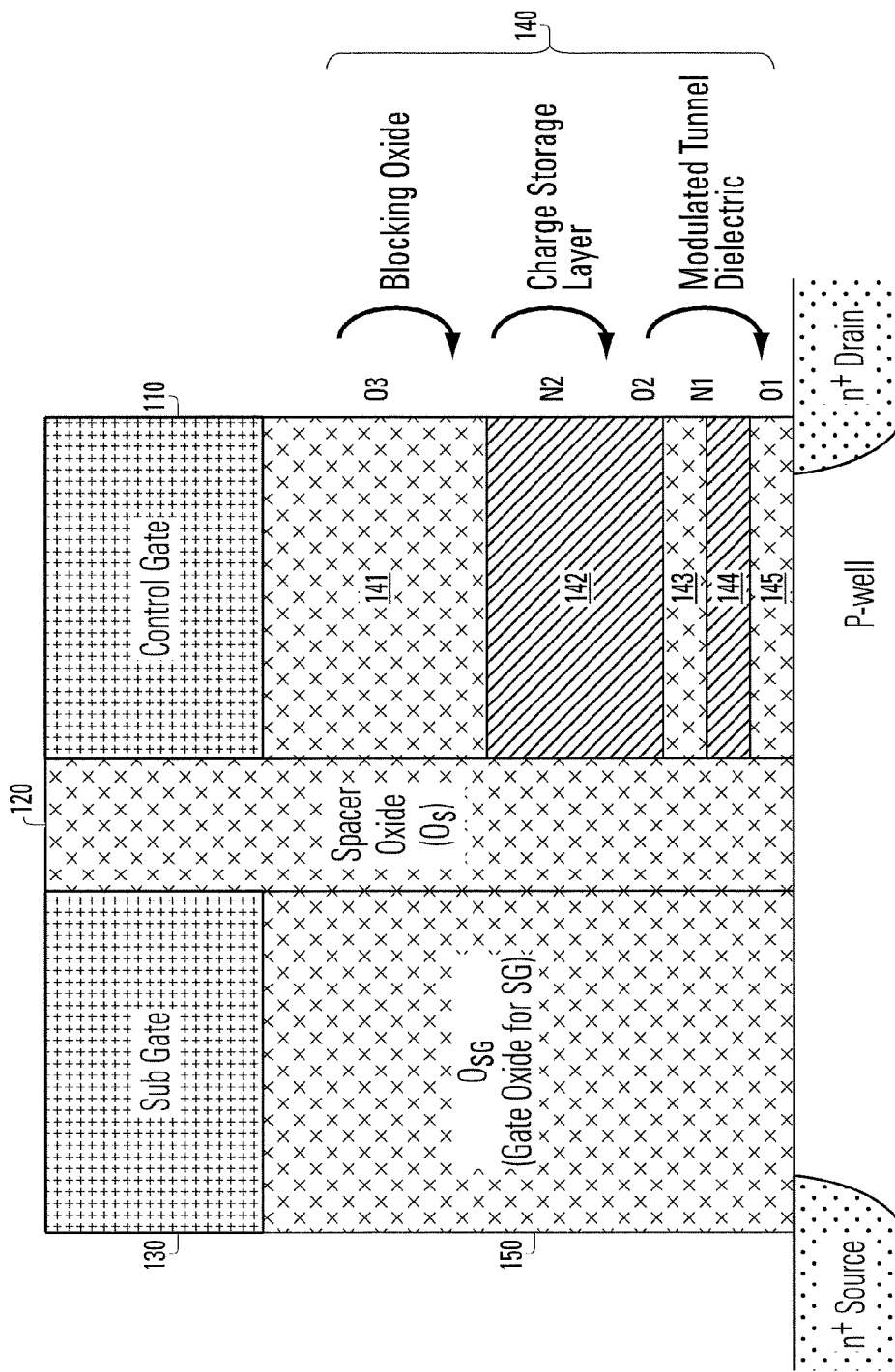
FIG. 1 is a structural diagram illustrating a cross-sectional view of a single cell structure of an n-channel BE-SONOS device with sub-gate in accordance with the present invention.

Referring now to FIG. 1, there is shown a structural diagram illustrating a cross-sectional view of a single cell structure of an n-channel BE-SONOS device 100 with sub-gate (SG). The n-channel BE-SONOS device 100 includes a spacer oxide (Os) 120 that is disposed between a control gate 110 and a sub-gate 130. An oxide-nitride-oxide-nitride-oxide ($O_3$—$N_2$—$O_2$—$N_1$—$O_1$) structure 140 is disposed underneath the control gate 110. A gate oxide $O_{SG}$ 150 is disposed underneath the sub-gate 130. The $O_3$—$N_2$—$O_2$—$N_1$—$O_1$ structure 140 includes a blocking oxide $O_3$ 141, a charge storage layer $N_2$ 142, and a modulated tunnel dielectric $O_2$—$N_1$—$O_1$ 143-145. The bottom $O_2$—$N_1$—$O_1$ 143-145 layers provide hole tunneling current and good data retention.

The n-channel BE-SONOS device 100 is a five-terminal device with two gates, the control gate 110 and the sub-gate 130. Underneath the control gate 110, there is the $O_3$—$N_2$—$O_2$—$N_1$—$O_1$ structure 140 for the charge storage. Underneath the sub-gate 130, there is the non-trapping gate oxide 150. The control gate 110 can control program, erase, and read the charge storage layer. The sub-gate 130 can provide source side injection (SSI) programming method. The source side injection is a low-power and high-speed programming method. The $O_1$—$N_1$—$O_2$ layer can be implemented with ultra-thin oxide and nitride, typically within 3 nm to provide hole direct tunneling. The N2 layer 142 is thicker than 5 nm to provide higher trapping efficiency. In the layer 141 formation method, one technique is to use a wet converted top oxide to provide a large density of traps at the interface between $O_3$ and $N_2$. The $O_3$ layer is typically thicker than 6 nm in order to prevent charge loss from top oxide. The $O_1$—$N_1$—$O_2$ layers serve as a tunneling dielectric for the hole tunneling.

An exemplary set of device parameters for the n-channel BE-SONOS device 100 with the sub-gate 130 is shown below.

| | |
|---|---|
| Bottom Oxide ($O_1$) | 15 A |
| Inter Nitride ($N_1$) | 20 A |
| Inter Oxide ($O_2$) | 18 A |
| Trapping Nitride ($N_2$) | 90 A |
| Gate Oxide for SG ($O_{SG}$) | 150 A |
| Spacer Oxide ($O_S$) | 200 A |
| Gate material | N+ - poly or P+ - poly gate |

Figure 2A:
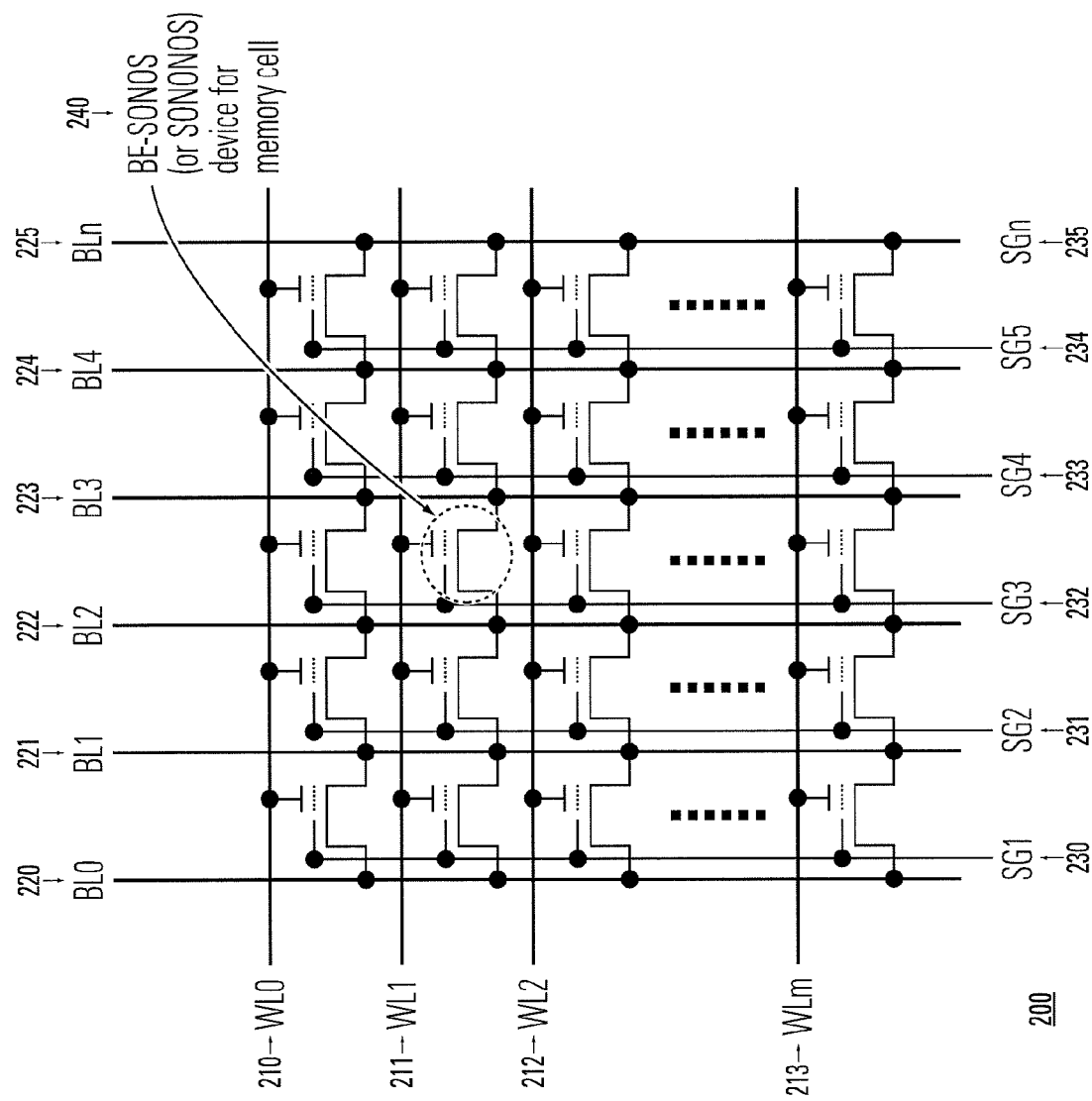
FIG. 2A is a circuit diagram illustrating a first embodiment of a BE-SONOS SG-AND array architecture with diffusion bitlines in accordance with the present invention.

In FIG. 2A, there is shown a circuit diagram illustrating a first embodiment of a BE-SONOS SG-AND array architecture 200 with diffusion bitlines. A plurality of SONONOS devices are connected in parallel to form the BE-SONOS SG-AND array architecture 200. The BE-SONOS array architecture 200 comprises a plurality of wordlines WL0 210, WL1 211, WL2 212, WLm 213 intersecting a plurality of bitlines BL0 220, BL1 221, BL2 222, BL3 223, BL4 224 and BLn 225. A corresponding sub-gate line is parallel and located nearby a bitline. A sub-gate SG1 230 is located adjacent to the bitline BL0 220. A sub-gate SG2 231 is located adjacent to the bitline BL1 221. A sub-gate SG3 232 is located adjacent to the bitline BL2 222. A sub-gate SG4 233 is located adjacent to the bitline BL3 223. A sub-gate SG5 234 is located adjacent to the bitline BL4 224. A sub-gate SGn 235 is located adjacent to the bitline BL5 225. A sample BE-SONOS (or SONONOS) device 240 that functions as a memory cell is shown in a circled area.

Figure 2B:
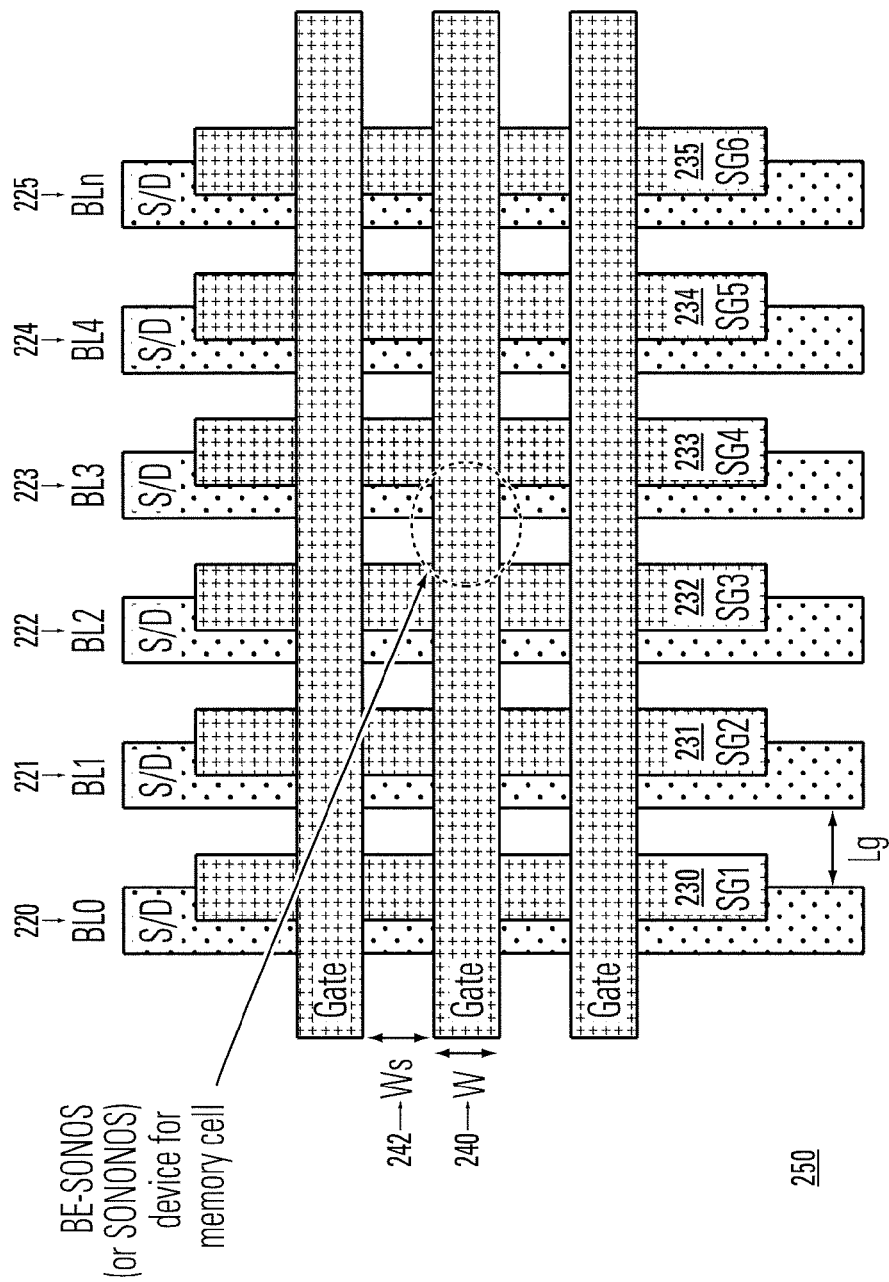
FIG. 2B is a layout diagram illustrating the first embodiment of the BE-SONOS SG-AND array architecture with diffusion bitlines in accordance with the present invention.

As shown in FIG. 2B, there is a layout diagram 250 illustrating the first embodiment of the BE-SONOS SG-AND array architecture 200 with diffusion bitlines. Although each sub-gate SG is in parallel with a corresponding bitline, each SG has a slight offset from the corresponding bitline, e.g. the SG1 230 is positioned slightly to the right of BL0 220. Every bitline can either serve as a source or a drain. Each SG is positioned between two bitlines, e.g. the SG1 230 between BL0 220 and BL1 221. Each bitline in the BL0 220, BL1 221, BL2 222, BL3 223, BL4 224, and BL5 225 can function as a source region or a drain region. Therefore, the SG1 230 is disposed between the source region in the BL0 220 and the drain region in the BL1 221. The parameters W 240 and Ws 242 are approximately equal to the parameter F, where the parameter F denotes the critical dimension in a technology node. For example, the parameter F is equal to 50 nm for a 50 nm node.

Figure 3A:
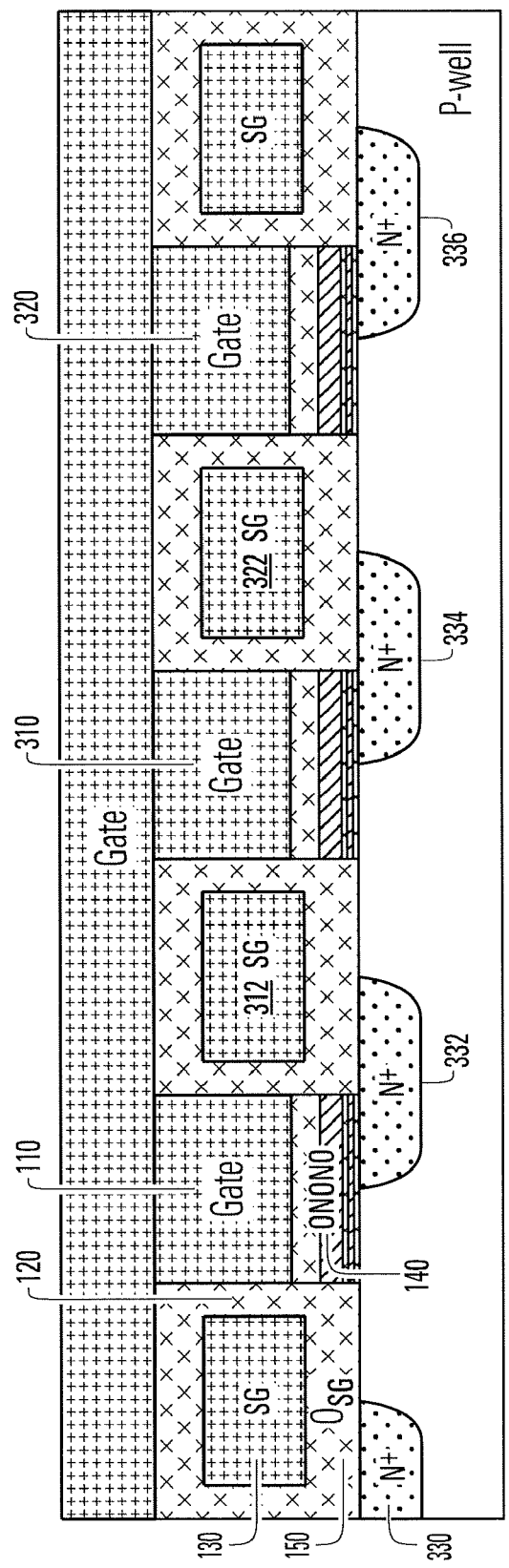
FIG. 3A is a layout diagram illustrating a cross-sectional view in channel length direction of the BE-SONOS SG-AND array architecture in the first embodiment in accordance with the present invention.

FIG. 3A is a layout diagram 300 illustrating a cross-sectional view in channel length direction of the BE-SONOS SG-AND array architecture in the first embodiment. The spacer oxide 120 separates the control gate 110 and the sub-gate 130. The $O_3$—$N_2$—$O_2$—$N_1$—$O_1$ structure 140 is disposed underneath the control gate 110. The gate oxide $O_{SG}$ 150 is disposed underneath the gate 130. A suitable implementation of the control gate 110 is poly-1, and a suitable implementation of the sub-gate 130 is poly-2. N+ buried diffusion (BD) wells 330, 332, 334 and 336 are implemented for diffusion bitlines (BLs). In the layout diagram 300, a first cell structure comprises the control gate 110 and the sub-gate 130, with an adjacent and second cell structure that comprises a gate 310 and a sub-gate 312, with an adjacent and third cell structure that comprises a gate 320 and a sub-gate 322.

Figure 3B:
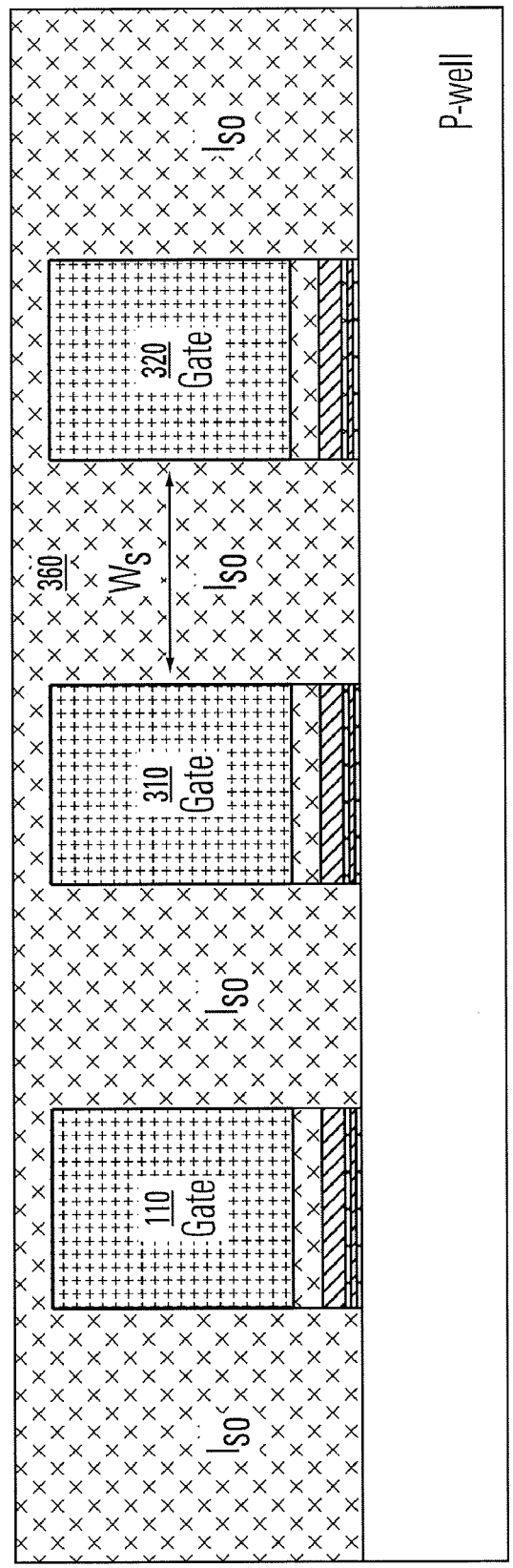
FIG. 3B is a layout diagram 350 illustrating a cross-sectional view in channel width direction of the BE-SONOS SG-AND array architecture in the first embodiment in accordance with the present invention.

In FIG. 3B, there is shown a layout diagram 350 illustrating a cross-sectional view in channel width direction of the BE-SONOS SG-AND array architecture in the first embodiment. The gap between the gate 310 and the gate 320 is denoted by a parameter Ws 360, which provides isolation between the gate 310 and the gate 320. Other similar isolations are shown between two gates to provide an isolation between two gates. The pitch in the channel width direction is approximately equal to 2F smaller than that in channel length direction 3F caused by a diffusion bitline. Therefore, the BE-SONOS SG-AND architecture is approximately equal to $6F^2$ per cell.

Figure 4A:
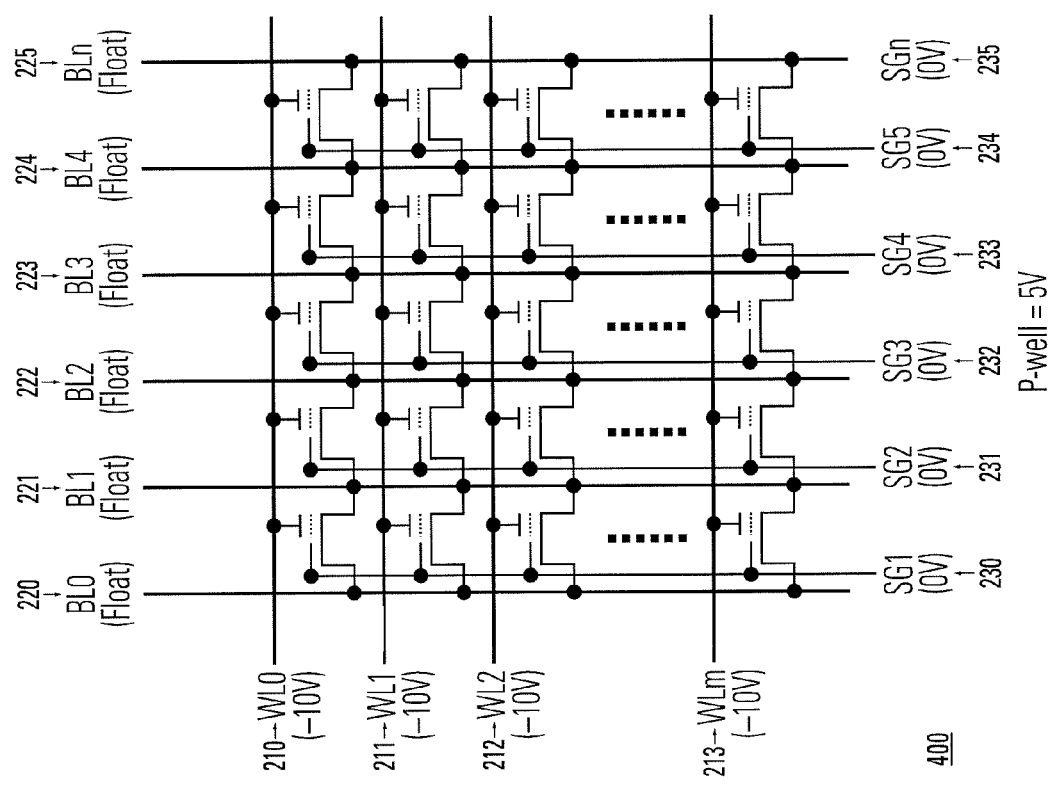
FIG. 4A is a circuit diagram illustrating an electrical reset for the SONONOS SG-AND array architecture in the first embodiment in accordance with the present invention.
Figure 4B:
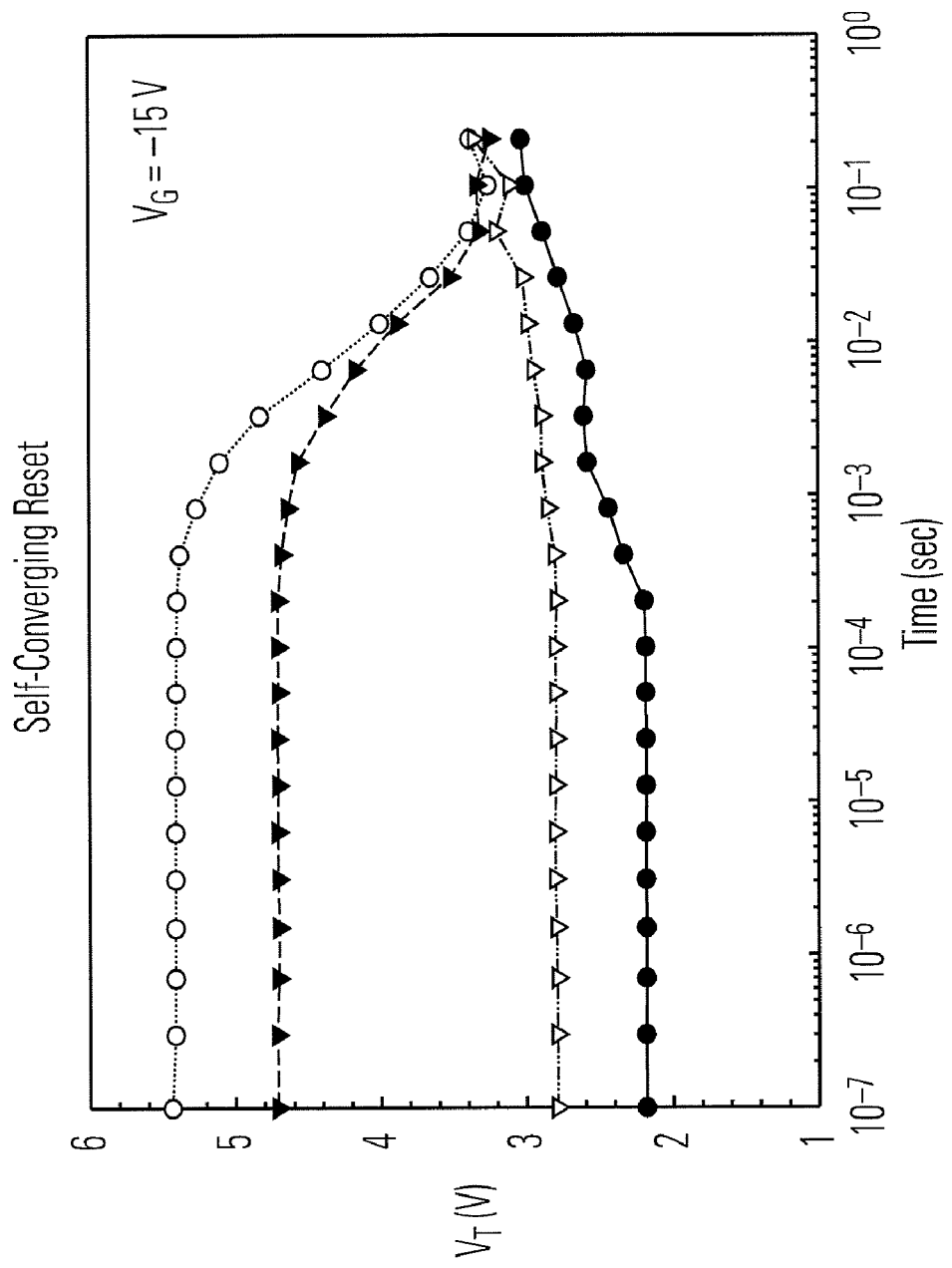
FIG. 4B is a graphical diagram illustrating a waveform of a self-converging reset in the first embodiment in accordance with the present invention.

FIG. 4A is a circuit diagram 400 illustrating an electrical reset for the SONONOS SG-AND array architecture of the first embodiment. During the electrical reset, the wordlines (or gates) WL0 210, WL1 211, WL2 212, and WLm 213 are set to −10 volts, the bitlines BL0 220, BL1 221, BL2 222, BL3 223, BL4 224 and BL5 225 are left floating, and the sub-gates SG1 230, SG2 231, SG3 232, SG4 233, SG5 234, and SGn 235 are set to 0 volt. In one embodiment, the odd number sub-gates are electrically connected together, including SG1 230, SG3 232 and SG5 234, while the even number sub-gates are electrically connected together, including SG2 231, SG4 233 and SGn 235. Before operations, the memory circuit 400 is reset by applying Vgb=−15V (or partition the gate voltage into each WL and p-well), which produces a desirable self-converging property, as shown in a graph 450 in FIG. 4B. Even if the BE-SONOS device is initially charged to various Vt, the reset operation can tighten these initial points to the reset/erase state. A typical reset time is around 100 msec. In one example, the n-channel BE-SONOS with ONONO=15/20/18/70/90 Angstrom, and a N+-poly gate. Lg/W=0.22/0.16 um.

To state in another way, a reset operation is carried out to tighten the Vt distribution before operations. In contrast to a floating gate device where there is no self-converging erase, the BE-SONOS provides a self-converging erase reset/erase methods, which is necessary because the initial Vt distribution is often widely distributed due to the process issues, such as plasma charging effect. The self-converging reset assists in tighten the initial Vt distribution.

Figure 5A:
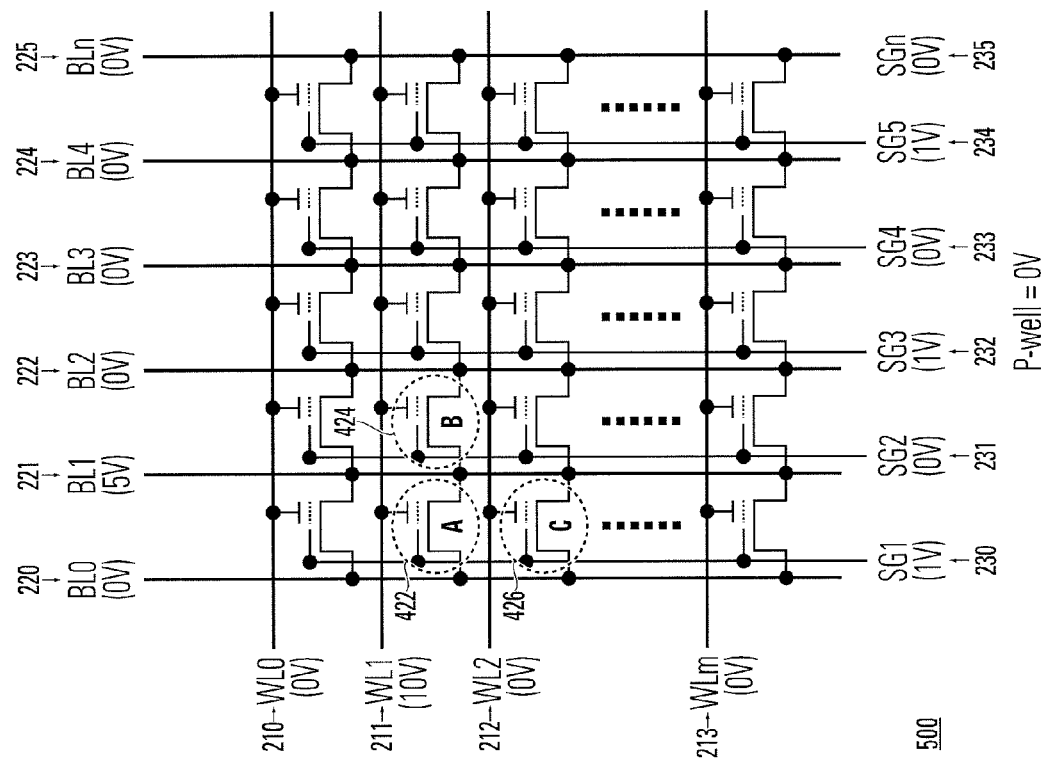
FIG. 5A is a circuit diagram illustrating an electrical program for the SONONOS SG-AND array architecture in the first embodiment in accordance with the present invention.
Figure 5B:
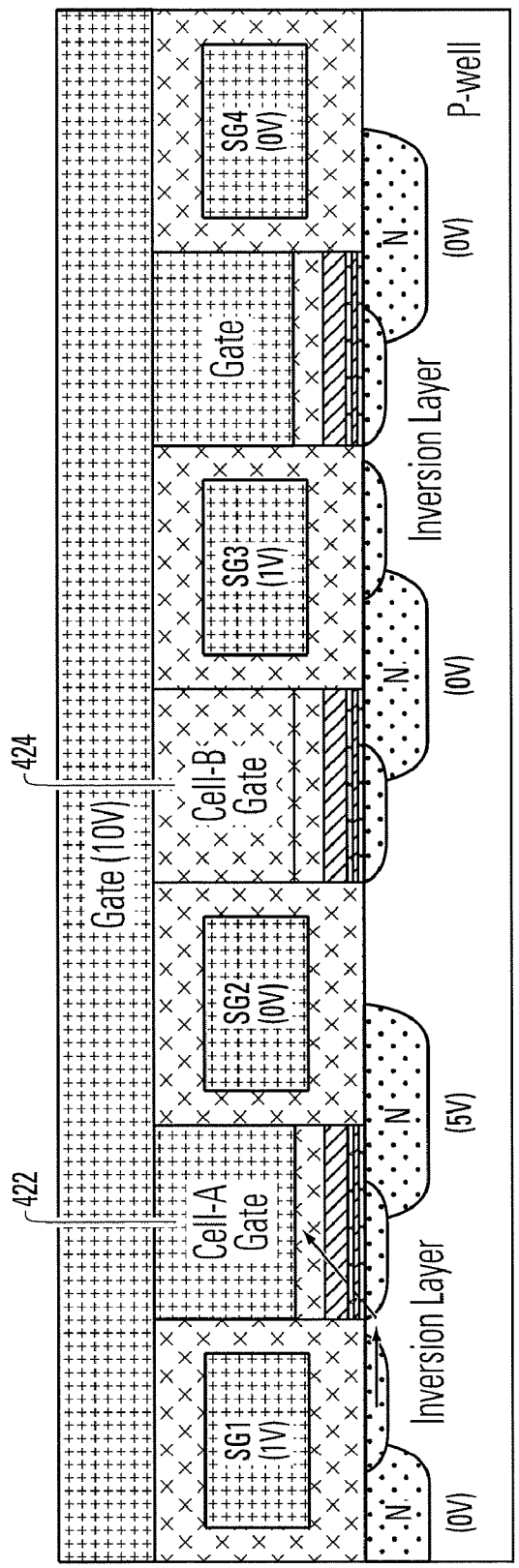
FIG. 5B is a layout diagram illustrating the electrical program for the SONONOS SG-AND array architecture in the first embodiment in accordance with the present invention.

FIG. 5A is a circuit diagram 500 illustrating an electrical program for the SONONOS SG-AND array architecture in the first embodiment, while FIG. 5B is a layout diagram 550 illustrating the electrical program for the SONONOS SG-AND array architecture in the first embodiment. In one example during electrical program, the wordline WL1 211 is set to 10 volts while the other wordlines WL0 210, WL2 212, and WLm 213 are set 0 volt. The bitline BL1 221 is set to 5 volts, and the bitlines BL0 220, BL2 222, BL3 223, BL4 224, and BLn 225 are set to 0 volt. The odd number sub-gates SG1 230, SG3 232 and SG5 234 are set to 1 volt, while the even number sub-gates SG2 231, SG4 233, and SGn 235 are set to 0 volt. The bitlines BL0 220, BL1 221, BL2 222, BL3 223, BL4 224 and BL5 225 provide a greater flexibility in programming than sub-gates SG1 230, SG2 231, SG3 232, SG4 233, SG5 234, and SGn 235 because each bitline can be independently programmed, while the sub-gates are programmed based on the even number or odd number of sub-gates. One type of electrical programming method is a source side injection. The source side injection programs a cell to a high voltage threshold Vt state. For example, the source injection applies Vg=10V to the selected WL1, Vg=0V to other wordlines, SG=1V for programming, and SG=0V for inhibition. The voltage setting of the SG voltage at 1 volt is intended as an illustration such that in general it is typically 0.5 to 2 volts higher than the threshold voltage under SG gate.

When a cell-A 422 is selected programming, the SG is set to 1 volt so that the channel underneath SG is slightly turned on. Electrons are injected into the cell-A 422 by source side injection method to make the voltage threshold, Vt, higher than PV. The SG for a cell-B 424 is set to 0 volt, which turns SG off so that there is no injection into the cell-B 424. As for a cell-C 426, the SG is set to 1 volt where the WL=0 volt which turns off cell-C 426 so that there is also no injection into the cell-C 426. As a result, programming can be randomly selected with adequate program inhibit technique.

To carry out an electrical program, the selected wordline is applied a high voltage, 10 volts, and the sub-gate is applied 1 volt to perform a source side injection. The source side injection is a low-power and high-speed programming method. One of skill in the art should recognize that parallel programming methods such as page programming with 2 kB cells in parallel can burst the programming throughput to more than 10 MB per second while the cell current consumption can be controlled within 2 mA. To avoid program disturbance to other bitlines, the sub-gate SG2 231 is set to 0 volt and turns off the inhibit cell.

Figure 6A:
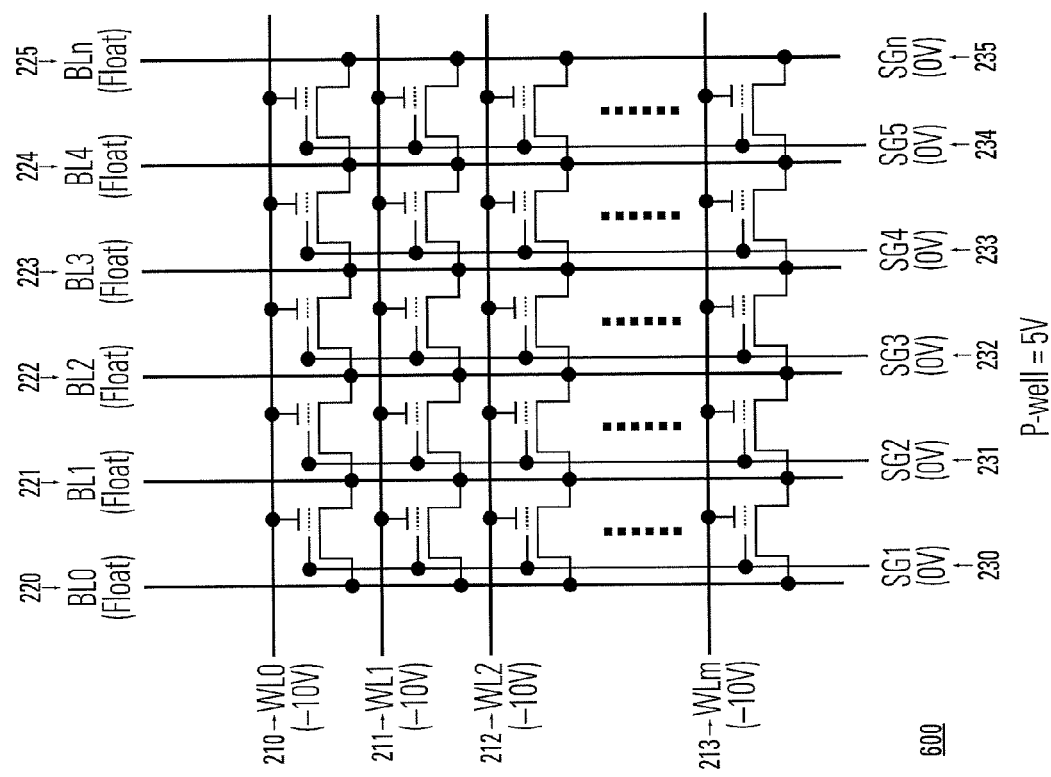
FIG. 6A is a circuit diagram illustrating an electrical erase for the SONONOS SG-AND array architecture of the first embodiment in accordance with the present invention.
Figure 6B:
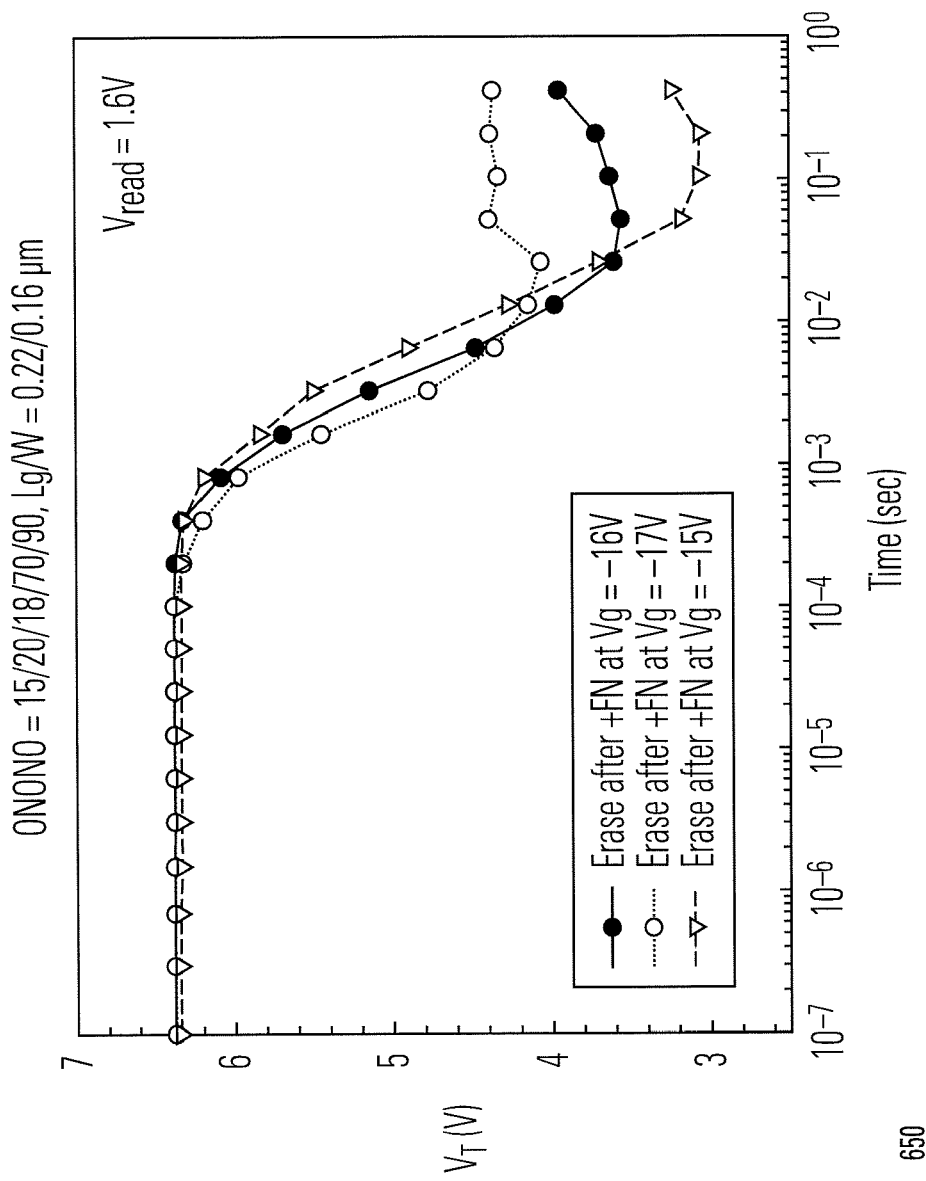
FIG. 6B is a graphical diagram illustrating a waveform of a self-converging erase in accordance with the present invention.

As illustrated in FIG. 6A, there is a circuit diagram 600 showing an electrical erase for the SONONOS SG-AND array architecture in the first embodiment. The erase operation is executed similar to the reset operation. During electrical erase, the wordlines WL0 210, WL1 211, WL2 212, and WLm 213 are set to −10 volts, the bitlines BL0 220, BL1 221, BL2 222, BL3 223, BL4 224 and BL5 225 are left floating, and the sub-gates SG1 230, SG2 231, SG3 232, SG4 233, SG5 234, and SGn 235 are set to 0 volt. The erase operation is performed in the unit of a sector or block. The BE-SONOS device produces desirable self-converging erase property, as shown in a graph 650 in FIG. 6B. The erase saturation Vt is dependent on the parameter Vg. A higher Vg causes a higher saturated Vt. The convergent time is typically around 10 to 100 msec.

Figure 7:
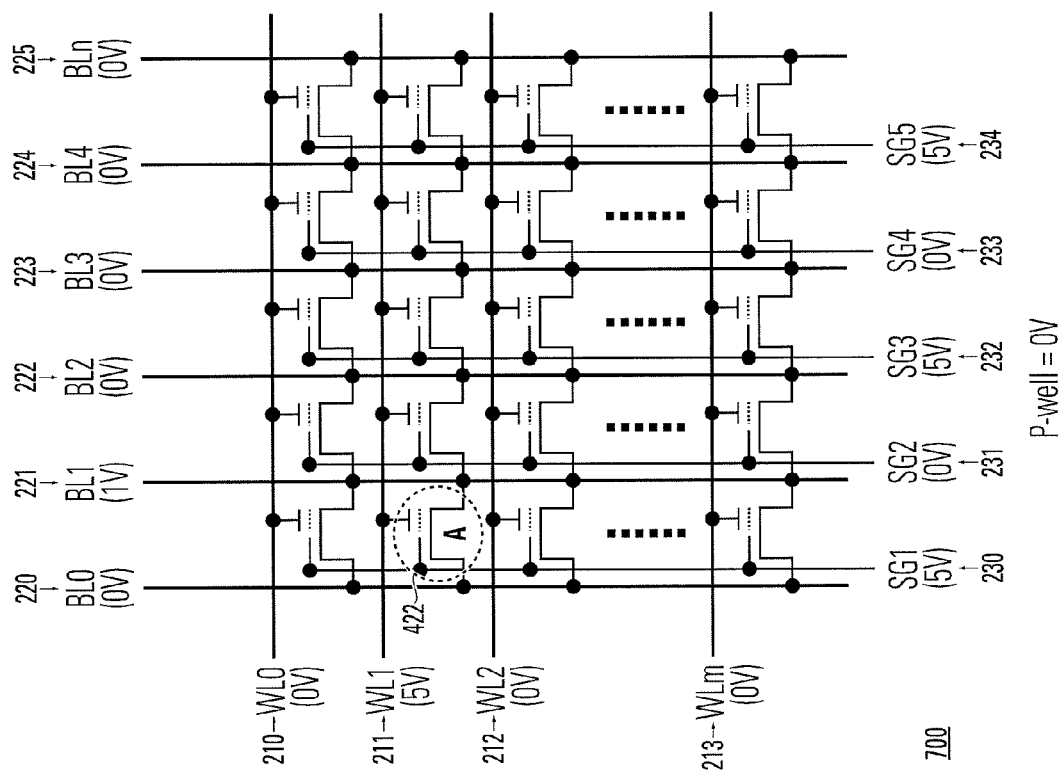
FIG. 7 is a circuit diagram illustrating a read operation for the SONONOS SG-AND array architecture in the first embodiment in accordance with the present invention.

FIG. 7 is a circuit diagram 700 illustrating a read operation for the SONONOS SG-AND array architecture in the first embodiment. In one example during a read operation of the cell-A 422, the wordline WL1 211 is set to 5 volts while the other wordlines WL0 210, WL2 212, and WLm 213 are set 0 volt. The bitline BL1 221 is set to 1 volt, and the bitlines BL0 220, BL2 222, BL3 223, BL4 224, and BLn 225 are set to 0 volt. The odd number sub-gates SG1 230, SG3 232 and SG5 234 are set to 3 volts, while the even number sub-gates SG2 231 and SG4 233 are set to 0 volt. A read operation is performed by applying a gate voltage that is between an erased state Vt (EV) and a programmed state Vt (PV). The gate voltage is typically around 5 volts. Alternatively, the gate voltage can be selected to be more than 5 volts or less than 5 volts, provided the gate voltage falls in the range of a high Vt value and a low Vt value. If Vt of the cell-A 422 is higher than 5 volts, then the read current is likely to be a very small value (e.g., <0.1 µA). If Vt of the cell-A 422 is less than 5 volts, the read current is likely to be a high value (e.g., >0.1 µA).

The applied voltage at a bitline (BL) is typically around 1 volt. A larger read voltage will induce more current, but the read disturbance may be larger. The WL number of SG-AND string is typically 64, 128, or 256. A larger number of SG-AND string may save more overhead and increase the array efficiency. However, the program distribution may be larger. A trade-off is weighed in choosing an adequate number of SG-AND string.

Figure 8A:
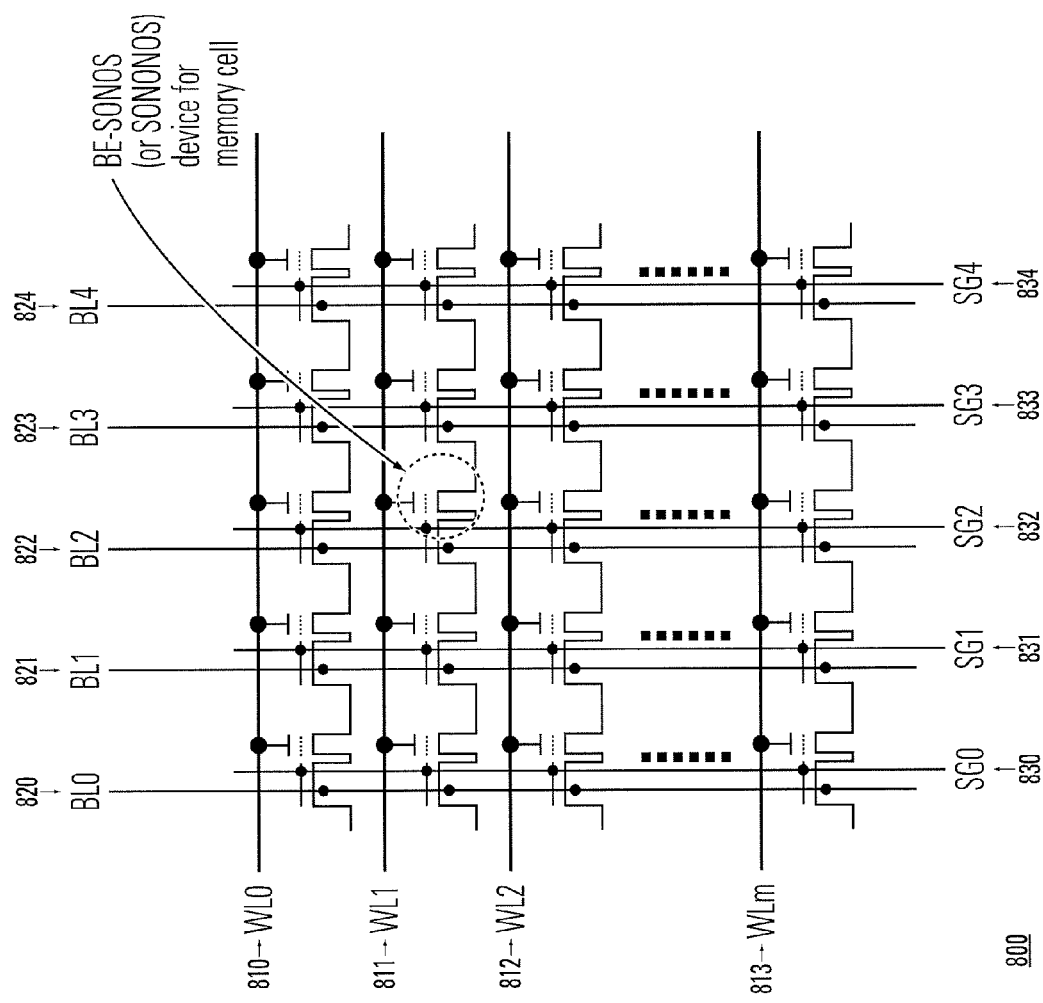
FIG. 8A is a circuit diagram illustrating a second embodiment of a BE-SONOS SGIB-AND array architecture in accordance with the present invention.
Figure 8B:
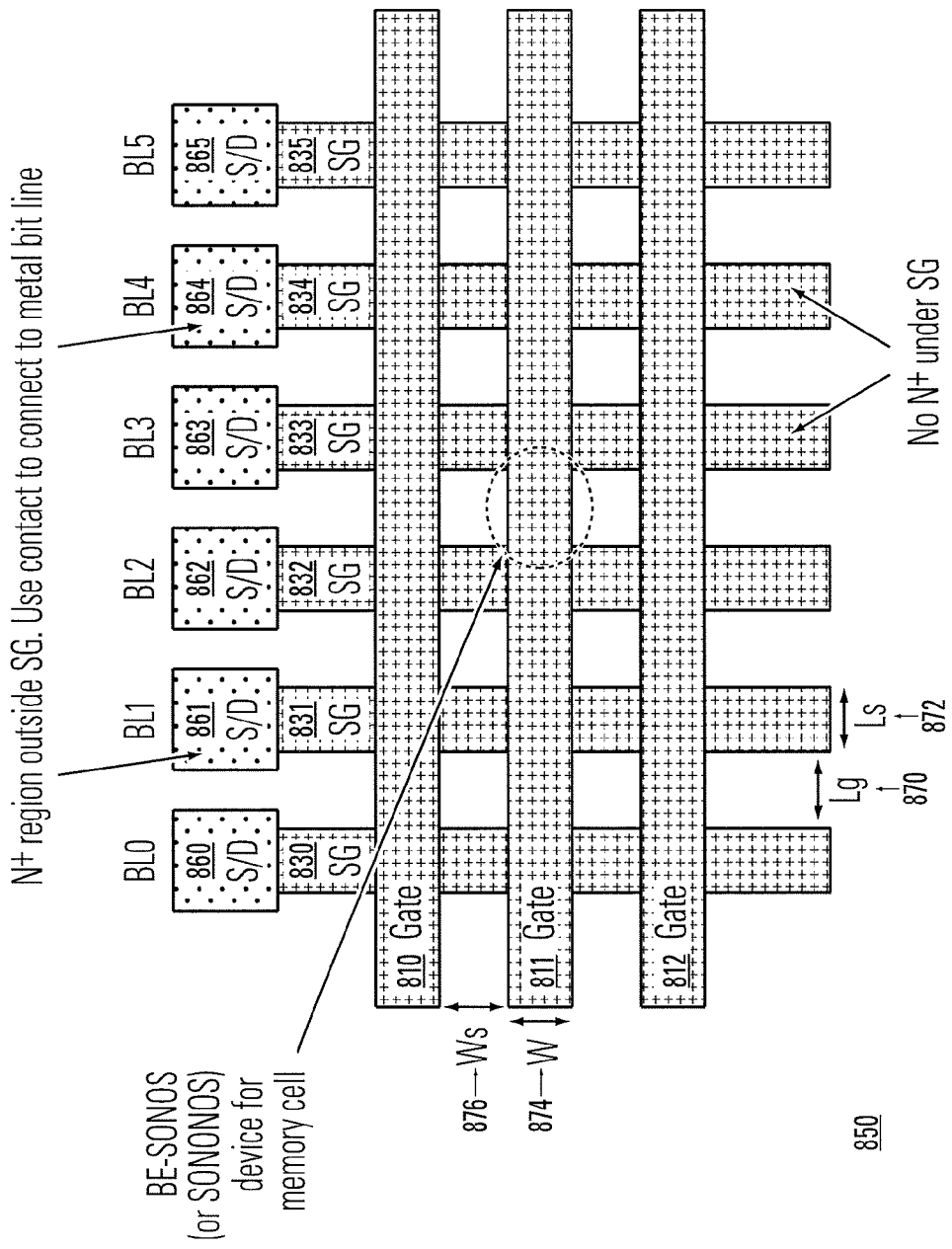
FIG. 8B is a layout diagram illustrating the second embodiment of the BE-SONOS SGIB-AND array architecture in accordance with the present invention.

Although the above read function describes a random access read operation, one of ordinary skill in the art should recognize that a page read of multiple cells are possible without departing from the spirits of the present invention. Turning now to FIG. 8A, there is shown a circuit diagram 800 illustrating a second embodiment, a BE-SONOS (or SONONOS) SGIB-AND (Sub-gate Inversion Bitline-AND) array architecture, while FIG. 8B is a layout diagram 850 illustrating the second embodiment of the BE-SONOS SGIB-AND array architecture. The term SGIB means that a bitline is formed from an inversion layer by turning on a sub-gate. Unlike the first embodiment where the BE-SONOS structure as shown in the layout diagram 300 has a N+ buried diffusion, the SONOS SGIB-AND cell structure has no N+ buried diffusion, as shown in FIG. 9, and therefore, there is no offset between a bitline and a sub-gate. The SONONOS devices are connected in parallel to form an AND array with SG in which there are no diffusion bitlines.

The BE-SONOS array architecture 800 comprises a plurality of wordlines WL0 810, WL1 811, WL2 812, WLm 813 intersecting a plurality of bitlines BL0 820, BL1 821, BL2 822, BL3 823 and BL4 824. A corresponding sub-gate line is parallel to each bitline. A sub-gate SG0 830 is placed in parallel to the bitline BL0 820. A sub-gate SG1 831 is placed in parallel to the bitline BL1 821. A sub-gate SG2 832 is placed in parallel to the bitline BL2 822. A sub-gate SG3 833 is placed in parallel to the bitline BL3 823. A sample BE-SONOS (or SONONOS) device 840 that functions as a memory cell is shown in a circled area.

In the SGIB-AND array architecture 850, every fourth sub-gates are commonly electrically connected, i.e. the SG0 830, SG4 834, SG8, etc. are electrically connected together, the SG1 831, SG5, SG9, etc are electrically connected together, the SG2 832, SG6, SG10, etc are electrically connected together, and the SG3 833, SG7, SG11, etc are electrically connected together.

As shown in the layout diagram 850 in FIG. 8B, there are no N+ region underneath each of the SG0 830, the SG1 831, the SG2 832, the SG3 833, the SG4 834, and the SG 835 in the memory array of the SGIB-AND architecture 800. The overall dimension of a cell size in the SGIB-AND architecture 800 is reduced relative to a cell size as shown in the SG-AND array architecture 200 in FIG. 2A.

When the SG0 830, the SG1 831, the SG2 832, the SG3 833, the SG4 834, and the SG 835 are turned on, each creates an N-channel inversion layer, which effectively serves as a barrier diffusion layer to function, respectively, as a source/drain 860, a source/drain 861, a source/drain 862, a source/drain 863, a source/drain 864 and a source/drain 865. Each sub-gate in the SG0 830, the SG1 831, the SG2 832, the SG3 833, the SG4 834, and the SG 835 therefore serves dual functions. The first function that each sub-gate in the SG0 830, the SG1 831, the SG2 832, the SG3 833, the SG4 834, and the SG 835 serves is a sub-gate for a source side injection programming. The second function that each sub-gate in the SG0 830, the SG1 831, the SG2 832, the SG3 833, the SG4 834, and the SG 835 serves is an inversion bitline when a subgate is turned on. Each source/drain in the source/drain 860, the source/drain 861, the source/drain 862, the source/drain 863, the source/drain 864, and the source/drain 865 is for connecting to a metal bitline. The symbol Lg 870 denotes the drawn channel length. The symbol W 874 denotes the channel width. Typically, the parameters W 874, Ws 876, Lg 870, Ls 872 are approximately equal to the parameter F, where the parameter F represents the critical dimension in a technology node. For example, the parameter F is equal to 50 nm for a 50 nm node.

Figure 9B:
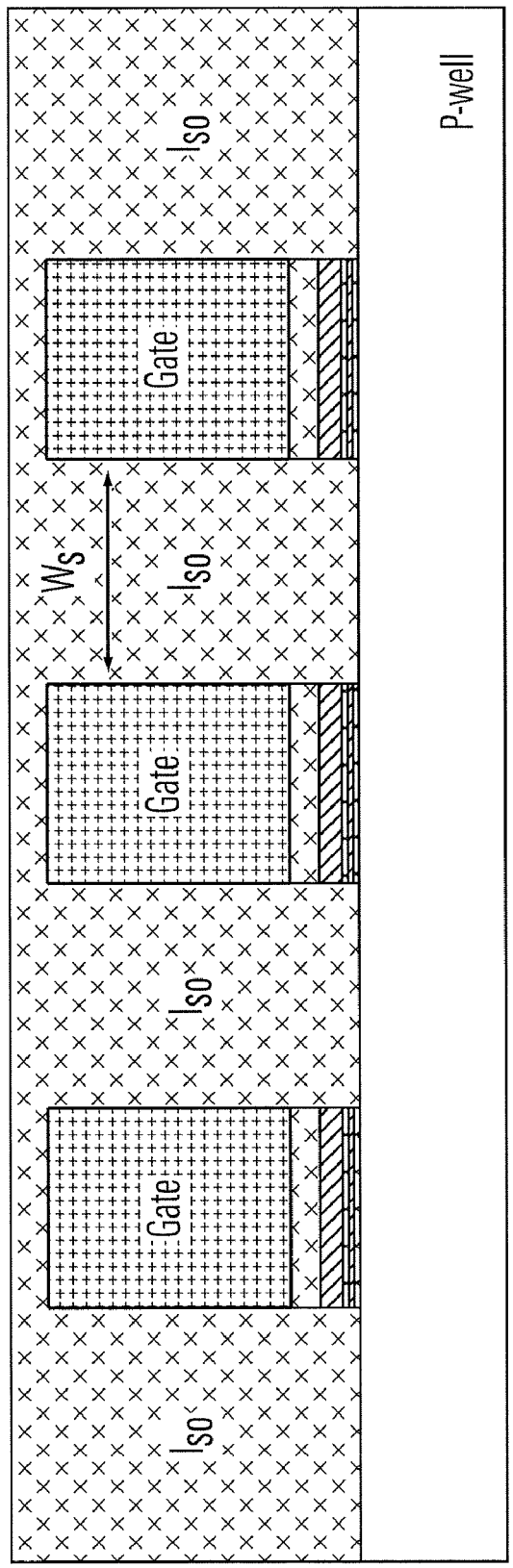
FIG. 9B is a layout diagram illustrating the cross sectional view in channel width direction of the SONONOS SGIB-AND array architecture in the second embodiment in accordance with the present invention.

As shown in FIG. 9A, there is a layout diagram 900 illustrating the cross sectional view in channel length direction of the SONONOS SGIB-AND array architecture in the second embodiment, while FIG. 9B is a layout diagram illustrating the cross sectional view in channel width direction of the SONONOS SGIB-AND array architecture in the second embodiment. Each subgate SG in SG 910, SG 912, SG 914, SG 916 and SG918 has no implant of source region or drain region, which means that there is no N+ region underneath each subgate SG in SG 910, SG 912, SG 914, SG 916 and SG 918. The pitch in a channel width direction is approximately equal to that in a channel length direction 2F. Therefore, the BE-SONOS SGIB-AND architecture is approximately equal to $4F^2$ per cell.

Figure 10A:
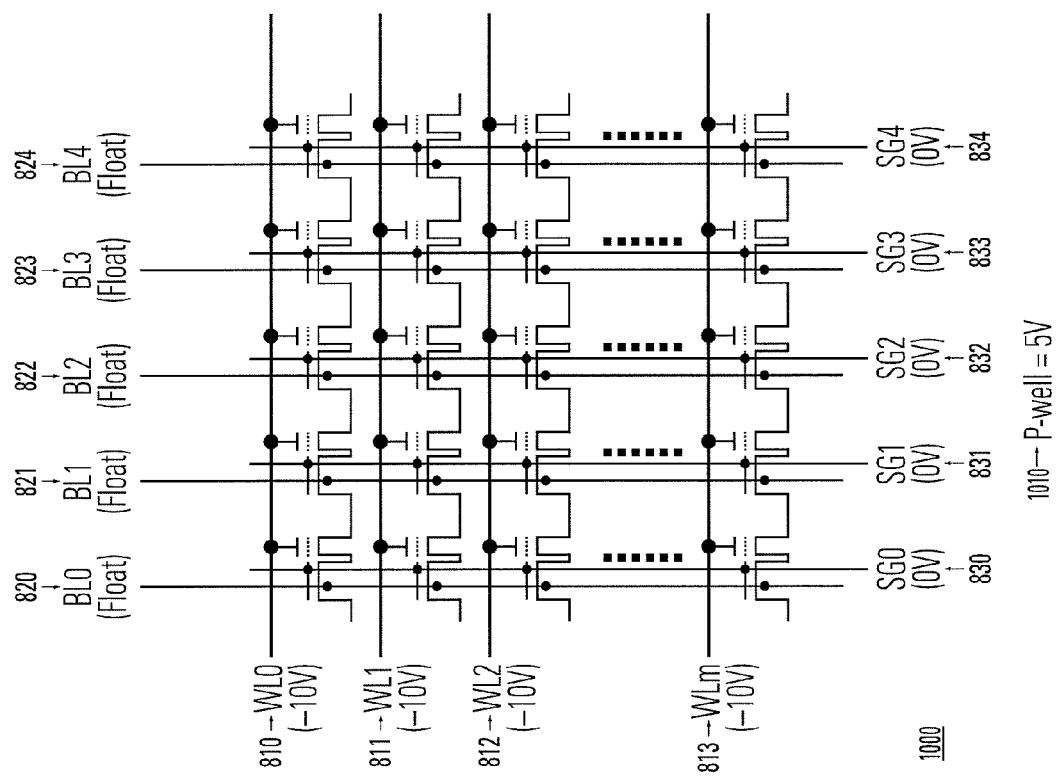
FIG. 10A is a circuit diagram illustrating an electrical reset of the SONONOS SGIB-AND array architecture in the second embodiment in accordance with the present invention.

In FIG. 10A, there is a circuit diagram illustrating an electrical reset of the SONONOS SGIB-AND array architecture 1000 in the second embodiment. During the electrical reset, the wordlines (or gates) WL0 810, WL1 811, WL2 812, and WLm 813 are set to −10 volts, the bitlines BL0 820, BL1 821, BL2 822, BL3 823, BL4 824 and BL5 825 are left floating, the sub-gates SG0 830, SG1 831, SG2 832, SG3 833, SG4 834, and SGn 835 are set to 0 volt, and P-well 1010 is set to 5 volts. When a sub-gate SG=is equal to zero volt, that means the SG is not turned on so that there is no inversion bitline. In one embodiment, every fourth sub-gates are connected together such that SG0 830 is connected to SG4, SG1 831 is connected to SG5, and so on.

Figure 10B:
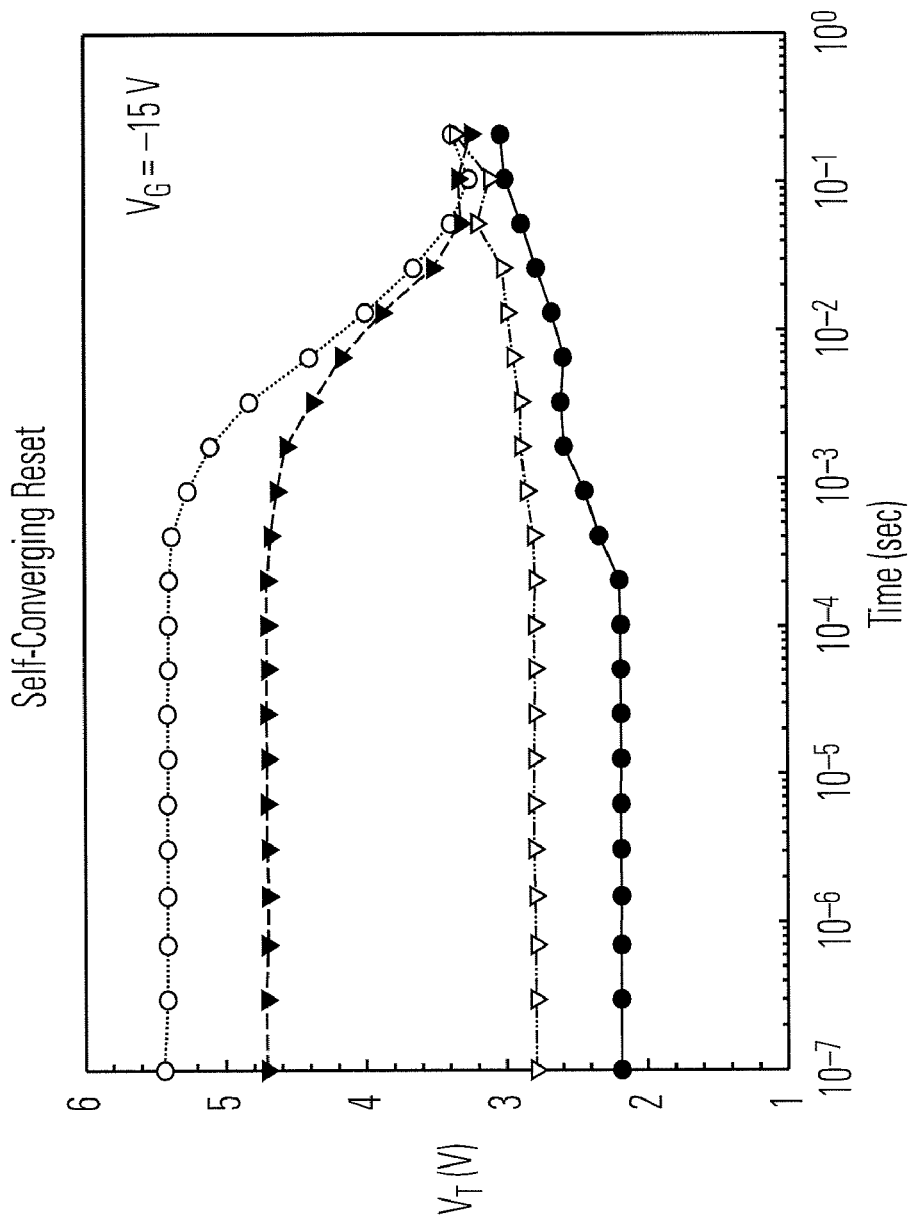
FIG. 10B is a graphical diagram illustrating a waveform of a self-converging reset in accordance with the present invention.

Before operations, the memory circuit 1000 is reset by applying Vgb=−15V (or partition the gate voltage into each WL and p-well), which produces a desirable self-converging property, as shown in the graph 1050 in FIG. 10B. Various circles and triangles in the graph 1050 represent different initial points over a wide distribution where these points converges to a threshold voltage Vt. Even if the BE-SONOS device is initially charged to various Vt, the reset operation can tighten these initial points to the reset/erase state. A typical reset time is around 100 msec. In one example, the n-channel BE-SONOS device with ONONO=15/20/18/70/90 Angstrom, and a N+-poly gate. Lg/W=0.22/0.16 um.

To phrase in another way, a reset operation is carried out to tighten the Vt distribution before operations. In contrast to a floating gate device where there is no self-converging erase, the BE-SONOS provides a self-converging erase reset/erase methods, which is necessary because the initial Vt distribution is often widely distributed due to the process issues, such as plasma charging effect. The self-converging reset assists in tighten the initial Vt distribution.

Figure 11A:
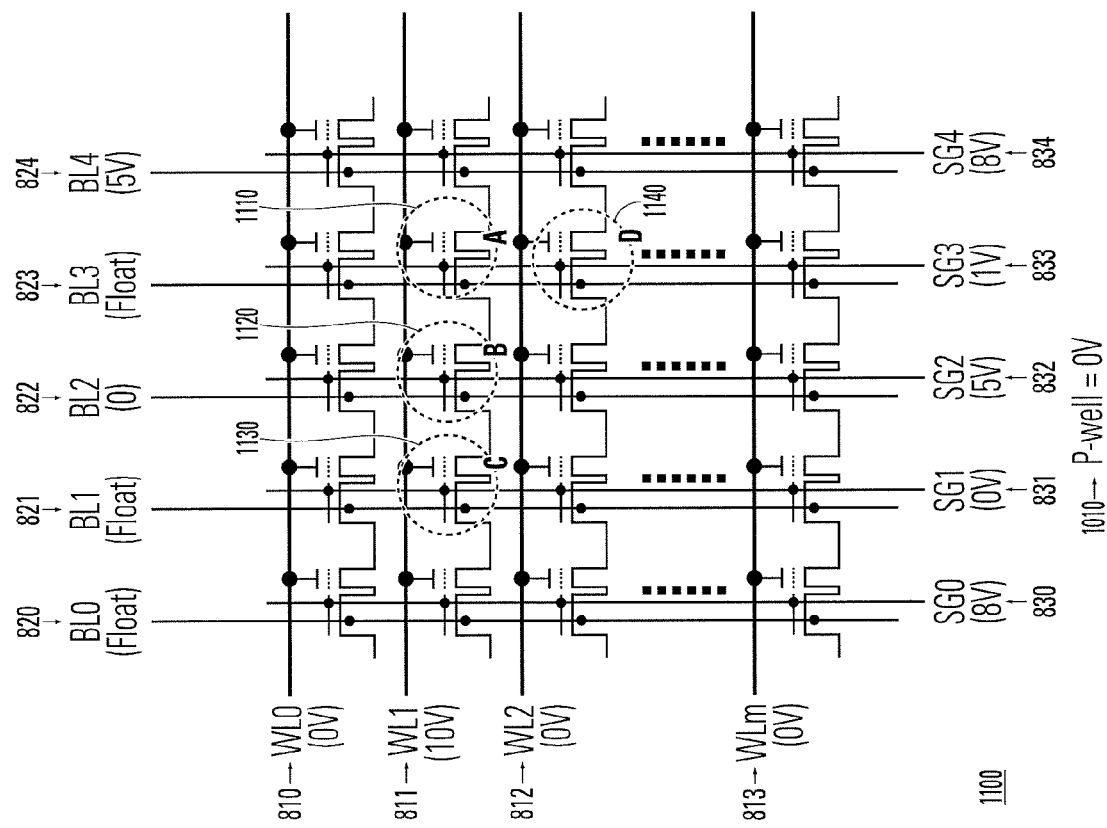
FIG. 11A is a circuit diagram illustrating an electrical program of the SONONOS SGIB-AND array architecture in the second embodiment in accordance with the present invention.
Figure 11B:
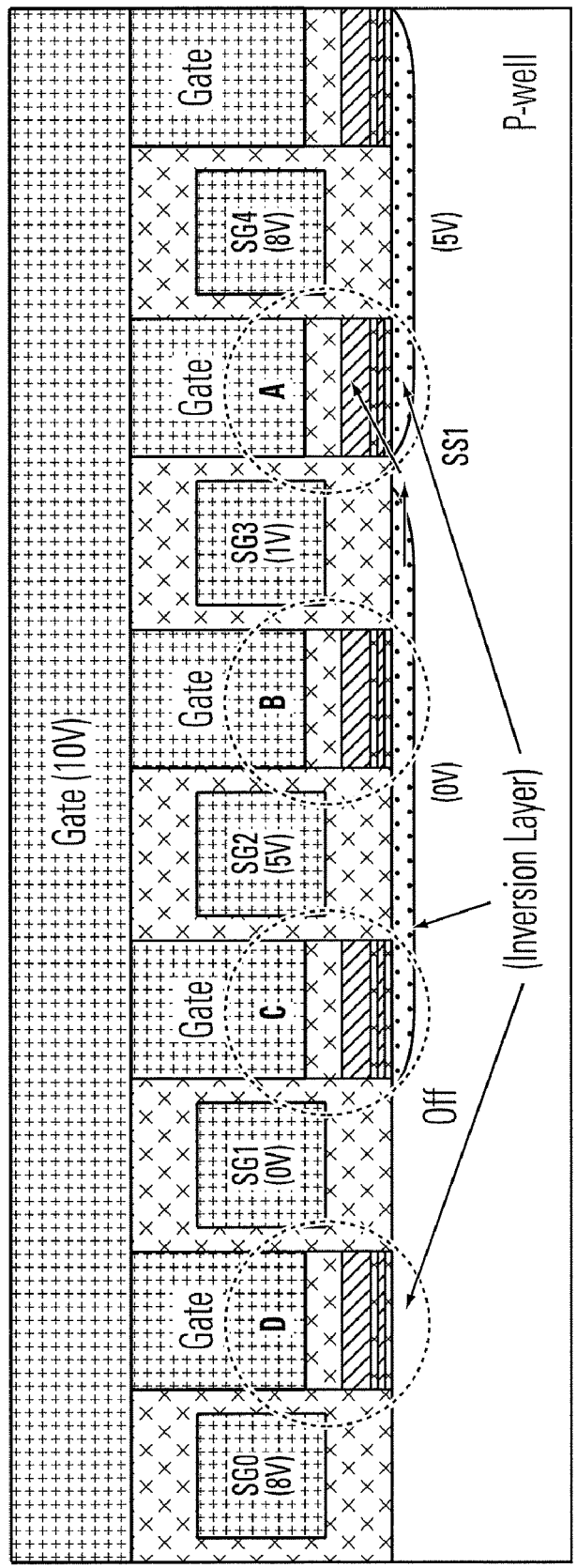
FIG. 11B is a layout diagram illustrating the electrical program for the SONONOS SGIB-AND array architecture in the second embodiment in accordance with the present invention.

As illustrated in FIG. 11A, there is a circuit diagram illustrating an electrical program of the SONONOS SGIB-AND array architecture 1100 in the second embodiment, while FIG. 11B is a layout diagram 1150 illustrating the electrical program for the SONONOS SGIB-AND array architecture in the second embodiment. In one example during electrical program of a cell A 1110, the wordline WL1 811 is set to 10 volts while the other wordlines WL0 810, WL2 812, and WLm 813 are set 0 volt. The bitlines BL0 820, BL1 821, and BL3 823 are left floating. The bitline BL2 is set to 0 volt, and the bitline BL4 is set to 5 volts. The sub-gates SG0 830 and SG4 834 are set to 8 volts. The sub-gate SG1 is set to 0 volt, the sub-gate SG2 is set to 5 volts, and the sub-gate SG3 is set to 1 volt.

The bitlines BL0 820, BL1 821, BL2 822, BL3 823, and BL4 824 provide a greater flexibility in programming than sub-gates SG0 830, SG1 831, SG2 832, SG3 833 and SG4 834 because each bitline can be independently programmed. One type of electrical programming method is a source side injection. The source side injection programs a cell to a high voltage threshold Vt state. For example, the source injection applies Vg=10V to the selected WL1, Vg=0V to other WL's, SG=1V for programming and SG=0V for inhibition. The voltage setting of the SG voltage at 1 volt is intended as an illustration such that in general it is 0.5 to 2 volts higher than the threshold voltage under SG gate.

To carry out an electrical program, the selected wordline is applied a high voltage, 10 volts, and the sub-gate SG3 833 is applied 1 volt to perform a source side injection to program a target cell. The SG1 831 is set to 0 volt for program inhibit and the SG4 834 is set to 8 volts to provide sufficient overdrive to reduce a bitline resistance. One of skill in the art should recognize that parallel programming methods such as page programming with 2 kB cells in parallel can burst the programming throughput to more than 10 MB per second while the cell current consumption can be controlled within 2 mA. To avoid program disturbance to other bitlines, the sub-gate SG2 231 is set to 0 volt and turns off the inhibit cell.

The electrical programming is to conduct a source side injection to program a cell to a high voltage threshold, Vt, state. For example in the electrical programming of the cell A 1110, the operations apply Vg=10V to the selected WL$_1$ 811, apply Vg=0V to other wordllines including WL0 810, WL2 812 and WLm 813, set SG3=1V for programming, set SG1=0V for program inhibition, and set SG2=5V for pass gate. The sub-gate SG4 834 is set to 8 volt to highly turn on the sub-gate SG4 834 so that the inversion layer potential can be raised up to 5 volts. In programming the cell A 1110, the sub-gate SG3 833 is set to 1 volt so that the source side injection occurs. The threshold voltage Vt is raised to above the programming voltage, PV. A program inhibition is provided to a cell-B 1012, a cell-C 1014 and a cell-D 1016.

Figure 12A:
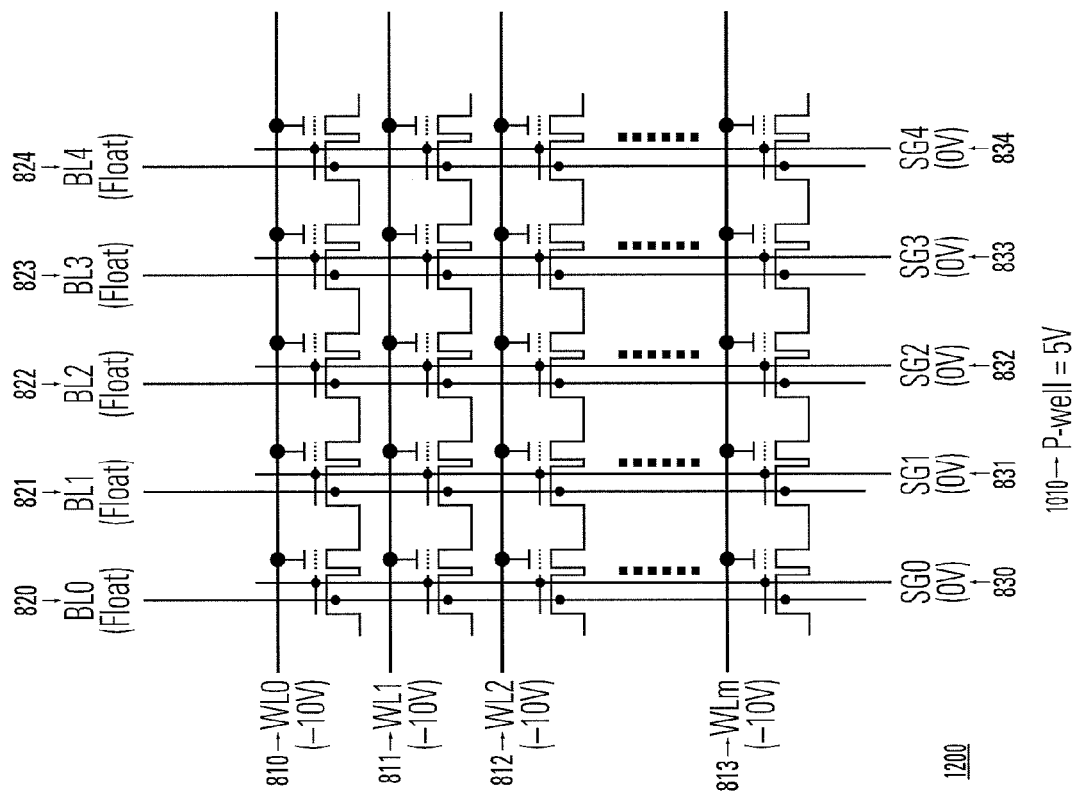
FIG. 12A is a circuit diagram illustrating an electrical erase of the BE-SONONS SGIB-AND array architecture of the second embodiment in accordance with the present invention.
Figure 12B:
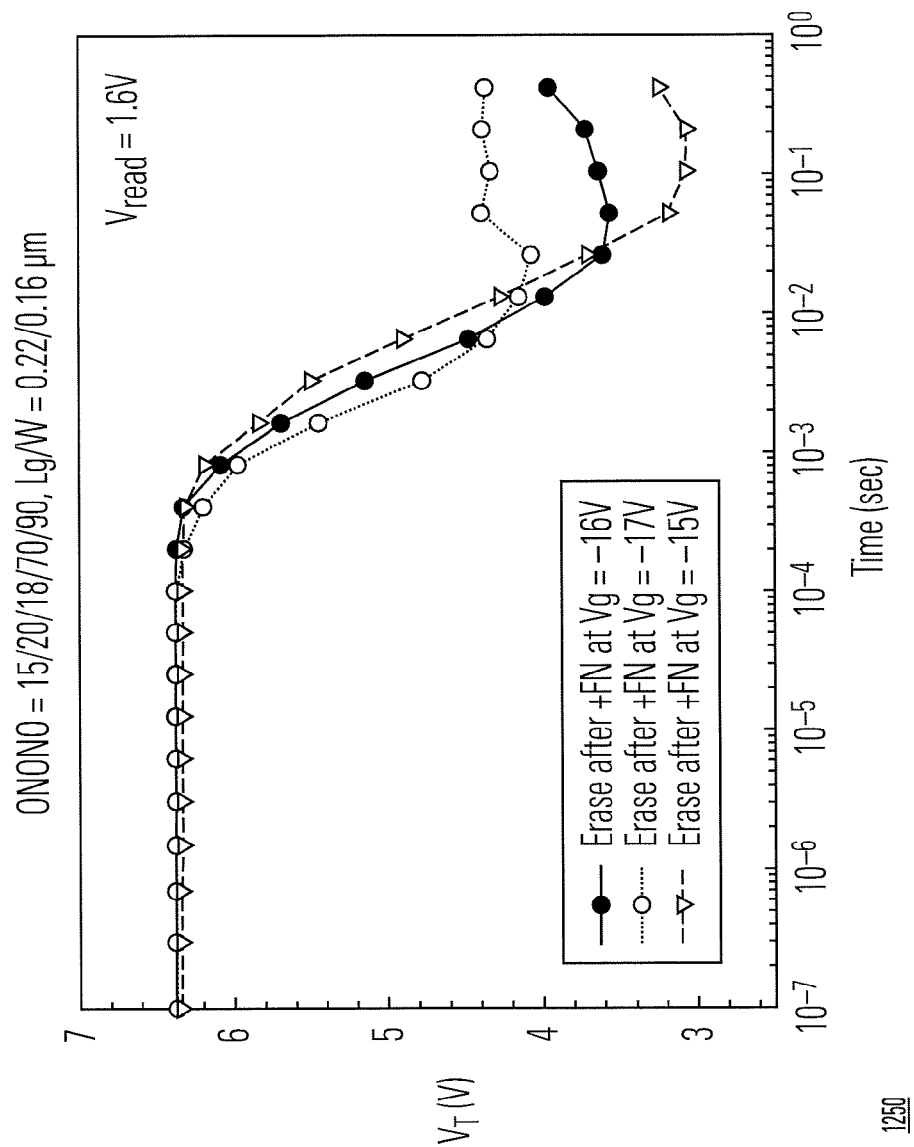
FIG. 12B is a graph diagram illustrating a waveform of a self-converging erase of the second embodiment in accordance with the present invention.

FIG. 12A is a circuit diagram 1200 illustrating an electrical erase of the BE-SONONS SGIB-AND array architecture in the second embodiment, while FIG. 12B is a graph diagram 1250 illustrating a desirable self-converging erase property with respect to the second embodiment. The erase operation is similar to the reset operation. During electrical erase, the wordlines WL0 810, WL1 811, WL2 812, and WLm 813 are set to −10 volts, the bitlines BL0 820, BL1 821, BL2 822, BL3 823, BL4 824 and BL5 825 are left floating, and the sub-gates SG2 830, SG1 831, SG2 832, SG3 833, SG4 834 are set to 0 volt. The electrical erase is performed in the unit of a sector or block. The BE-SONOS device produces a desirable self-converging erase property, as shown in a graph diagram 1250 in FIG. 6B. The erase saturation Vt is dependent on Vg. A higher Vg causes a higher saturated Vt. The convergent time is typically around 10 to 100 msec.

Figure 13A:
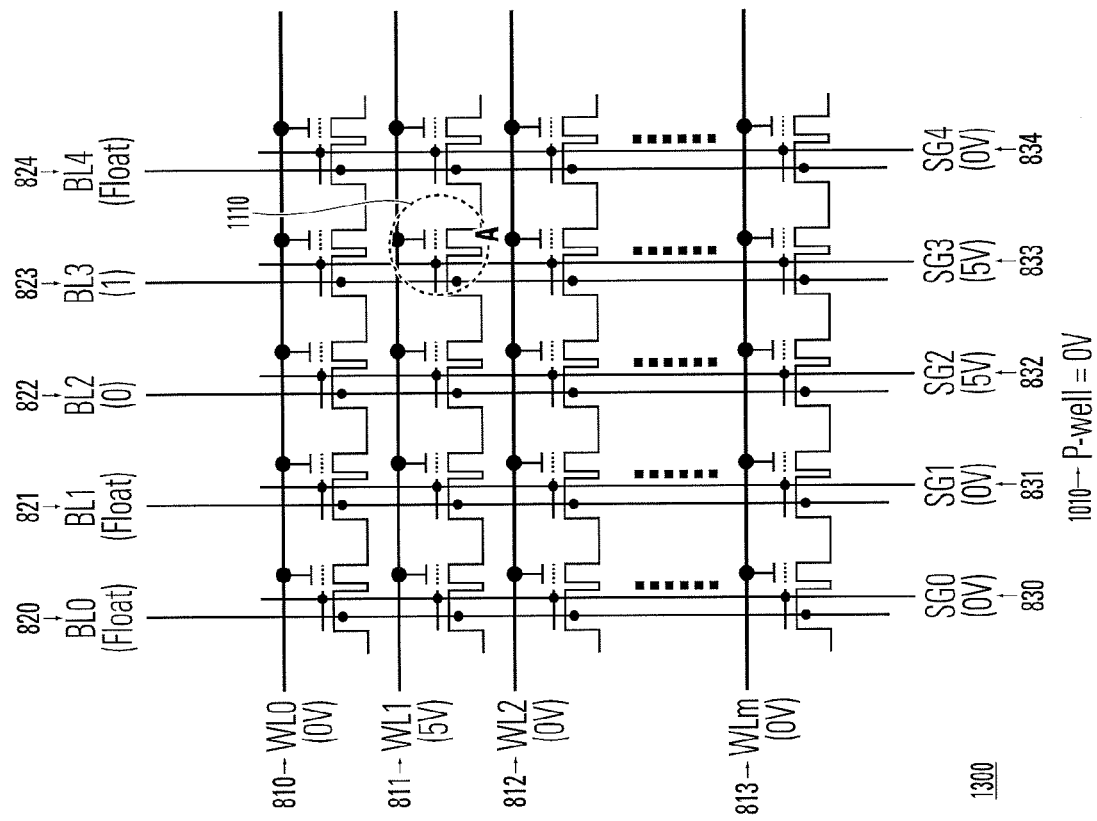
FIG. 13A is a circuit diagram illustrating a read operation of the SONONOS SGIB-AND array architecture in the second embodiment in accordance with the present invention.
Figure 13B:
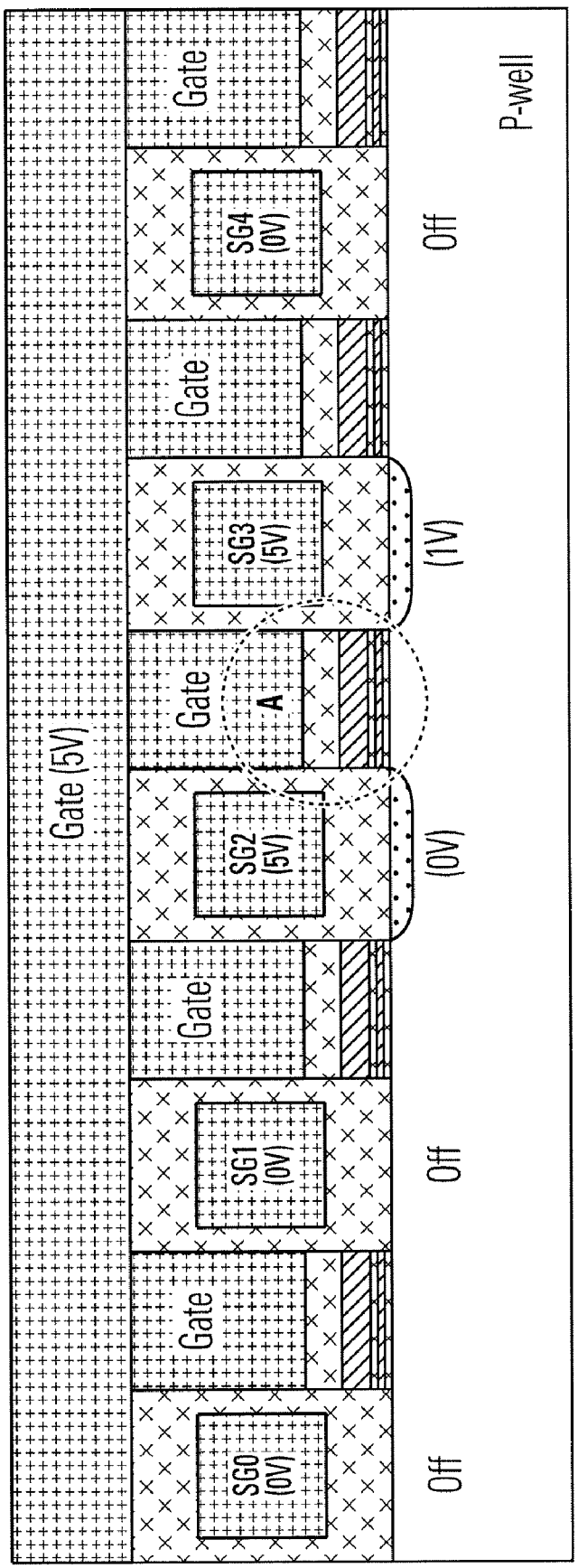
FIG. 13B is a layout diagram illustrating the read operation of the SONONOS SGIB-AND array architecture of the second embodiment in accordance with the present invention.

FIG. 13A is a circuit diagram 1300 illustrating a read operation of the SONONOS SGIB-AND array architecture in the second embodiment, while FIG. 13B is a layout diagram 1350 illustrating the read operation of the SONONOS SGIB-AND array architecture in the second embodiment. In one example during a read operation of the cell A 1110, the wordline WL1 811 is set to 5 volts while the other wordlines WL0 810, WL2 812, and WLm 813 are set 0 volt. The bitlines BL0 820, BL1 821, and FL4 824 are left floating. The bitline BL2 822 is set to 0 volt and the bitline BL3 823 is set to 1 volt. The sub-gates SG0 830, SG1 831, and SG4 834 are set to 0 volts, while SG2 832 and SG3 833 are set to 5 volts. A read operation is performed by applying a gate voltage that is between an erased state Vt (EV) and a programmed state Vt (PV). The gate voltage is typically around 5 volts. Alternatively, the gate voltage can be selected to be more than 5 volts or less than 5 volts, provided the gate voltage falls in the range of a high Vt value and a low Vt value. If Vt of the cell-A 422 is higher than 5 volts, then the read current is likely to be a very small value (e.g., <0.1 µA). If Vt of the cell-A 422 is less than 5 volts, the read current is likely to be a high value (e.g., >0.1 µA). The state of a memory can then be identified.

The applied voltage at a bitline (BL) is typically around 1 volt. A larger read voltage will induce more current, but the read disturbance may be larger. The WL number of SG-AND string is typically 64, 128, or 256. A larger number of SG-AND string may save more overhead and increase the array efficiency. However, the program distribution may be larger. A trade-off is weighed in choosing an adequate number of SGIB-AND strings.

The following discussion is directed to alternative embodiments of memory that make up the SG-AND string.

FIG. 14 is a simplified diagram of a charge trapping memory cell employing a multilayer blocking dielectric layer and a bandgap engineered dielectric tunneling layer. The memory cell includes a channel 10, a source 11 and a drain 12 adjacent the channel in a semiconductor body. A gate 18 overlies a multilayer stack, including the multilayer blocking dielectric layer, the charge trapping layer and the tunneling layer, of dielectric materials acting as the charge storage structure.

Gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 14, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less. Representative embodiments are 10 Å or 12 Å thick.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling dielectric after the first location. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=18 Å), an ultrathin silicon nitride layer N1 (e.g. <=30 Å) and an ultrathin silicon oxide layer $O_2$ (e.g. <=35 Å), which results in an increase in the valence band energy level of about 2.6 eV at an offset 15 Å or less from the interface with the semiconductor body. The $O_2$ layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields.

Embodiments of the memory cell described herein include gates comprising polysilicon, such as n+ polysilicon, or metal, such as aluminum. In alternatives, the gates comprise materials having work functions that are greater than the work functions of n+ polysilicon, including for example, p+ polysilicon, platinum, tantalum nitride, and other materials chosen for work function, conductivity and manufacturability.

The structure of the dielectric tunneling layer is described in more detail below with reference to FIGS. 15 and 16.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer in this embodiment comprises a stack including a buffer layer 17A and a high-κ capping layer 17B. High-κ herein refers to dielectric constant >7, such as found in materials including $Al_2O_3$, $HfO_2$, $ZrO_2$, $La_2O_3$, AlSiO, HfSiO and ZrSiO etc.

The buffer layer of silicon dioxide can be formed by wet conversion from the nitride by a wet furnace oxidation process. Other embodiments may be implemented using high temperature oxide (HTO) or LPCVD $SiO_2$. An aluminum oxide capping dielectric layer can be made by atomic vapor deposition, with a post rapid thermal anneal at about 900° for 60 seconds to strengthen the film.

Using these processes, a layer of silicon oxide can be formed with very few defects, and a capping layer of high-κ, high conduction band offset material like aluminum oxide, combine to provide a blocking dielectric layer which provides excellent retention characteristics and very low erase saturation voltages. Therefore, the EOT can be reduced and the operation voltage can be lowered.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17A, 17B can be of silicon oxide between 5 Å and 90 Å, with a capping layer of aluminum oxide between 5 and 90 Å The gate material can be p+ polysilicon (work function about 5.1 eV). For improved retention characteristics, it is preferred that the layer of silicon oxide have a thickness greater than 30 Å.

Also, it is found that the ratio of the thickness of the top layer 17B to the thickness of the bottom layer 17A of the blocking dielectric layer can be less than 2 for the combination of silicon oxide (k=3.9) and aluminum oxide (k=about 8). In general, the top layer 17B can have a thickness that is less that the ratio of the dielectric constants thicker than the bottom layer 17A. Thus, the blocking dielectric layer as described herein includes a first layer 17A having a dielectric constant $\kappa_1$ contacting the charge trapping dielectric layer and a second layer 17B contacting another one of the channel surface and the gate, the second layer 17B having a dielectric constant $\kappa_2$ higher than $\kappa_1$ of the first layer, and the second layer having thickness less than $\kappa_2/\kappa_1$ times that of the first layer. For aluminum oxide as a top capping layer, the dielectric constant is ~8 and the barrier height or conduction band offset is more than 3 eV to obtain the erase saturation $V_{FB}$<−2V. Since the barrier height of $Al_2O_3$ is almost the same as $SiO_2$, the electron barrier height or conduction band offset of aluminum oxide with N+ polysilicon gate is about 3.1 eV.

In examples of memory cells described herein, in order to get a reasonable operation speed (program and erase) at a voltage of less than 20 volts, the total effective oxide thickness EOT for the multilayer dielectric stack (e.g., High-k-O—N—O—N—O, and High-k-O—N—O) between the gate and the channel should be less than 160 Å. The EOT of a bandgap engineered (BE) ONO tunneling barrier or a single layer $SiO_2$ tunnel oxide is typically in a range of about 40 to 55 Å, and preferably 45 to 50 Å and the EOT of a nitride charge trapping layer is typically in a range of about 25 to 40 Å, and preferably 30 to 35 Å. Therefore, the EOT for the multilayer blocking dielectric layer (e.g. $SiO_2$ buffer layer and $Al_2O_3$) is less than 95 Å, and preferably in a range of about 75 to 85 Å, for the memory cells described herein.

Figure 15:
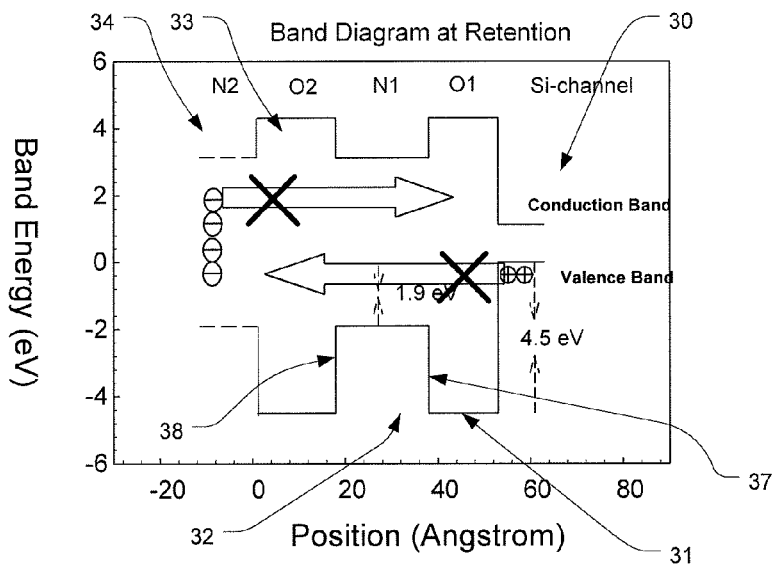
FIG. 15 is a band diagram for a tunneling dielectric layer including band offset technology at low electric fields.

FIG. 15 is a diagram of the energy levels of the conduction and valence bands of the dielectric tunneling structure including the stack of layers 13-15 of FIG. 14 under a low electric field, showing a "U-shaped" conduction band and an "inverted U-shaped" valence band. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2 nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 16:
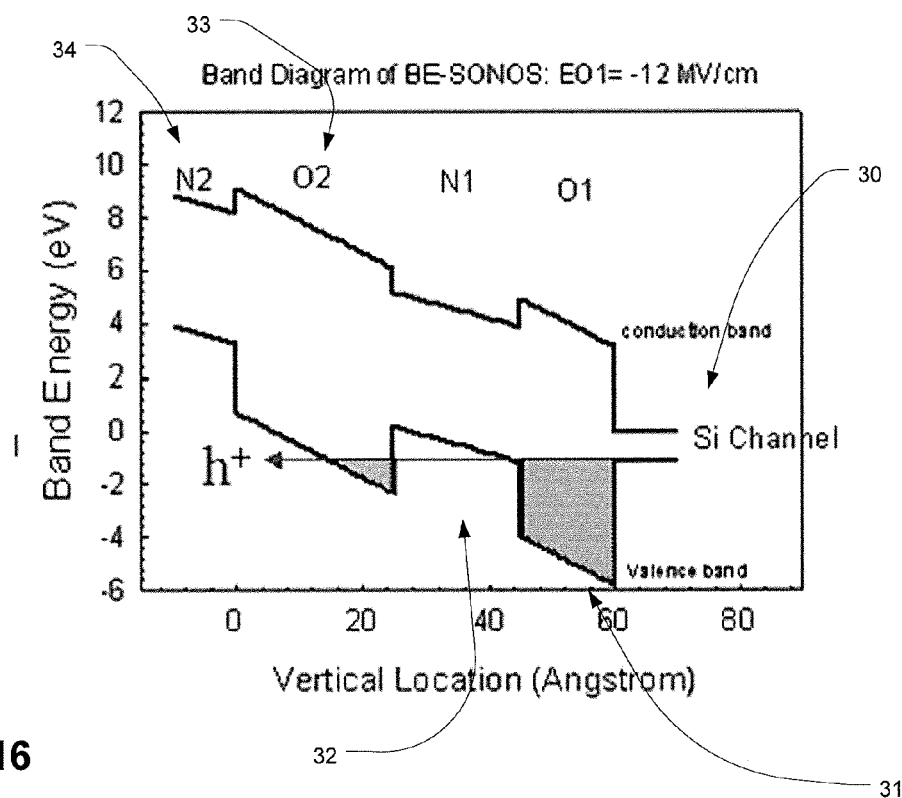
FIG. 16 is a band diagram for a tunneling dielectric layer including band offset technology at high electric fields.

FIG. 16 shows the band diagram for the dielectric tunneling structure under conditions of an electric field of about −12 MV/cm in the tunneling region 31, for the purposes of inducing hole tunneling (in FIG. 16, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 16) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

In alternatives, the multilayer tunneling stack may be replaced with a single layer tunneling oxide as used in conventional MONOS devices, or with other tunneling layer structures. It is known that although the conventional MONOS (tunneling oxide >3 nm) has good data retention, its erase saturation level is too high for NAND application because the SiO$_2$ top oxide cannot well suppress the gate injection.

MANOS/TANOS were proposed as referred to above. These structures use an Al$_2$O$_3$ (k~8) to replace the top oxide (k=3.9). The erase saturation is greatly suppressed, therefore, MANOS device has lower erase saturation level and larger memory window than MONOS. However, the use of a single high-κ top dielectric may introduce new reliability issues. This is because the high-κ dielectric is often more leaky than the conventional SiO$_2$ top oxide. Therefore, the use of a single, high-κ top dielectric does not provide retention reliability.

As described herein, an additional high-κ capping film is capped on the top oxide of MONOS. This new structure has good retention and read disturbance characteristics because the buffer layer has a low leakage current and can form the deep traps in the interface between trapping layer (SiN) and buffer layer (SiO$_2$). Also, the top high-κ film can suppress the gate injection because of its high dielectric constant, so that this new innovation can get a low erase saturation level and large memory window, which are good for NAND flash applications.

Figure 17:
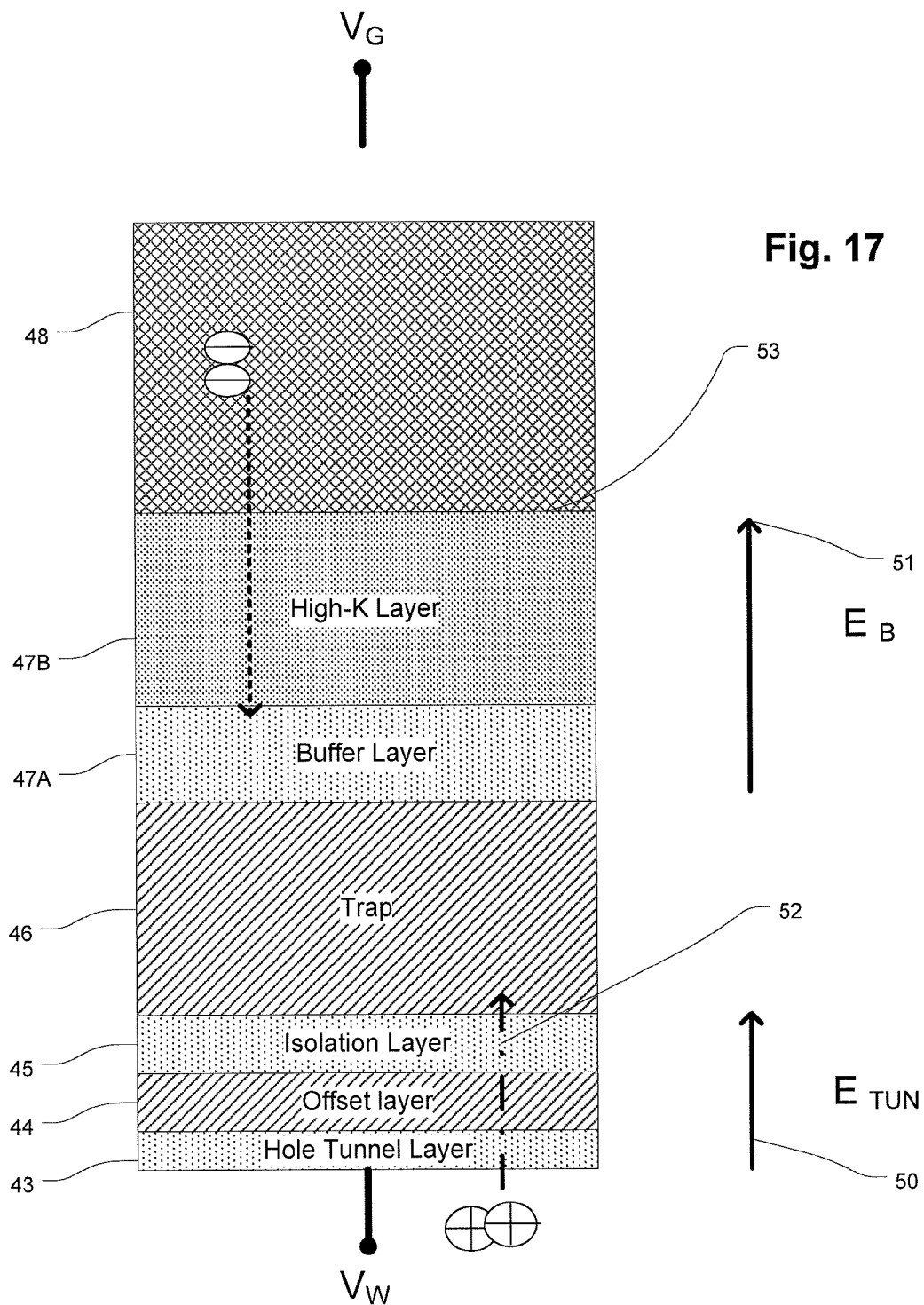
FIG. 17 illustrates the electric fields and tunneling currents during an erase operation for an embodiment of a memory cell according to the present invention.

FIG. 17 is a schematic illustration of the gate stack for a charge trapping memory cell like that in FIG. 14, showing electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer. A blocking dielectric layer consisting of a multilayer structure including a buffer layer 47A and a capping layer 47B separates the charge trapping layer 46 from the gate 48. During an erase process, the electric field is induced by bias voltages V$_G$ and V$_W$ applied at the gate and channel of the memory cell, and results in an electric field E$_{TUN}$ 50 through the dielectric tunneling layer 43, 44, 45 and an electric field E$_B$ 51 through the blocking layer 47A/47B. The magnitude of the electric field E$_{TUN}$ 50 through the dielectric tunneling layer is sufficient to induce hole tunneling current 52 into the trapping layer 46. The magnitude of the electric field E$_B$ 51 through the capping layer 47B in the blocking dielectric layer is reduced relative to that through the silicon dioxide in the tunneling dielectric layer because of the higher dielectric constant by an amount that is about 3.9/κ, where 3.9 is the dielectric constant for silicon dioxide and K is the dielectric constant of the capping layer 47B. Therefore, because of sufficient electron affinity of the gate 48, the relatively lower electric field E$_B$ 51 and the thickness of the blocking dielectric layer 47A/47B, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

Figure 18A:
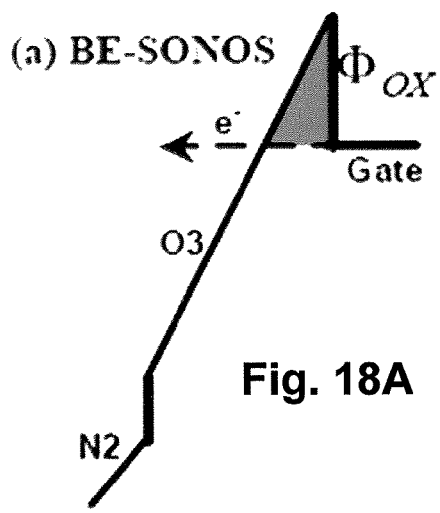
FIGS. 18A through 18D are conduction band diagrams for the blocking dielectric layer of a single silicon dioxide layer (FIG. 18A), a single aluminum oxide layer (FIG. 18B), a first example stacked silicon dioxide/aluminum oxide layer (FIG. 18C), and a second example stacked silicon dioxide/aluminum oxide layer having a thicker aluminum oxide layer than the first example (FIG. 18D).
Figure 18B:
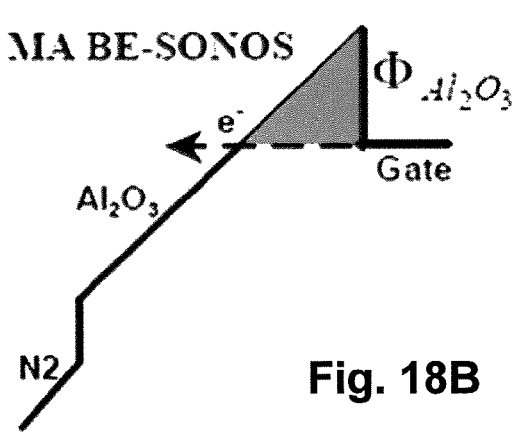
Figure 18C:
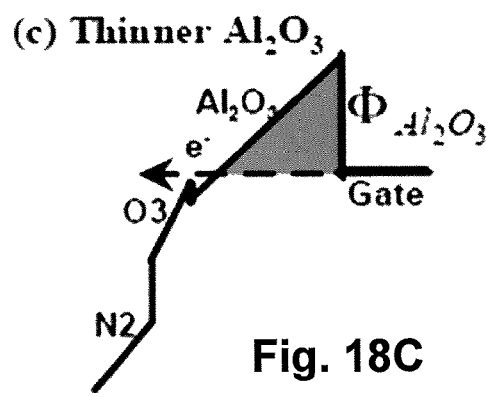
Figure 18D:
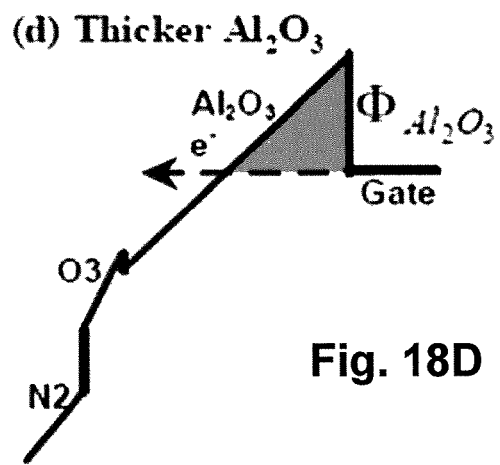

FIGS. 18A through 18D are conduction band diagrams for the blocking dielectric layer of a single silicon dioxide layer (FIG. 18A), a single aluminum oxide layer (FIG. 18B), a first example stacked silicon dioxide/aluminum oxide layer (FIG. 18C), and a second example stacked silicon dioxide/aluminum oxide layer having a thicker aluminum oxide layer than the first example (FIG. 18D). The tunneling probability for electron injection from the gate can be understood from these figures. The magnitude of the electric field within the material is reflected by the slope of the conduction band. Thus, the region corresponding to the silicon dioxide buffer layer labeled O3 in FIGS. 18C and 18D has a greater slope than the region corresponding to the aluminum oxide capping layer. The conduction band offset at the gate interface is reflected by the height of the step in the conduction band. For a bandgap engineered SONOS device as shown in FIG. 18A, the tunneling probability is relatively high, even though the conduction band offset is relatively large because of the high magnitude of the electric field. For an embodiment having an aluminum oxide blocking dielectric layer as represented in FIG. 18B, the tunneling probability is relatively low because of the lower slope on the conduction band caused by the relatively high dielectric constant (e.g. greater than 7), and because the conduction band offset remains relatively high (e.g. greater than 3 eV). FIGS. 18C and 18D suggest that the tunneling probability for gate injection is about the same for multilayer stacks having a silicon dioxide buffer layer and an aluminum oxide top layer, so long as the thickness of the aluminum oxide top layer is larger than a minimum value. Thus, the tunneling probability for the embodiment FIG. 18C having a thinner aluminum oxide layer is about the same as that for the embodiment of FIG. 18D having a thicker aluminum oxide layer.

Figure 19:
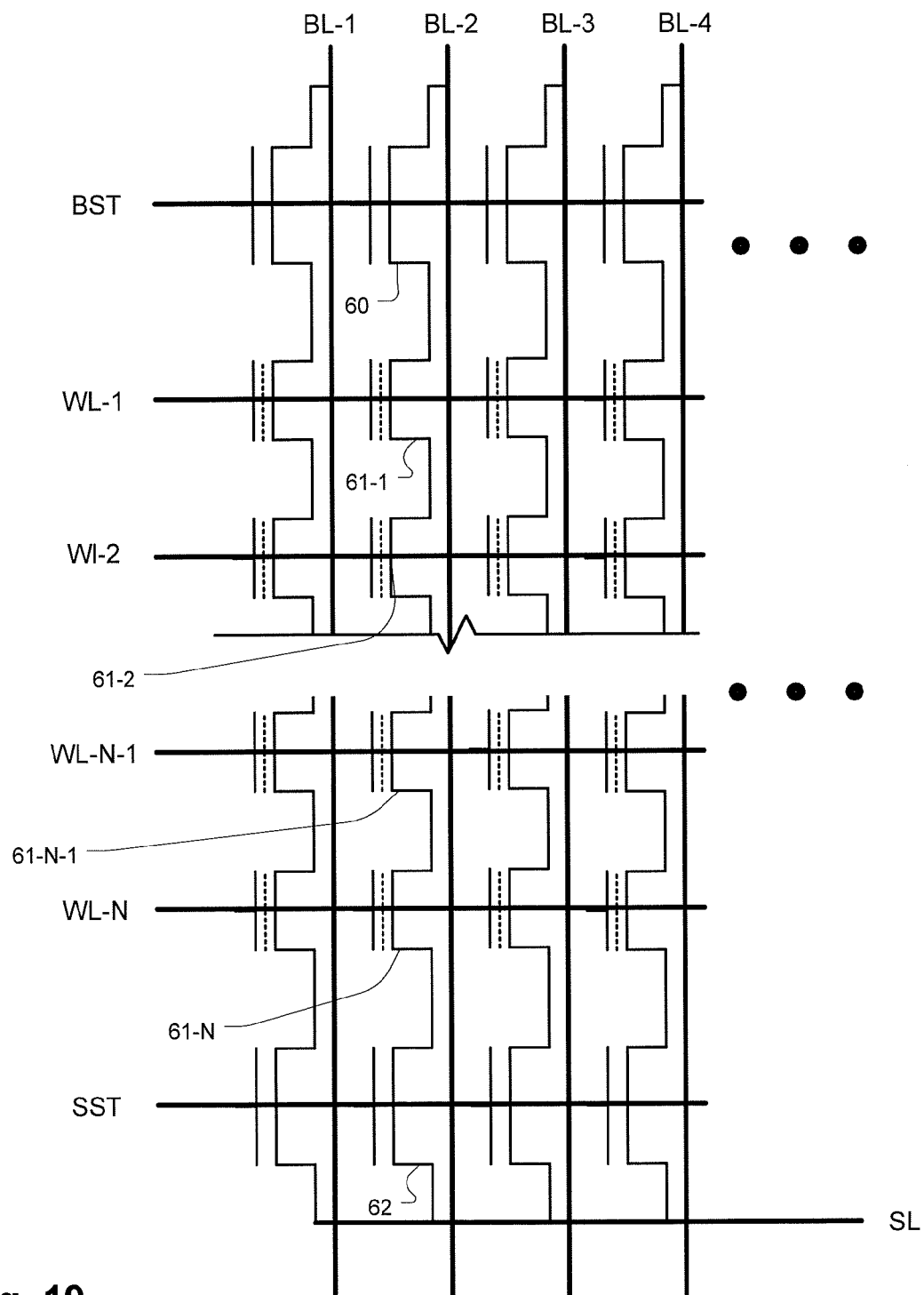
FIG. 19 is a schematic diagram of a NAND-type memory array employing memory cells according to the present invention.

Memory cells implemented as described above can be arranged in a NAND-type array as shown in FIG. 19. The array includes a plurality of bit lines BL-1, BL-2, BL-3, BL-4, . . . , and a plurality of word lines WL-1, WL-2, . . . , WL-N-1, WL-N. Groups of N memory cells are connected in series between a block select transistor coupled to a corresponding bit line and a source select transistor coupled to a source line. A block select word line BST is coupled to a row of block select transistors and a source select word line SST is coupled to a row of source line connect transistors. Thus, for example, for a representative bit line, BL-2, in the figure, a block select transistor 60 connects a series of memory cells 61-1 through 61-N to the bit line BL-2 in response to the signal BST on the block select word line. The last memory cell 61-N in the series is connected to source select transistor 62 which couples the series to the source line SL in response to the signal SST on a source select word line.

In the alternative, the memory cells can be arranged in AND-type, NOR-type and virtual ground-type arrays often applied in flash memory devices.

Programming may be accomplished in the NAND array by applying incremental stepped pulse programming ISPP or other processes for inducing Fowler Nordheim FN tunneling. ISPP involves applying a stepped programming voltage, starting at a gate bias of for example about plus 17 V, and incrementing the voltage for each programming step by about 0.2 V. Each pulse can have a constant pulse width of about 10 µs for example. In variations of the technique, the pulse width and the increment applied for each succeeding pulse can be varied to meet the needs of the particular implementation. The memory cells of this type have demonstrated relatively linear programming characteristics, and very large memory windows compared to the prior art, making them particularly well-suited to storing multiple bits per cell with multilevel programming technologies. In alternative embodiments, the so-called voltage pulse self-boosting technique is applied for programming. Other biasing arrangements can be applied as well, selected for compatibility with array characteristics.

Other programming bias techniques can be applied. For NOR array structures, various biasing arrangements for inducing hot electron tunneling or FN tunneling may be applied as well as other techniques known in the art.

Figure 20:
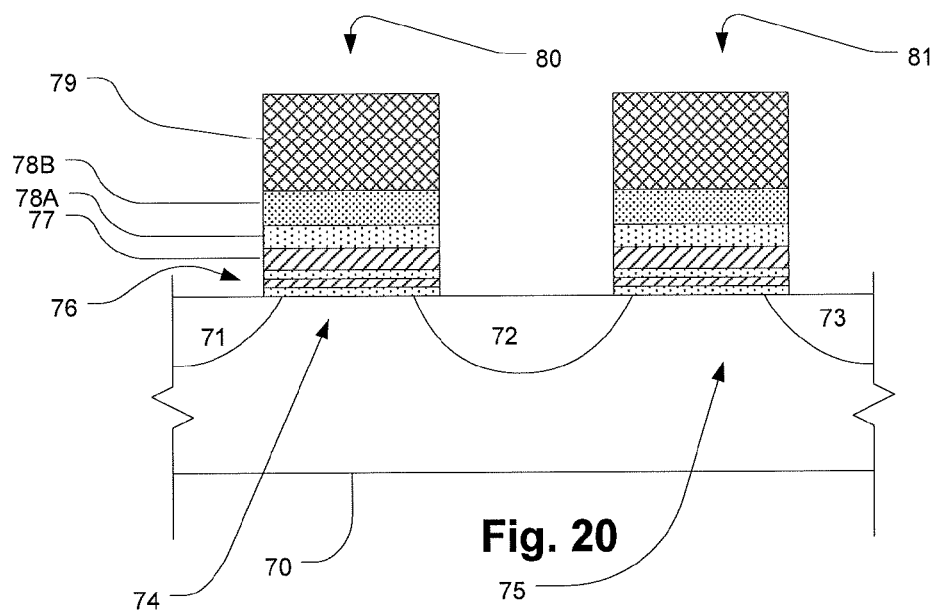
FIG. 20 is a simplified cross-sectional view of memory cells according to the present invention in a NAND configuration, taken perpendicular to word lines.
Figure 21:
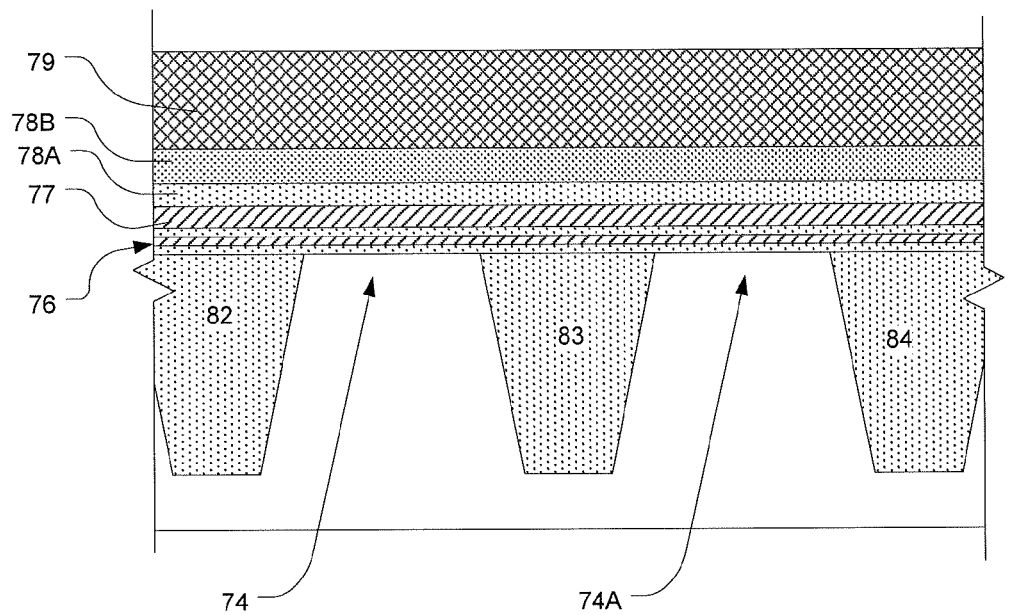
FIG. 21 is a simplified cross-sectional view of memory cells according to the present invention in a NAND configuration, taken through a word line.

FIGS. 20 and 21 show cross-sectional views of a representative memory cell structure as described herein implemented in a NAND-type array, taken across the word lines and along the word line respectively. FIG. 20 shows a semiconductor body 70 including channel regions 74, 75 and source/drain terminals 71, 72, 73 contacting the channel regions. The channel length between the source and drain terminals is preferably less than 50 nm, and in preferred embodiments 30 nm or less. The composite dielectric tunneling layer 76, the charge trapping layer 77, the multilayer blocking dielectric layer 78A/78B and the word line layer 79 are arranged in stacks 80 and 81 over the channel regions 74 and 75, respectively.

FIG. 21 shows the structure of FIG. 20 taken in cross-section along a word line which includes the same stack with the same reference numerals as described with reference to FIG. 20. Columns of series connected cells are separated by shallow trench isolation STI structures 82, 83, 84. In the illustration, the surfaces of the channel 74, and of the adjacent channel 74A, are planar. Implementations of the device may include recessed (concave) channel surfaces in this cross-section, or extended (convex) channel surfaces, depending on the manufacturing techniques and the desired product. The tunneling dielectric layer 76 and the rest of the stack, including layers 77, 78A/78B, 79 overlie the channel surfaces, whether planar, concave or convex, in a conformal manner. The channel width between the STI structures (e.g., 82, 83) is preferably less than 50 nm, and more preferably as small as the STI techniques allow.

Figure 22:
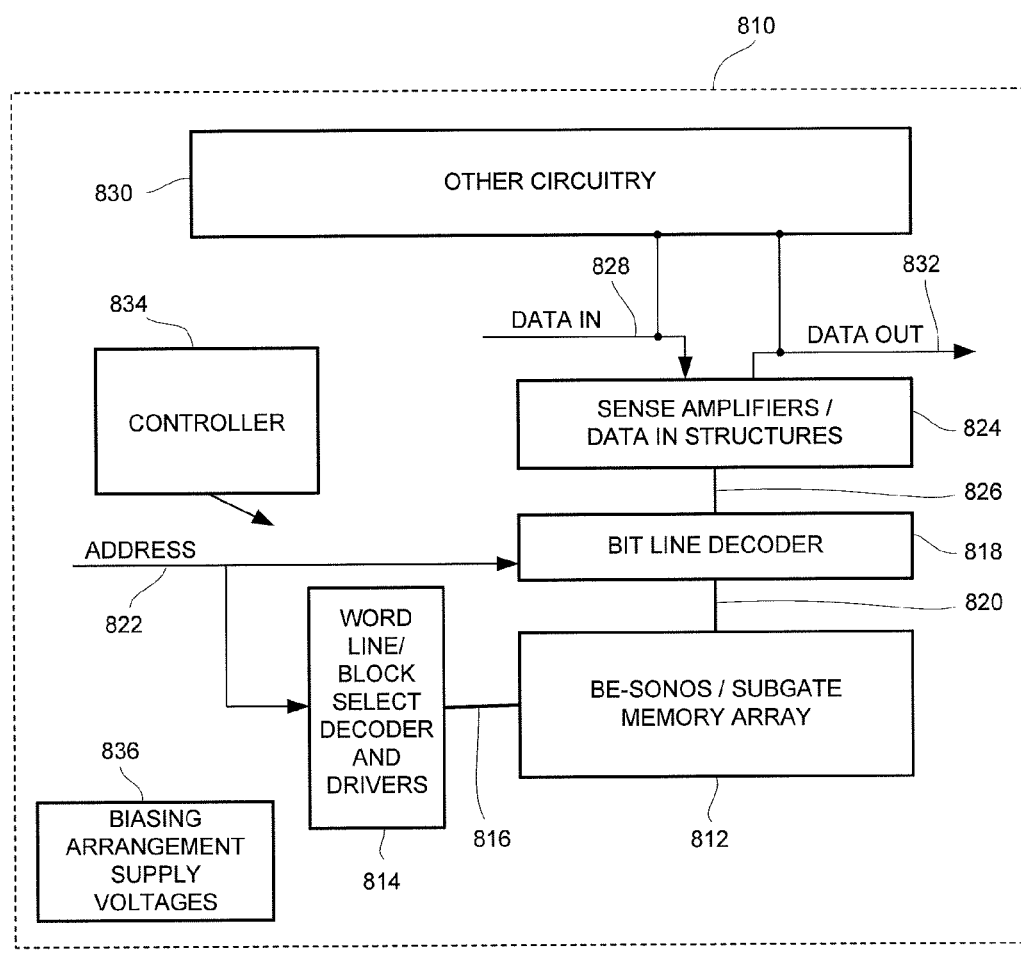
FIG. 22 is a block diagram of an integrated circuit memory employing memory cells and bias circuitry according to embodiments of the present invention.

FIG. 22 is a simplified block diagram of an integrated circuit employing blocking dielectric engineered BE-SONOS memory cells as described herein having a metal or polysilicon gate, a multilayer blocking dielectric (with or without high-κ cap), and a bandgap engineered tunneling dielectric layer. The integrated circuit 810 includes a memory array 812 implemented using blocking dielectric engineered BE-SONOS memory cells arranged as SGIB-AND strings as described herein on a semiconductor substrate. A word line (or row) and block select decoder 814 are coupled to, and in electrical communication with, a plurality 816 of word lines and block select lines, and arranged along rows in the memory array 812. A bit line (column) decoder and drivers 818 are coupled to and in electrical communication with a plurality of bit lines 820 in the memory array 812 for reading data from, and writing data to, the memory cells in the memory array 812. Addresses are supplied on bus 822 to the word line decoder and drivers 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

The array 812 can be a NAND array, an AND array or a NOR array, depending on the particular application. The very large memory window available supports storing multiple bits per cell, and thus multiple bit sense amplifiers can be included on the device.

A controller implemented in this example, using bias arrangement state machine 834, controls the application of bias arrangement supply voltages and current sources 836, such as read, program, erase (such as hole tunneling erase across the tunneling layer), erase verify, program verify voltages or currents for the word lines and bit lines, and controls the word line/source line operation using an access control process. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

Figure 23:
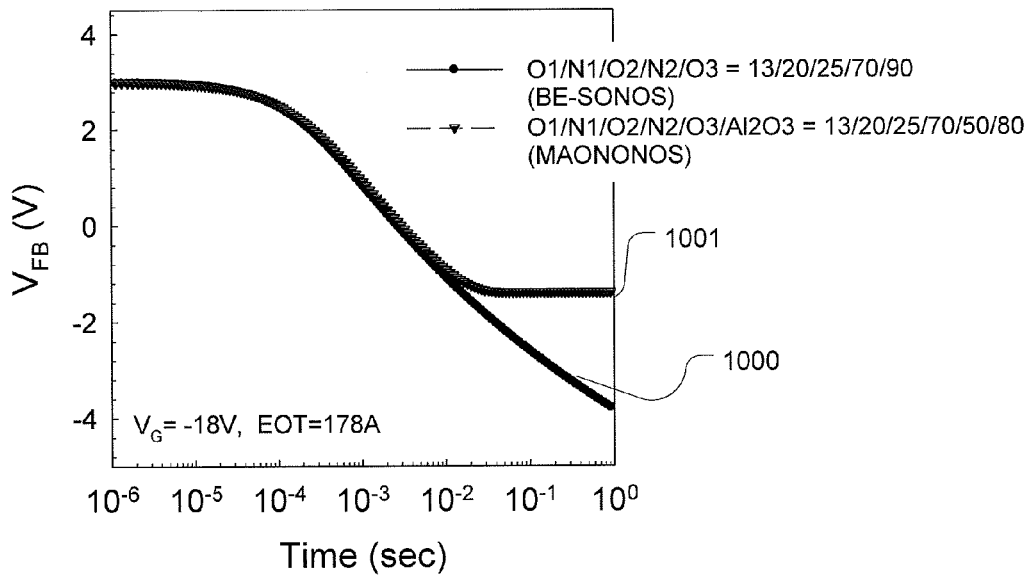
FIG. 23 is a graph of flat band voltage versus erase bias time showing erase curves for BE-SONOS cells with a single silicon dioxide layer blocking dielectric and with a multilayer blocking dielectric as described herein.

FIG. 23 is a graph of simulated flat band voltage (which correlates with threshold voltage for a memory cell) versus erase bias time showing simulated erase curves for a negative 18 V erase bias for an embodiment of a memory cell having a tunneling dielectric layer comprising a tunneling layer (O1) of 13 Å of silicon dioxide on the channel surface, an offset layer (N1) of 20 Å silicon nitride and an isolation layer ($O_2$) of 25 Å silicon dioxide, a charge trapping layer (N2) comprising 70 Å of silicon nitride, a blocking dielectric (O3) consisting of silicon dioxide 90 Å thick, and in a similar cell in which the blocking dielectric includes a buffer layer (O3) of silicon dioxide about 50 Å thick capped by a layer of aluminum oxide about 80 Å thick so that the effective oxide thickness of both embodiments is about 178 Å. The channel is grounded in these examples, and the gate voltage VG is about −18 V. The plot shows on trace 1001 that the erase saturation occurs in the embodiment without the aluminum oxide cap layer at a flat band voltage level higher than negative 2 V. However, the plot shows on trace 1000 that with the aluminum oxide capping layer, erase saturation is avoided at least to flat band voltage levels below −4 V.

Figure 24:
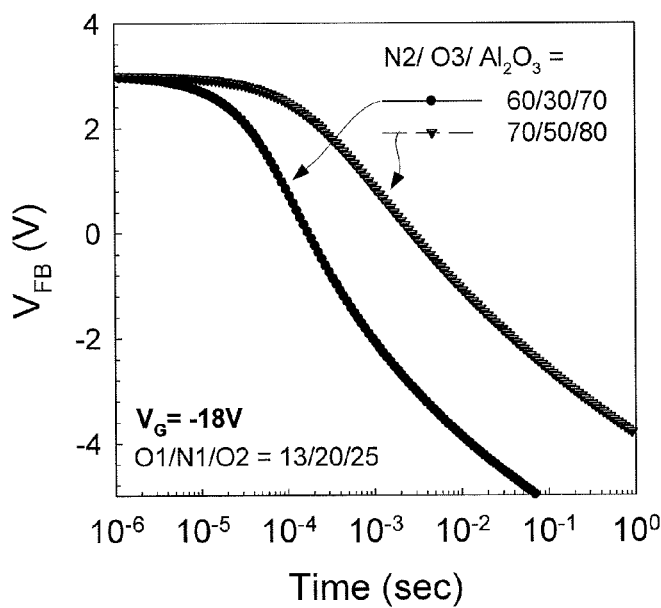
FIG. 24 is a graph of flat band voltage versus erase bias time showing erase curves for different multilayer blocking dielectric structures.

FIG. 24 is a graph of simulated flat band voltage versus erase bias time for similar cells with varying thicknesses of the charge trapping layer N2. The thickness of the silicon oxide buffer layer O3 and the thickness of the aluminum oxide capping layer are adjusted. The embodiment in which the charge trapping layer is 60 Angstroms, the buffer layer is 30 Angstroms and the capping layer is 70 Angstroms has a much higher erase speed than the alternative embodiment in which the charge trapping layer is 70 Angstroms, the oxide buffer is 50 Angstroms and the aluminum oxide capping layer is 80 Angstroms. This erase speed characteristic can be explained by the smaller effective oxide thickness of the first example, resulting in greater magnitude of electric field across the tunneling layer. However, in the embodiment in which the charge trapping layer is 60 Angstroms, the buffer layer O3 is less than k2/k1 time the thickness of the capping layer. Thus, such cell will suffer reduced charge retention.

Figure 25:
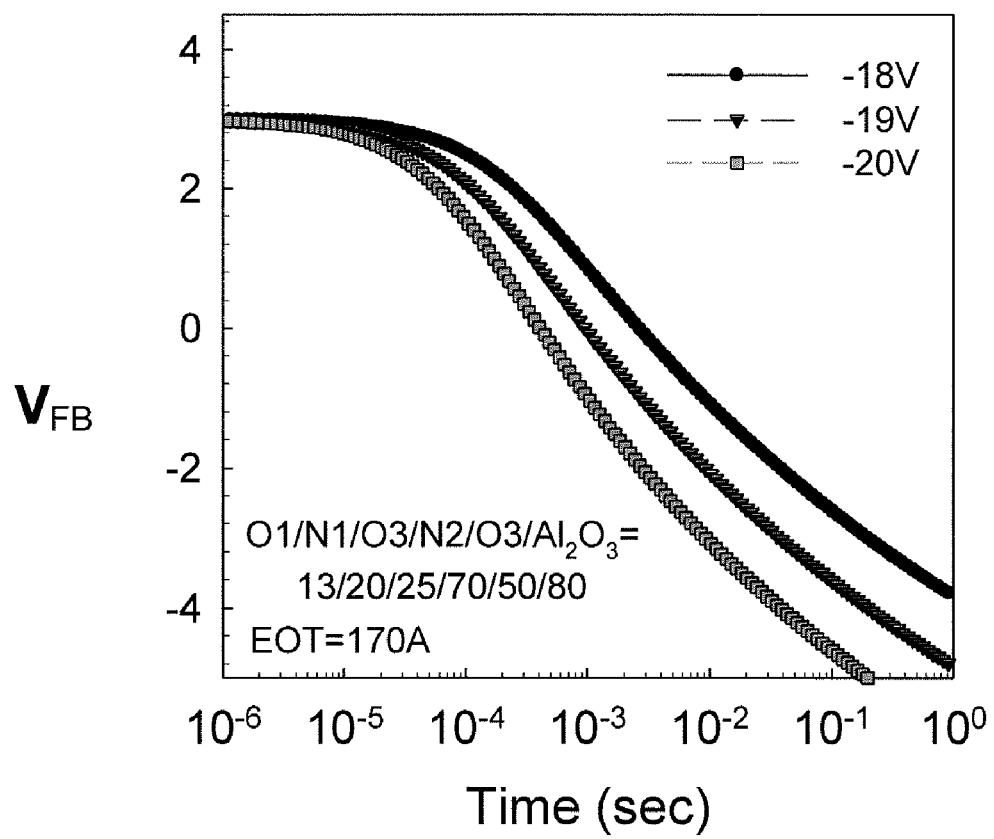
FIG. 25 is a graph of flat band voltage versus erase bias time showing erase curves for different erase bias voltages in a BE-SONOS cell with a multilayer blocking dielectric as described herein.

FIG. 25 is a graph of simulated flat band voltage versus erase bias time for a memory cell embodiment with a buffer layer of silicon dioxide about 50 Angstroms thick and a capping layer of aluminum oxide about 80 Angstroms thick, with various erase bias voltages. As illustrated, the erase speed improves significantly with increasing erase bias from −18 V to about −20 V. At erase bias of about −20 V, a threshold reduction of more than 7 V can be accomplished in about 100 ms. More than 2 V reduction in threshold can be accomplished in less than 1 ms.

Figure 26:
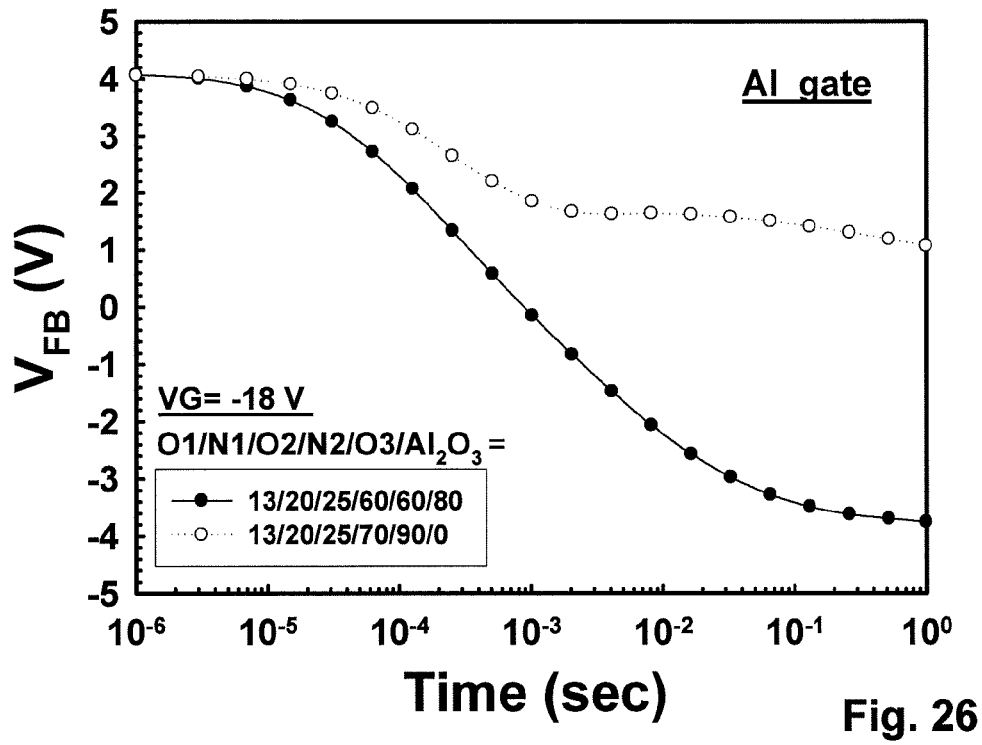
FIG. 26 is a graph of flat band voltage versus erase bias time showing erase curves for BE-SONOS cells having an aluminum gate, with a single silicon dioxide layer blocking dielectric and with a multilayer blocking dielectric as described herein.

FIG. 26 illustrates performance of a memory cell embodiment with and without the capping layer in the blocking dielectric, having an aluminum gate. An aluminum gate has a relatively low work function. However it can be seen as the use of the capping dielectric layer lowers the erase saturation threshold to a flat band voltage of almost negative 4 volts. In contrast, in an embodiment with a single silicon dioxide blocking layer, the erase saturation occurs at above positive 1 V.

Figure 27:
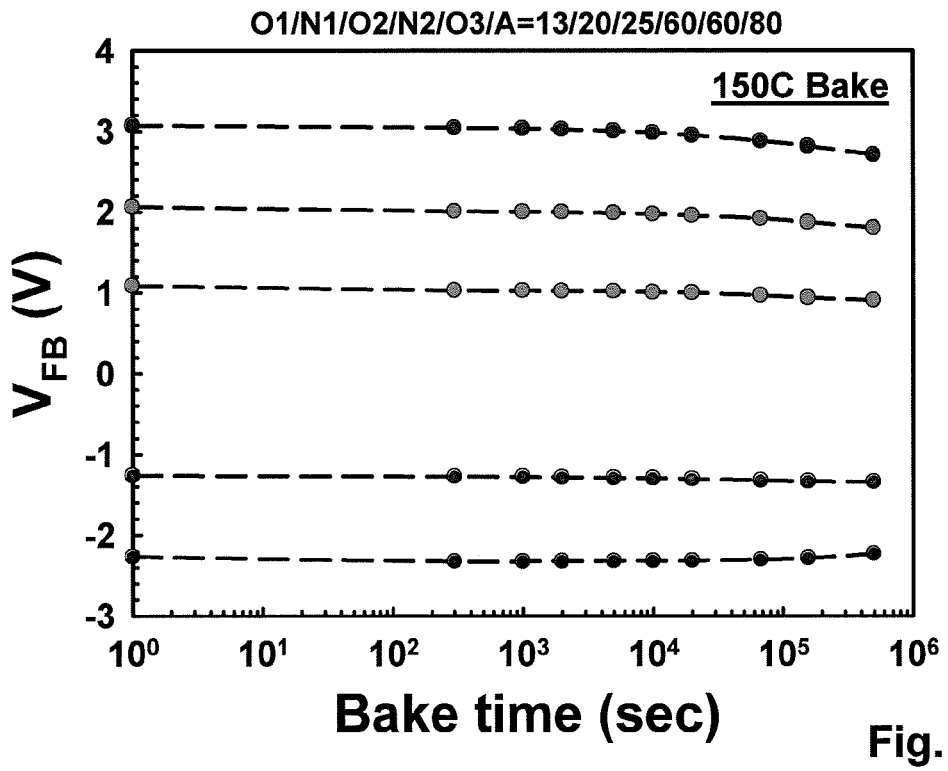
FIG. 27 is a graph of flat band voltage versus baking time showing excellent charge retention for various threshold levels for BE-SONOS cells with a multilayer blocking dielectric as described herein.

FIG. 27 shows retention characteristics according to a bake test for an embodiment of the memory cell described herein with a 60 Angstrom silicon dioxide buffer layer and an 80 Angstrom aluminum oxide capping layer. As can be seen, for flat band voltage thresholds of about 3, 2, 1, −1 and −2 volts, charge retention is quite good for baking times out to a million seconds at 150° C.

Figures 28A, 28B:
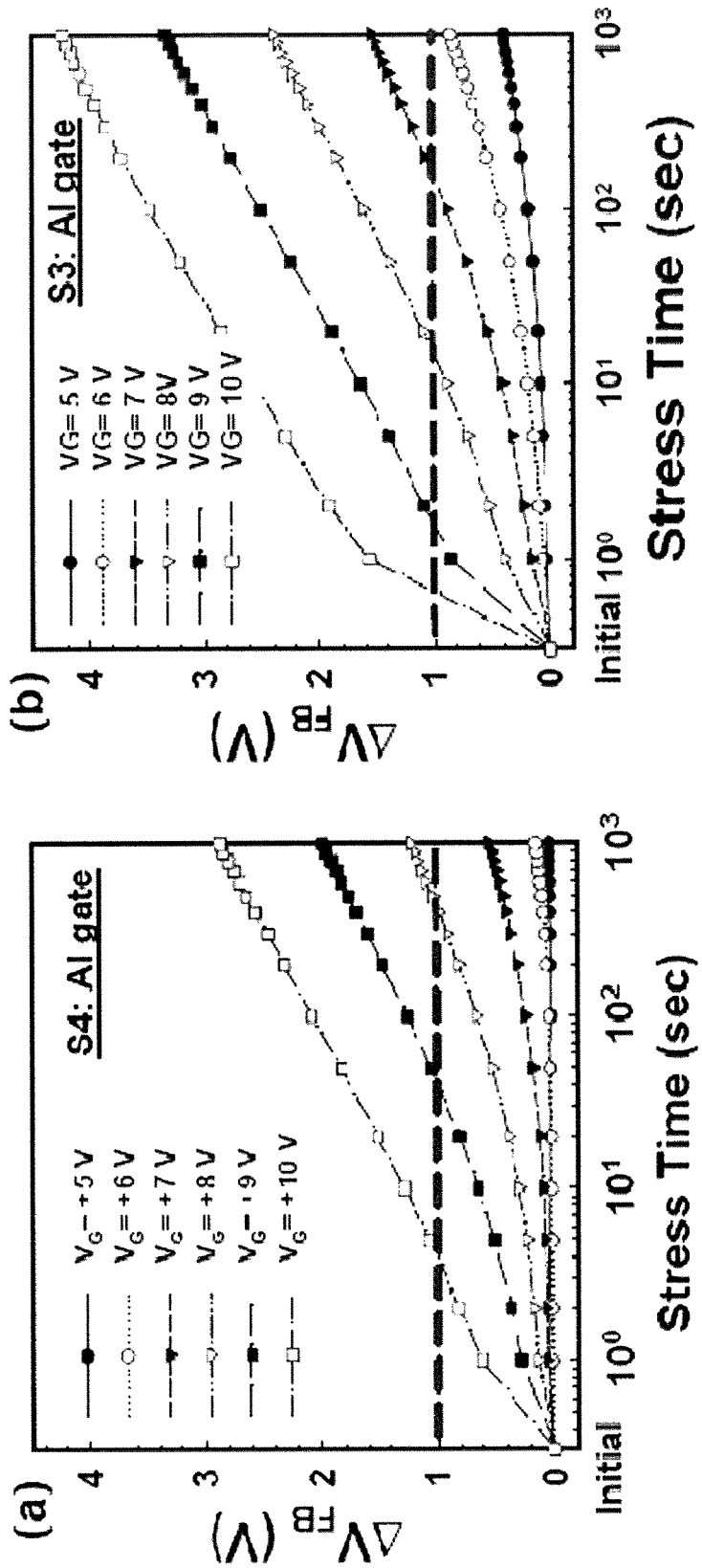
FIGS. 28A-28B are graphs of change in flat band voltage versus stress time, for BE-SONOS cells with a multilayer blocking dielectric as described herein, and with a single aluminum oxide layer blocking dielectric, respectively, for various read voltage levels.

FIGS. 28A and 28B illustrate the read-disturb characteristics for various read voltages (e.g. word line voltage in a NAND configuration during a read operation) in a memory cell embodiment having a 60 Angstrom silicon dioxide buffer layer and a 65 Angstrom aluminum oxide capping layer, and a memory cell embodiment with a 150 Angstrom aluminum oxide blocking layer, without a silicon dioxide buffer layer, respectively. Both embodiments have an aluminum gate, with a relatively small work function. As shown in FIG. 28A, the read voltage can exceed about 7.6 V and still pass one million read cycles without disturbing the threshold voltage of the cell by more than 1 V. On the other hand, without the silicon dioxide buffer layer, maximum read voltage to pass this test is closer to 6 V.

Figure 29:
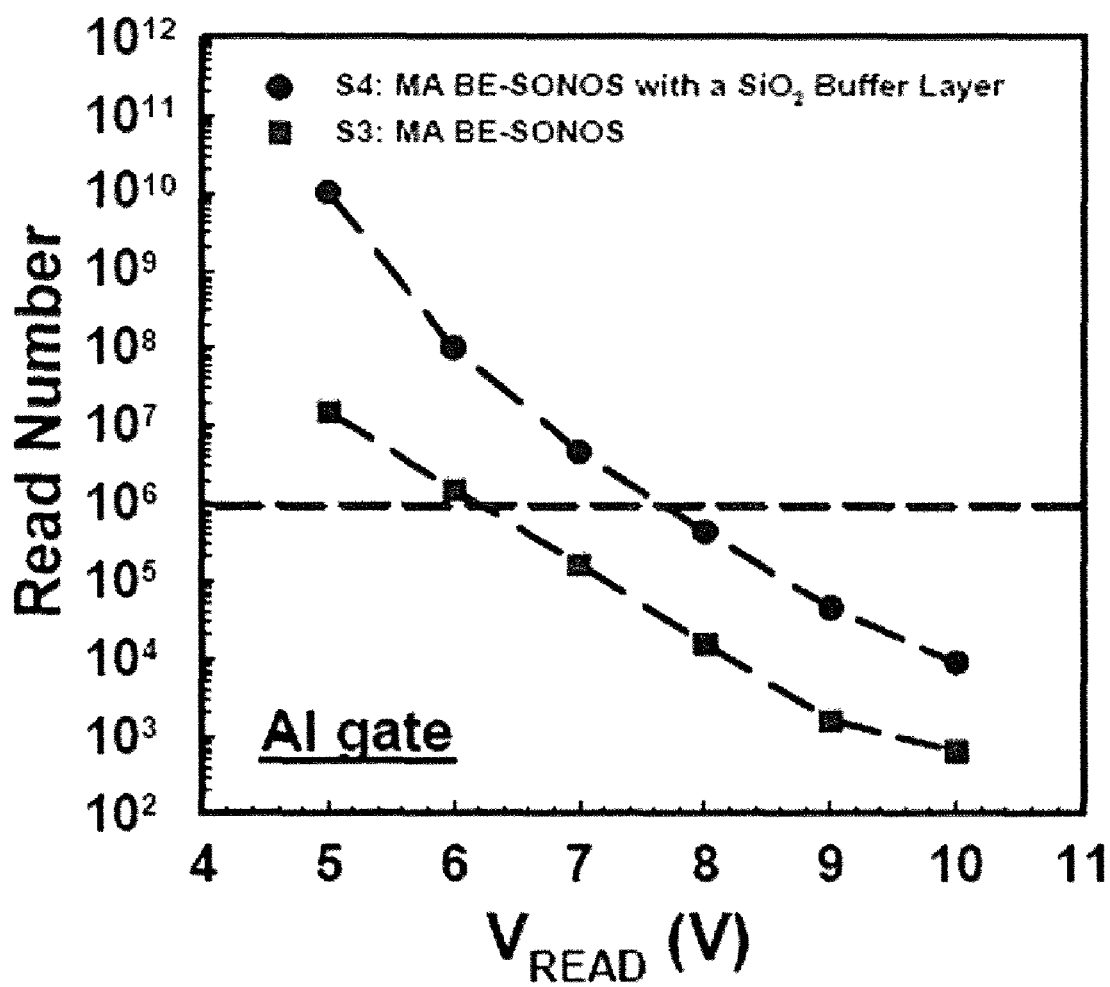
FIG. 29 is a graph of read cycle number versus read voltage for BE-SONOS cells with a multilayer blocking dielectric as described herein, and with a single aluminum oxide layer blocking dielectric.

FIG. 29 is a graph of read cycle number versus read voltage within a MA-BE-SONOS embodiment having an aluminum oxide blocking layer 150 Angstroms thick and a stacked 60 Angstrom silicon dioxide buffer/65 Angstrom aluminum oxide capping layer structure. For a read bias which passes the one million cycle test, it is predicted by this test that the use of the silicon dioxide buffer layer will improve the endurance by more than two orders of magnitude.

Figure 30:
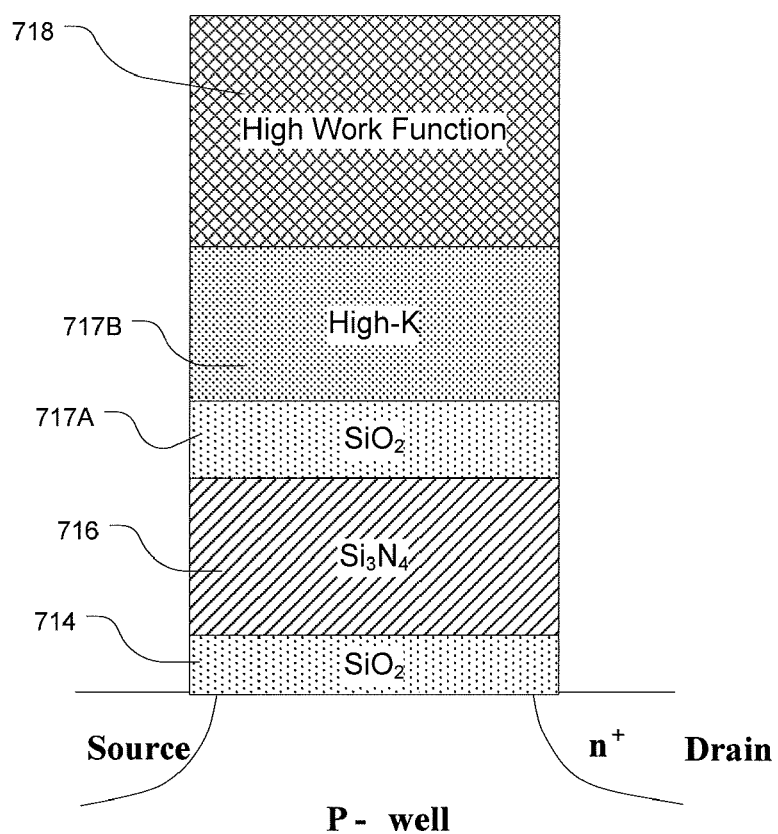
FIG. 30 is a simplified cross-section of a MONOS style memory cell with a high-κ capping layer.

FIG. 30 shows a memory cell comprising a MONOS multi-layer stack with a high-κ capping layer 717B, without the bandgap engineered tunneling layer of FIG. 14. Referring to FIG. 30, the "High Work Function" gate 718 can comprise any metal gate material or alternatively a polysilicon gate. The high-κ capping layer can well suppress the gate injection so that almost all the metal films can be used, including materials like aluminum in which the work function is as low as 4.3 eV. TaN, TiN, P+ poly-Si gate and N+ poly gate may be preferred. Platinum is also a good metal gate material. Alternatives include Ti, Ta, Al, W, WN, $RuO_2$, etc.

The capping layer 717B is a high dielectric constant layer with the dielectric constant >6, such as $Al_2O_3$, $HfO_2$, $ZrO_2$, $La_2O_3$, AlSiO, HfSiO and ZrSiO etc., where $Al_2O_3$ and $HfO_2$ are preferred in this invention. The thickness of high-κ top-capping layer is 3~20 nm.

The buffer layer 717A can be wet conversion $SiO_2$ from nitride, high temperature oxide (HTO) or LPCVD $SiO_2$ etc. However, the wet conversion $SiO_2$ is preferred. The preferred thickness of buffer layer 717A is 0.5~8 nm, where the relative thickness satisfies the relation that is more than κ1/κ2 time the thickness of the capping layer 717B.

For embodiments employing a buffer layer of silicon dioxide and a capping layer of aluminum oxide, the thickness range for $SiO_2$ buffer layer is preferably in the range of 20~70 Å, and the $Al_2O_3$ capping layer preferably has a thickness less than 50 Å. Currently preferred embodiments use a $SiO_2$ buffer layer of about 60 Å, and a capping layer of $Al_2O_3$ of about 40 Å.

The charge trapping layer 716 is preferably silicon nitride, which offers a high trap density. Other materials, including for example silicon oxynitride, silicon rich nitride, and silicon rich oxide, can be used as charge trapping layers.

The tunnel layer 714 is grown on top of silicon channel with a thickness range from 3~5 nm. Furnace oxide where the tunnel oxide is formed by oxidation of the silicon substrate, is preferred in this embodiment.

Figure 31:
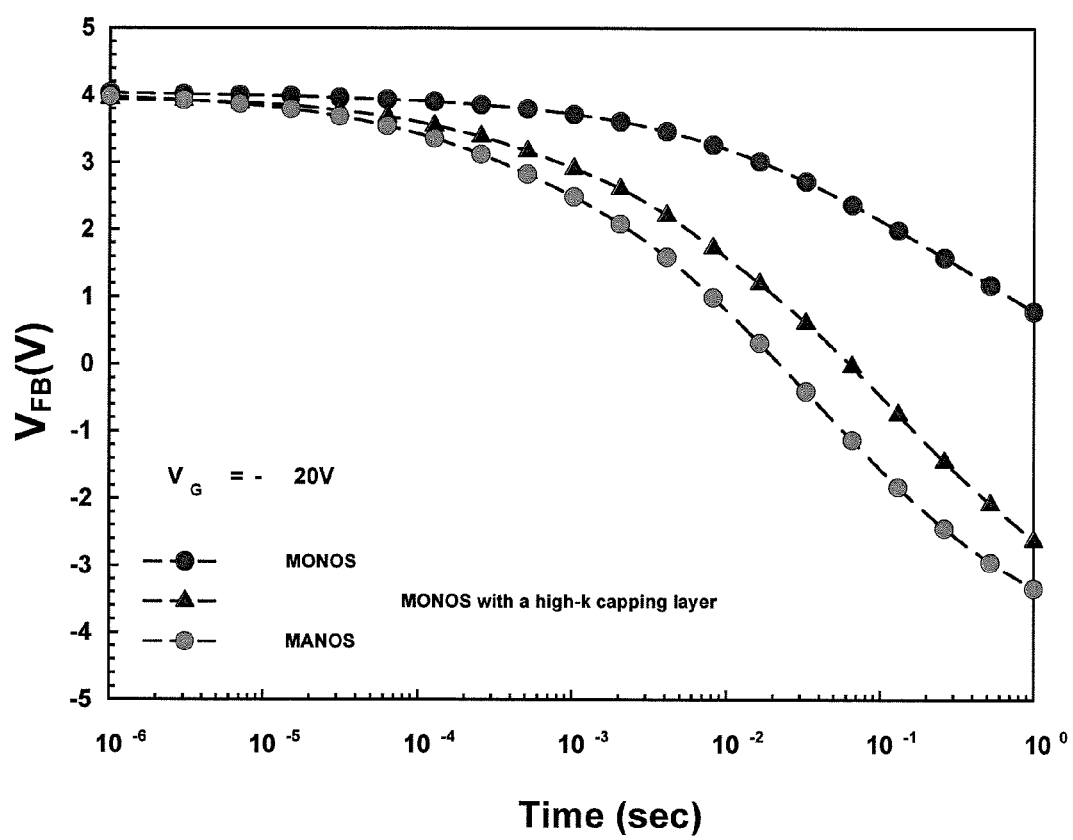
FIG. 31 shows erase characteristics of MONOS, MONOS with a high-κ capping layer and MANOS.

FIG. 31 shows the erase characteristics of typical MONOS, MONOS with a high-κ capping layer as described herein, and MANOS. The dimensions of the cell are shown in the table below. Platinum is the gate material for the cells in the simulation. MANOS and MONOS with a high-κ capping layer have lower erase saturation levels and larger memory windows than MONOS. In addition, MANOS and MONOS with a high-κ capping layer also have higher erase speed.

| | Tunneling dielectric | Trapping Nitride (N2) | Top Dielectric | EOT |
|---|---|---|---|---|
| MONOS | 45 | 70 | $SiO_2$ = 90 | 174 |
| MONOS with a high-k capping layer | 45 | 70 | $SiO_2/Al_2O_3$ = 40/60 | 155 |
| MANOS | 45 | 70 | $Al_2O_3$ = 150 | 162 |

* The unit is angstrom.

Compared with conventional single $SiO_2$ layer for blocking oxide, the high-κ capping layer has higher dielectric constant and can well suppress the gate electron injection, therefore, high-κ capping layer is also good for the EOT scaling of blocking oxide.

Figure 32:
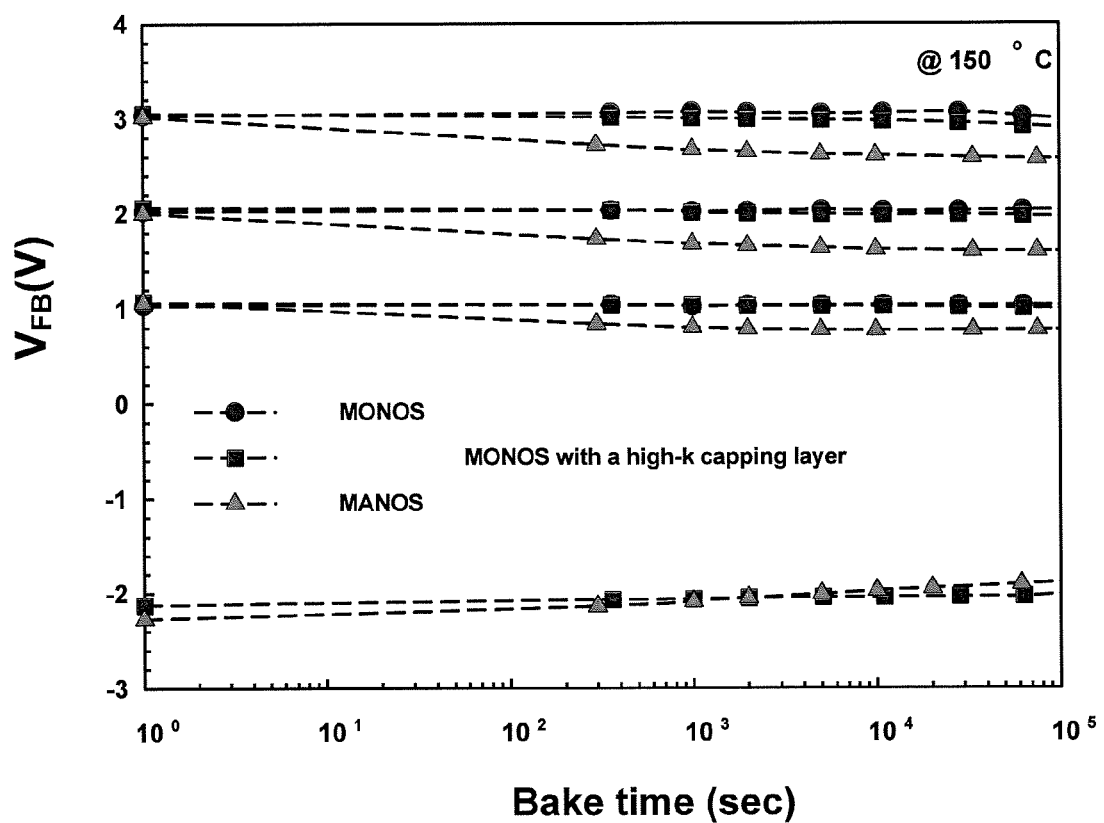
FIG. 32 shows retention characteristics of MONOS, MONOS with a high-κ capping layer and MANOS.

FIG. 32 shows the retention characteristics of MONOS, MONOS with a high-κ capping layer and MANOS, where MONOS and MONOS with a high-κ capping layer have better retention than MANOS. It's because the unstable high-κ/SiN interface is eliminated by top oxide ($SiO_2$).

Figure 33:
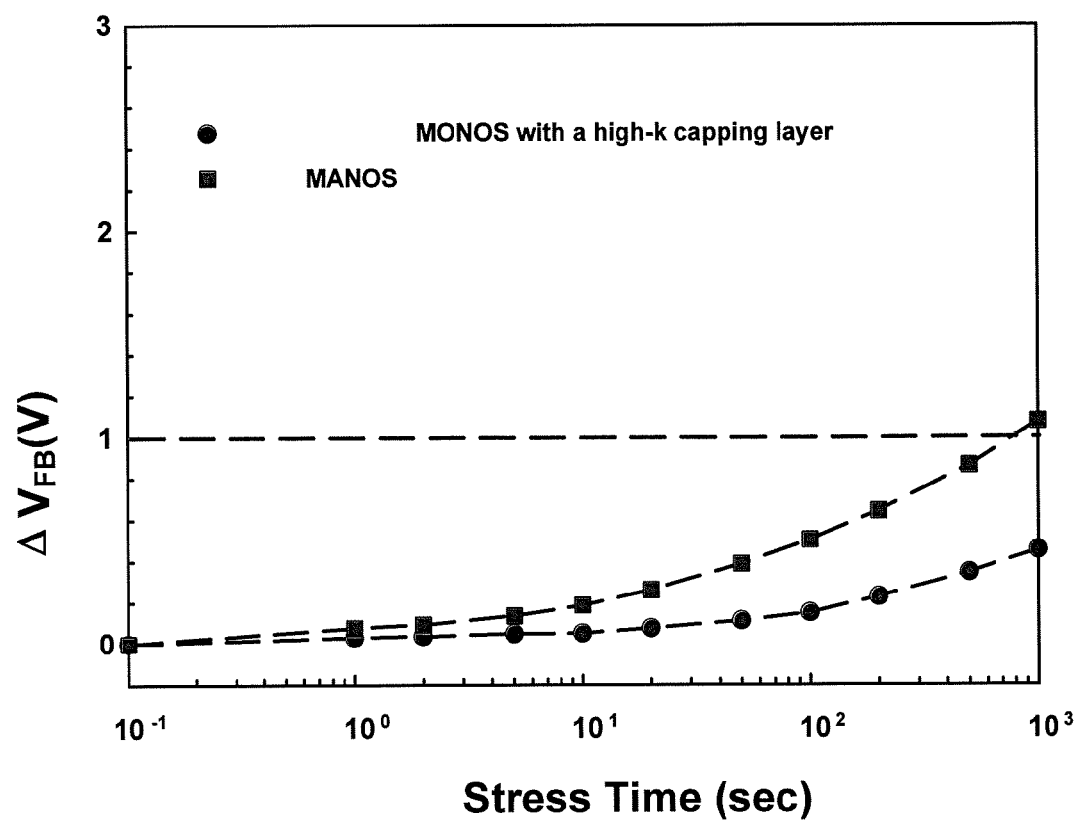
FIG. 33 shows read-disturb characteristics of MONOS, MONOS with a high-κ capping layer and MANOS.

FIG. 33 shows the read-disturb characteristics of MANOS and MONOS with a high-κ capping layer, where MONOS with a high-κ capping layer also shows a better performance because of the elimination of high-κ/SiN unstable interface.

In summary, MONOS with a high-κ capping layer has the most optimized performance among the three embodiments shown in the table above, such as low erase saturation level, large memory window, good retention and good immunity to read disturbance.

The examples described above are implemented using n-channel devices, in which the source and drain terminals are doped with n-type impurities. The technology can be implemented using p-channel devices as well, in which the source and drain terminals are doped with p-type impurities.

The examples described above are implemented using devices with flat or planar channel surfaces. The technology can be implemented using non-planar structures, including cylindrical channel surfaces, fin shaped channels, recessed channels and so on.

In the examples described above the charge storage stack is implemented so that the tunneling layer is on the channel surface and the blocking dielectric layer is adjacent the gate. In alternatives, the charge storage stack may be reversed, so that the tunneling layer is adjacent the gate terminal and the blocking dielectric is on the channel surface.

A memory cell and memory architecture is provided using a composite multilayer blocking dielectric layer that includes a buffer layer and a capping layer of high dielectric constant material. The composite structure eliminates the unstable interface between high dielectric constant materials and the charge trapping layer. Experimental results show that the device suppresses erase saturation and provides excellent data retention. A very large memory window (greater than 7V) with excellent cycling endurance, read disturb immunity and data retention has been demonstrated. Memory cells having gate lengths on the order of 45 nm or less can be provided.

Figure 34:
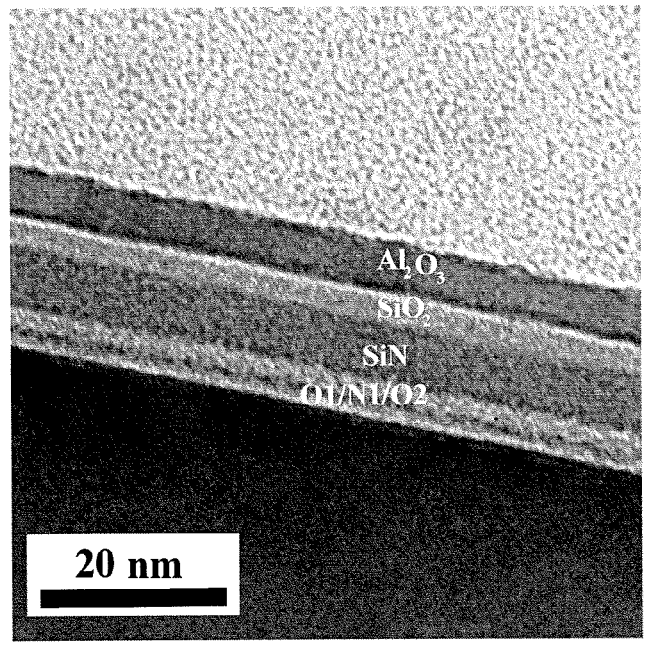
FIG. 34 shows TEM micrograph of MA BE-SONOS with a $SiO_2$ buffer layer.

Experimental results have been obtained based on fabrication of MA BE-SONOS basically similar to [S. C. Lai et al, IEEE NVSMW, pp. 88-89, 2007]. Before $Al_2O_3$ deposition, various oxide buffer layers converted from part of nitride are formed by furnace wet oxidation. The typical TEM cross-sectional view of the device is shown in FIG. 34. MANOS with a $SiO_2$ buffer layer is also fabricated for comparison in this study.

Figure 35:
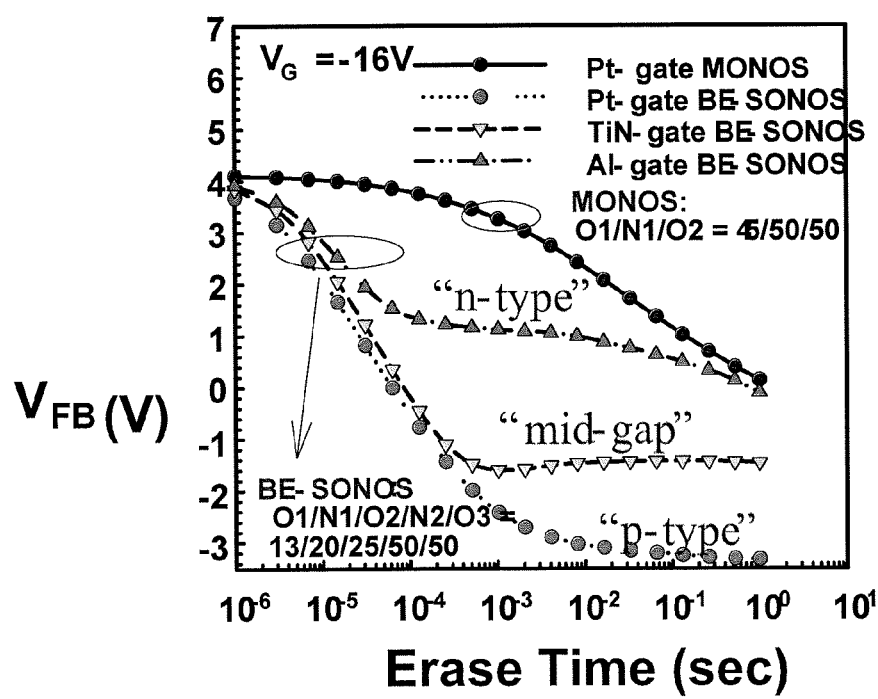
FIG. 35 shows erase characteristics of MONOS, and BE-SONOS with different gate materials. Al (n-type), TiN (mid-gap) and Pt (P-type) gate are compared. BE-SONOS has much faster erase speed than MONOS (EOT ~130 Å for both devices). For BE-SONOS, higher work-function metal gate has lower erase saturation.

FIG. 35 shows that the erase speed of BE-SONOS is much faster than MONOS at the same EOT. This is because ONO tunneling barrier in BE-SONOS greatly enhances the channel hole tunneling efficiency for the erase, while electron de-trapping in MONOS is very slow. On the other hand, the gate material has profound effect on the erase saturation. A high work-function metal gate (such as Pt) is necessary to suppress the gate injection for these type cells.

Figure 36:
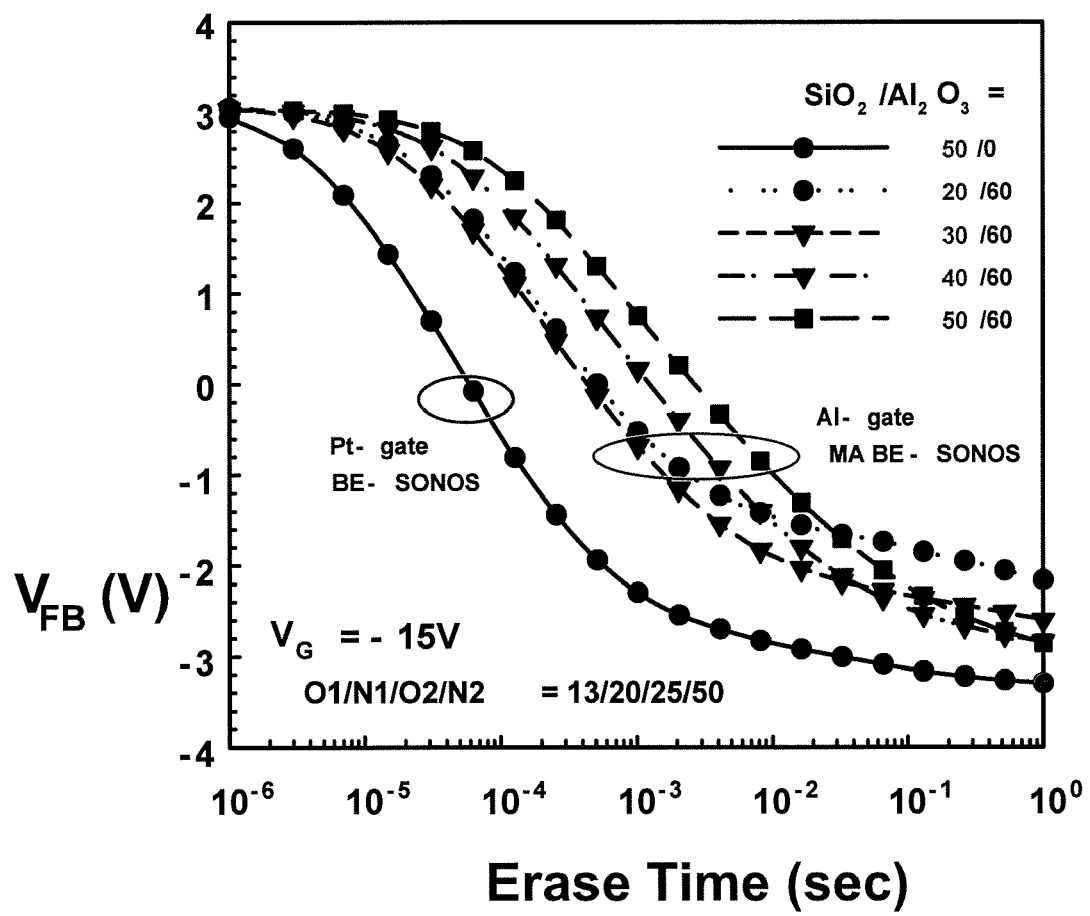
FIG. 36 shows erase characteristics of Pt-gate BE-SONOS and Al-gate MA BE-SONOS with various $SiO_2$ buffer layer at $V_G$=-15 V. Al-gate MA BE-SONOS shows similarly low erase saturation level just like Pt-gate BE-SONOS. This indicates that $Al_2O_3$ top-capping layer can greatly suppress the gate injection.

In order to suppress the gate injection, an additional $Al_2O_3$ layer is formed on top of BE-SONOS. FIG. 36 compares the erase characteristics of MA BE-SONOS with various $SiO_2$ buffer layers. It shows that MA BE-SONOS has a low erase saturation level, just like Pt-gate BE-SONOS, even using an "n-type" (low work function) Al gate. It can be expected that the erase saturation can be further improved when combined with a higher work function metal gate.

Figure 37:
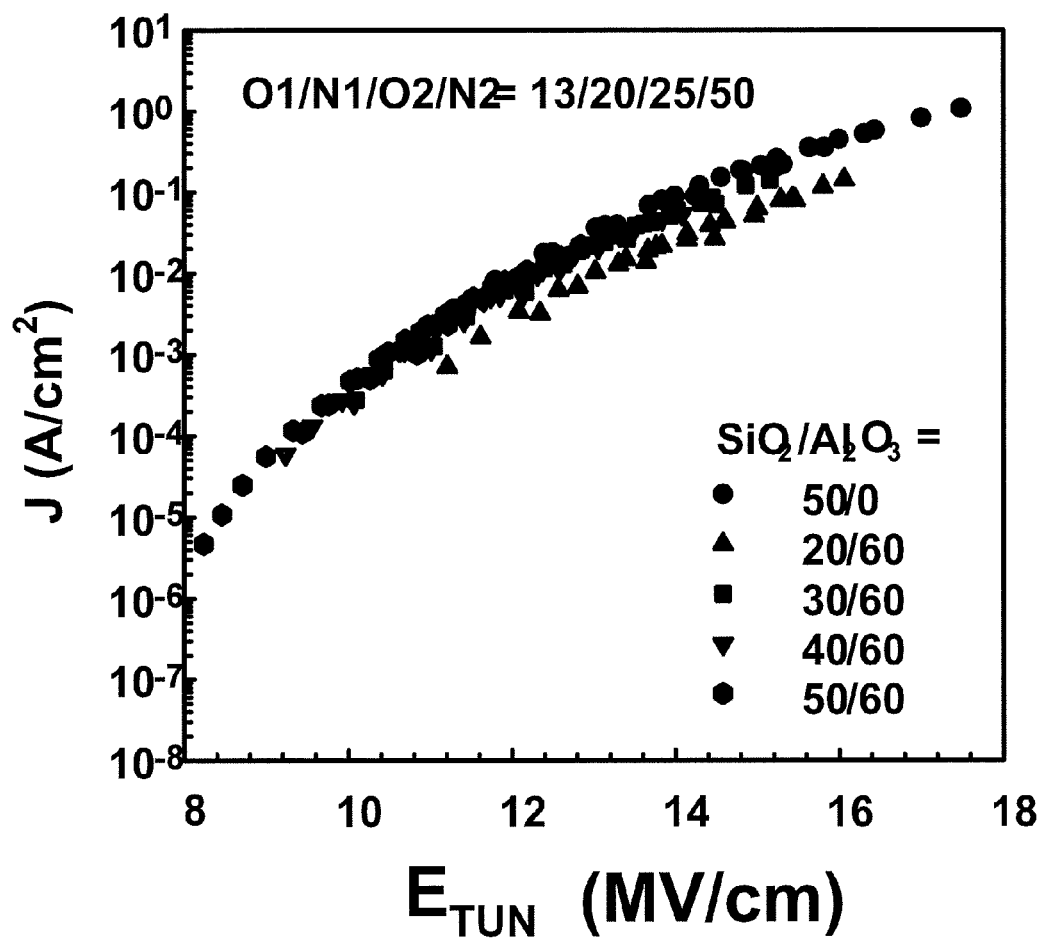
FIG. 37 shows erase transient current density in FIG. 36. All the samples show identical erase J-E curves. This implies that all the devices have the same erase mechanism, since they share the same ONO tunneling barrier.

In FIG. 36, the "apparently" lower erase speed of MA BE-SONOS with a $SiO_2$ buffer layer is attributed to the higher EOT. In order to fairly compare the erase speed, we employ the transient analysis [H. T. Lue et al, IEEE Electron Device Letters, vol. 25, pp. 816-818, 2004], as shown in FIG. 37. The J-E plot clearly shows that all the devices have the same erase current densities, since they share the same ONO tunneling barrier. This proves that the oxide buffer layer has no impact on the erase mechanism.

Figure 38:
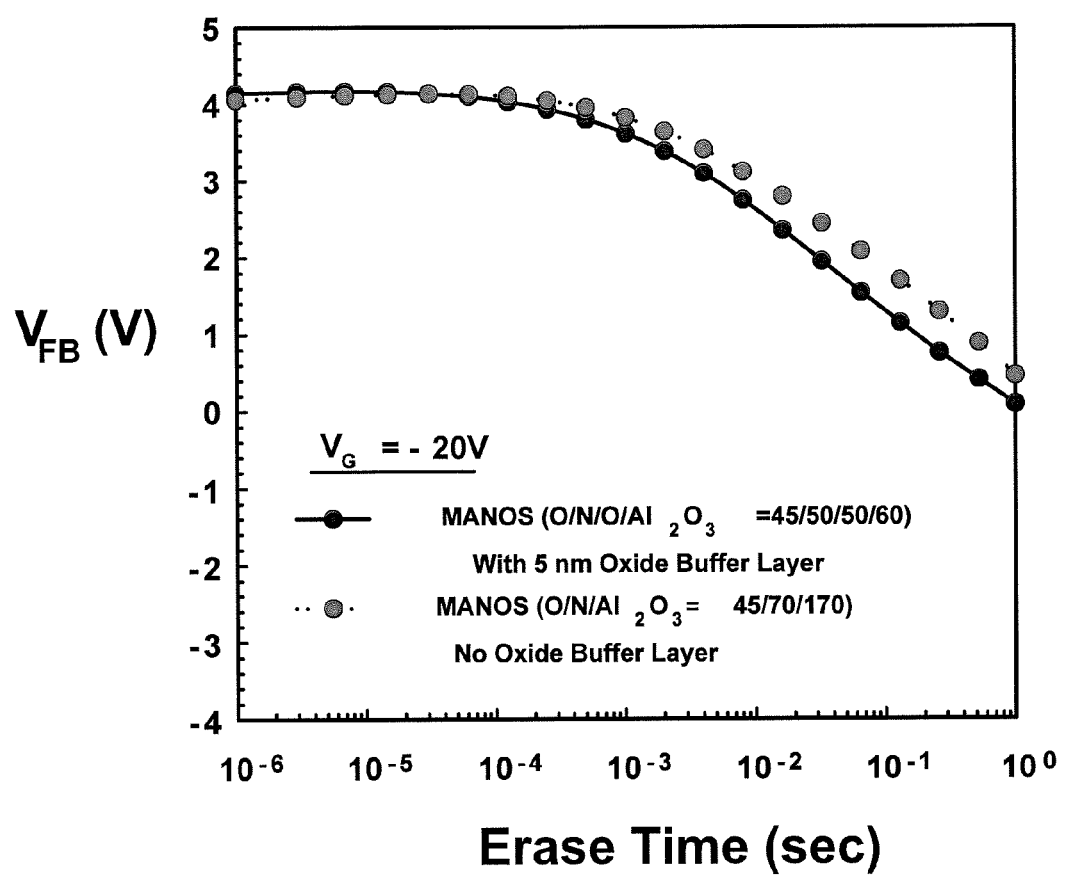
FIG. 38 shows erase speed comparison of MANOS with and without oxide buffer layer. The EOTs of MANOS with and without an $SiO_2$ buffer layer are 15.4 nm and 17.2 nm, respectively. The gate material is aluminum for both devices.

We also study the MANOS with an additional oxide buffer layer. FIG. 38 shows that the insertion of oxide buffer layer basically shows similar erase performance to MANOS. However, MANOS shows much slower erase speed than BE-SONOS, because electron de-trapping is very slow as compared with substrate hole injection. Therefore, MANOS is less practical in terms of the erase speed.

Figure 39:
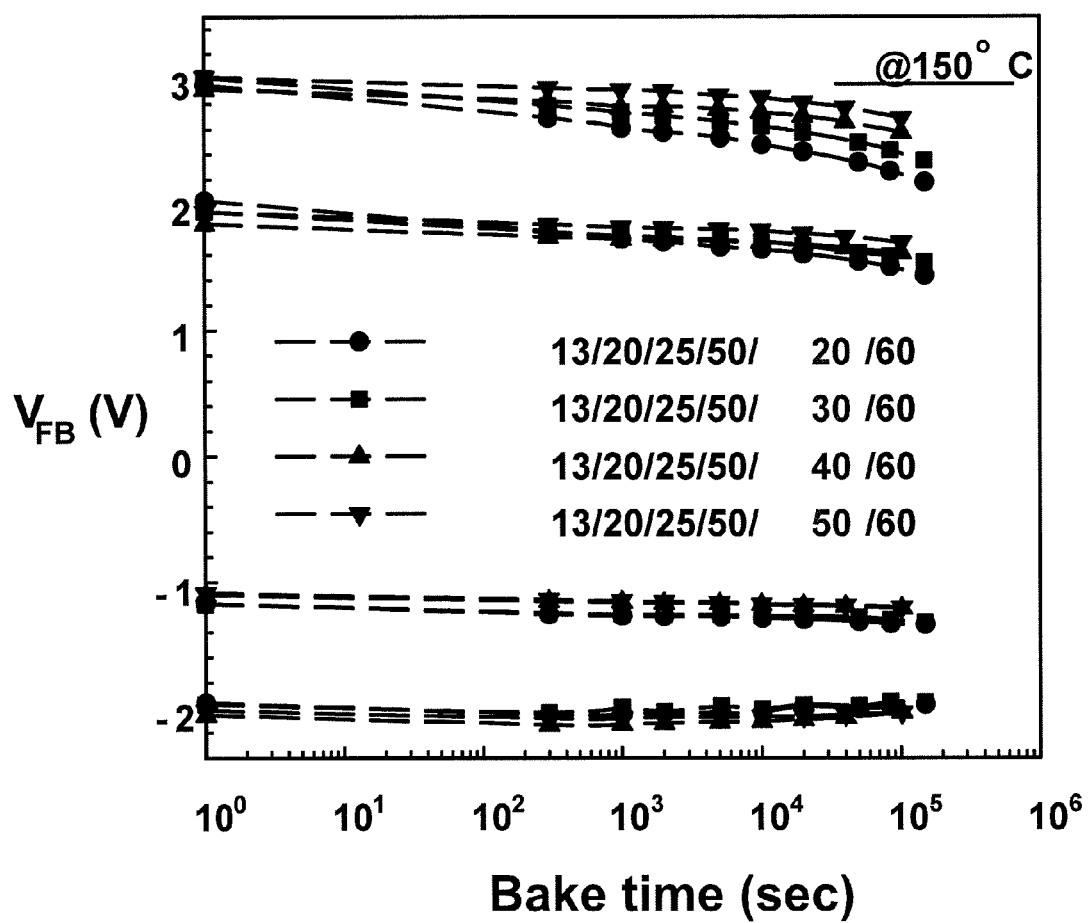
FIG. 39 shows 150° C. bake retention characteristics of MA BE-SONOS with various oxide buffer layer. Thicker oxide buffer layer improves the data retention.
Figure 40:
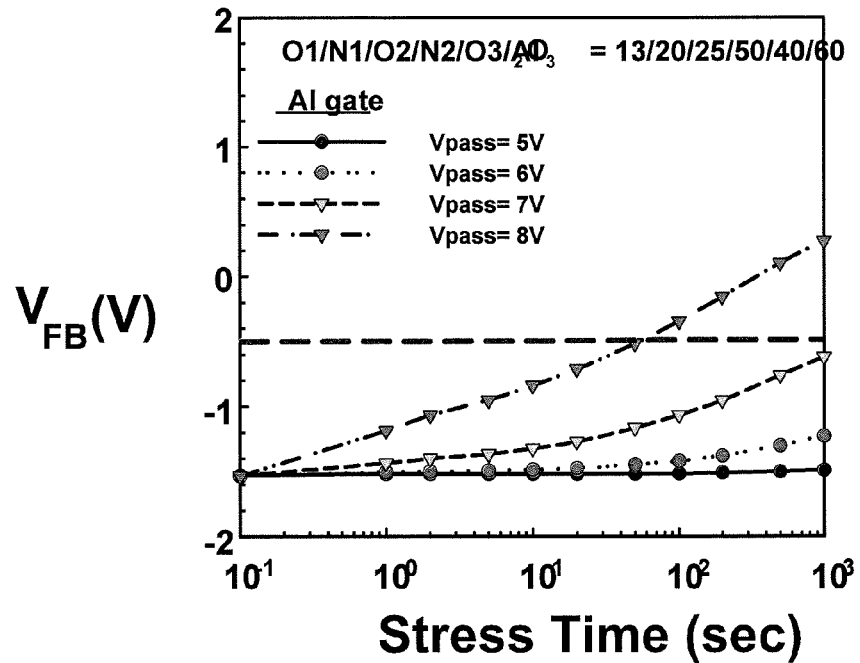
FIG. 40 shows read disturb test of MA BE-SONOS (13/20/25/50/40/60) with oxide buffer layer. Various gate voltage is applied to the erased state ($V_{FB}$=-1.5 V).
Figure 41:
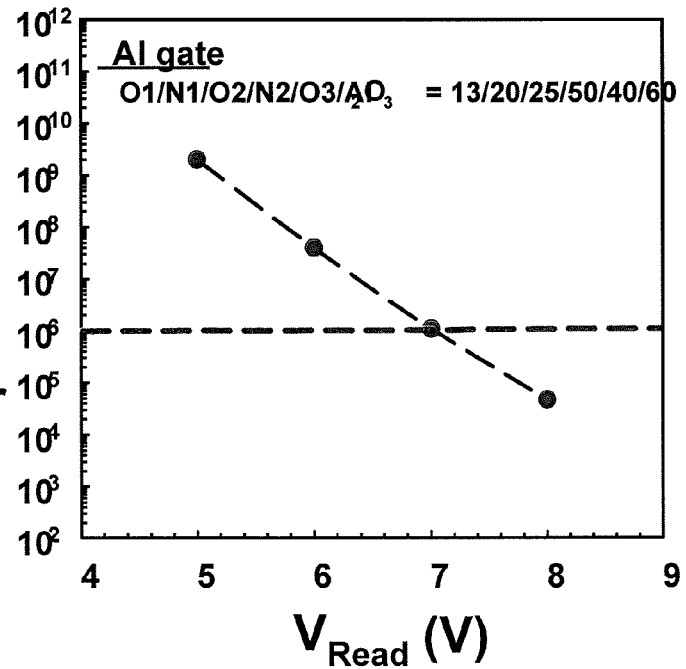
FIG. 41 shows read number vs. V-read curve of MA BE-SONOS with a 4 nm $SiO_2$ buffer layer, extracted from FIG. 40. The read number=(Stress time for $\Delta V_{FB}$=1V at initial $V_{FB}$=-1.5V)/(1 ms read access time). The read number can exceed 1M read cycles at Vread <7 V.
Figure 42:
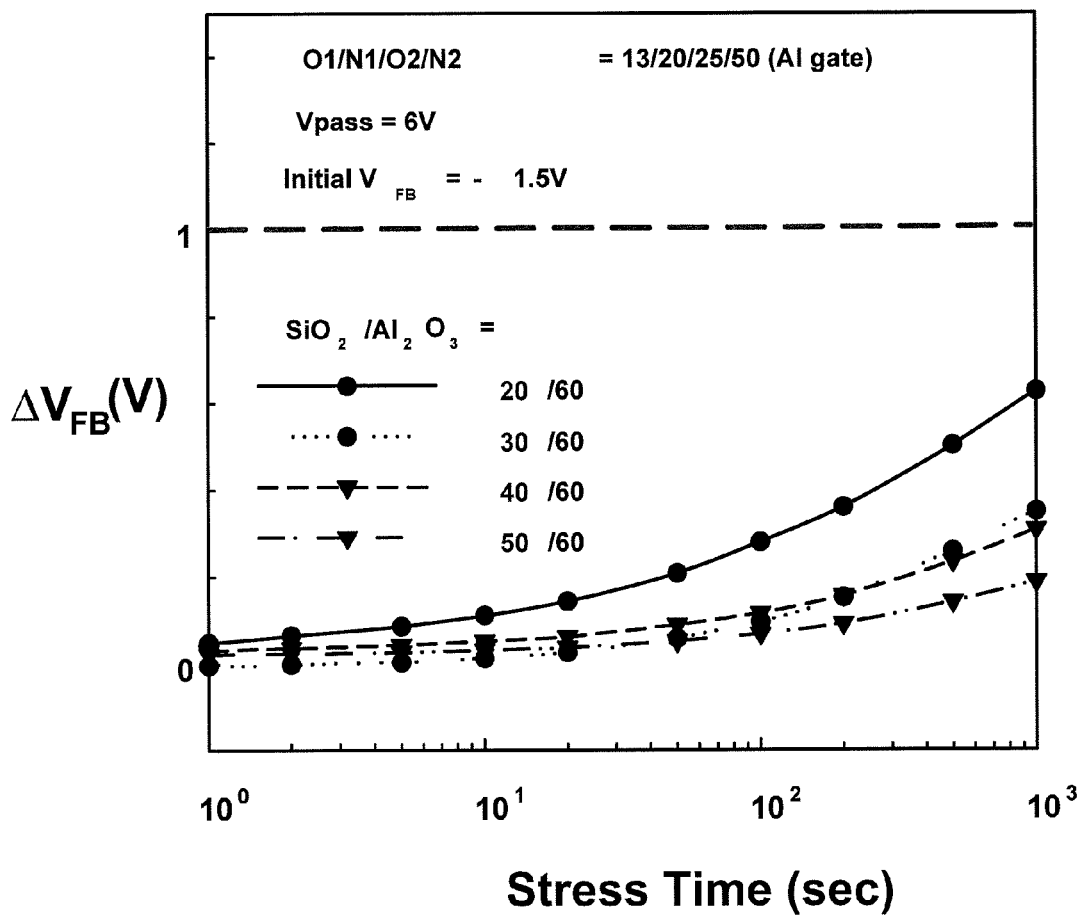
FIG. 42 shows read disturb characteristics of MA BE-SONOS with different thickness of $SiO_2$ buffer layer. Thinner oxide buffer layer shows slightly enhanced read disturb.

FIG. 39 compares the retention of MA BE-SONOS with various oxide buffer layers at 150° C. Thicker oxide buffer layer can improve the data retention. This suggests that $Al_2O_3$ causes charge leakage. FIG. 40 shows the read disturb test. The device can sustain a high gate voltage (>6 V) stress. FIG. 41 shows that the read disturb life time exceeds more than IM read cycles at Vread <7 V. FIG. 42 shows that the read disturb is slightly degraded with a thinner buffer layer, with substantial improvement occurring with a buffer oxide layer that is half or more of the thickness of the aluminum oxide capping layer. Therefore it is desirable to provide a relatively thicker buffer layer according to these results, as discussed above.

Figure 43:
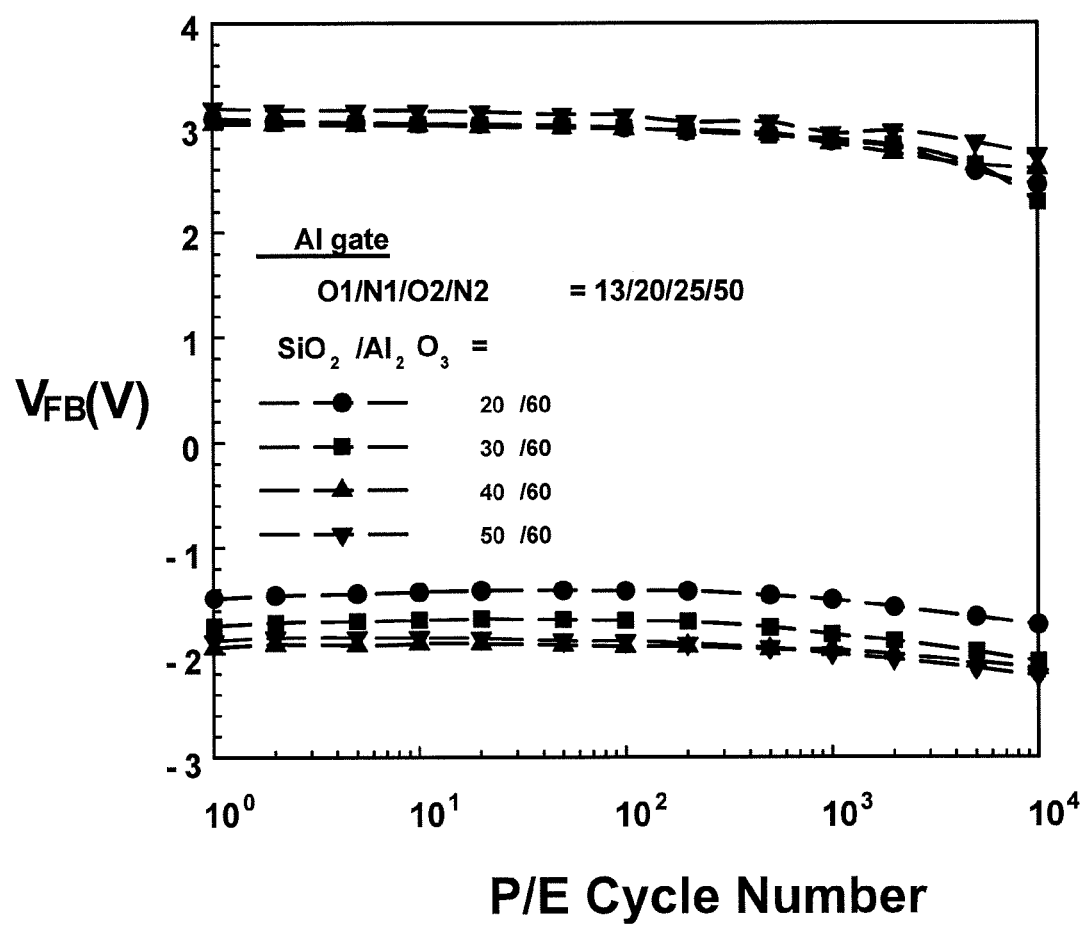
FIG. 43 shows cycle endurance of MA BE-SONOS with different thicknesses of $SiO_2$ buffer layers. All the devices can well maintain memory window after 10K cycling stress.

FIG. 43 shows the cycle endurance of MA BE-SONOS with various $SiO_2$ buffer layer thicknesses. All the devices can well maintain memory window after 10,000 P/E cycles.

Figure 44:
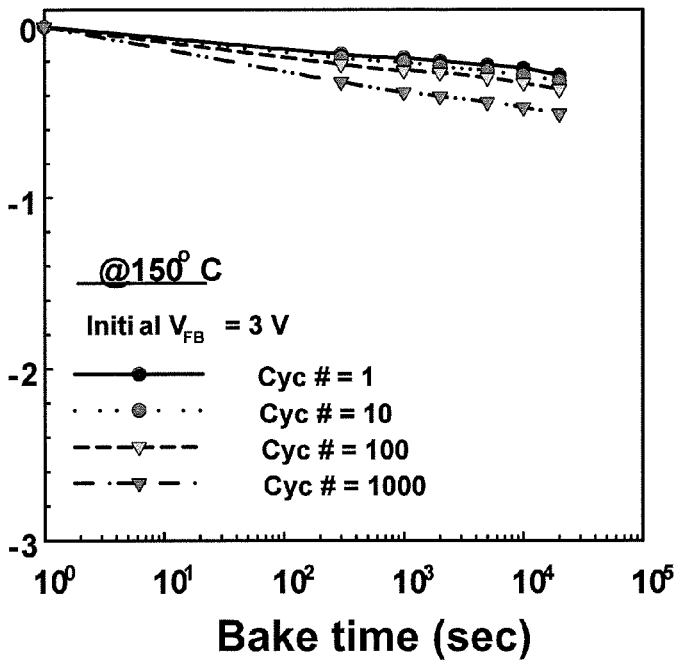
FIG. 44 shows retention characteristics of MA BE-SONOS with a 4 nm $SiO_2$ buffer layer after different P/E cycles, where all the devices are program to $V_{FB}$=3V first and then baked at 150° C. The film stack of this sample is 13/20/25/50/40/60 with a Al metal gate.

The post-cycled retention of MA BE-SONOS (13/20/25/50/40/60) with a 40 Angstrom thick oxide buffer layer and a 60 Angstrom thick aluminum oxide capping layer is shown in FIG. 44, in which the devices were first programmed to a flat band voltage level of 3 V. The post-cycled device shows larger initial charge loss. However, the long-term retention becomes similar to the fresh state.

Figure 45:
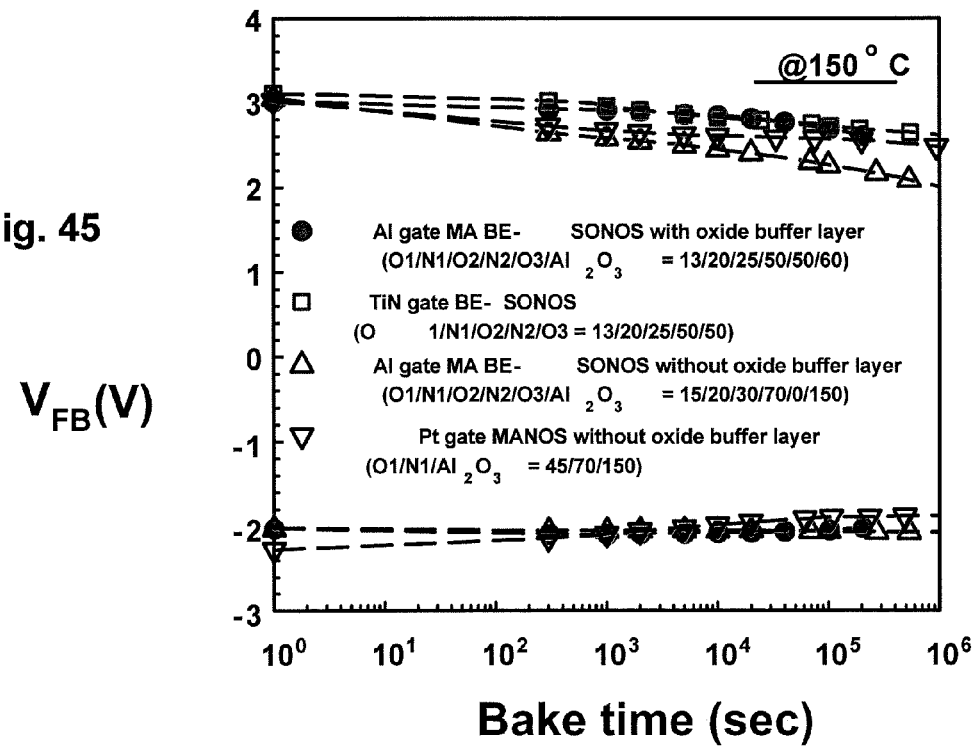
FIG. 45 shows retention comparison of MA BE-SONOS with oxide buffer layer (13/20/25/50/50/60), TiN gate BE-SONOS (13/20/25/50/50), MA BE-SONOS without oxide buffer layer, and MANOS without oxide buffer layer.

FIG. 45 compares the retention of various devices, including an aluminum gate, MA BE-SONOS device with a 50 Angstrom silicon dioxide buffer and a 60 Angstrom aluminum oxide capping layer, a TiN gate, BE-SONOS with 50 Angstrom silicon dioxide only blocking layer, an aluminum gate, MA BE-SONOS device without a silicon dioxide buffer but with an 150 Angstrom aluminum oxide capping layer, and a platinum gate MANOS device without a silicon dioxide buffer layer. It shows that TiN gate BE-SONOS shows the best retention performance. Both MANOS and MA BE-SONOS without oxide buffer layer show worse retention. This data suggests that $Al_2O_3$ directly contacting with nitride charge trapping layer causes charge leakage.

Figure 46:
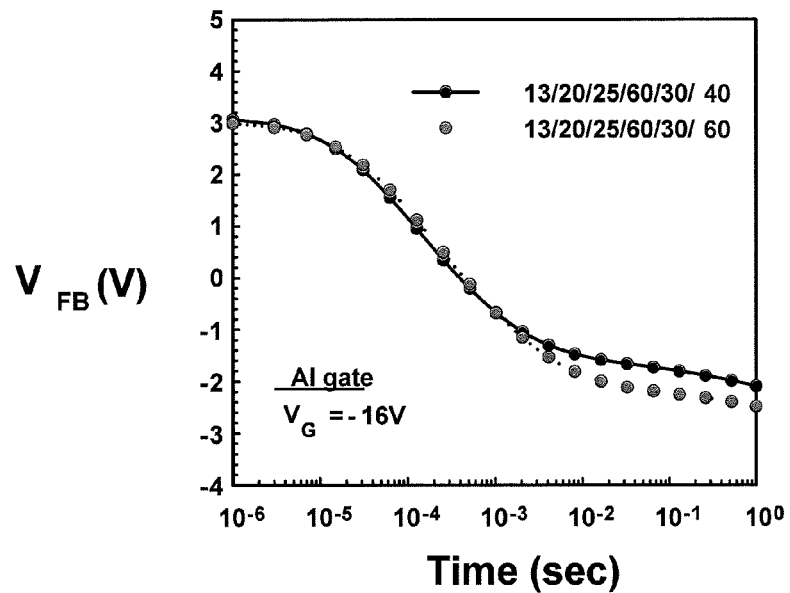
FIG. 46 shows erase characteristics of MA BE-SONOS with different $Al_2O_3$ thicknesses. Very thin $Al_2O_3$ (4 nm) top-capping layer shows successful erase performance, with low erase saturation level ($V_{FB}$<-2 V).
Figure 47:
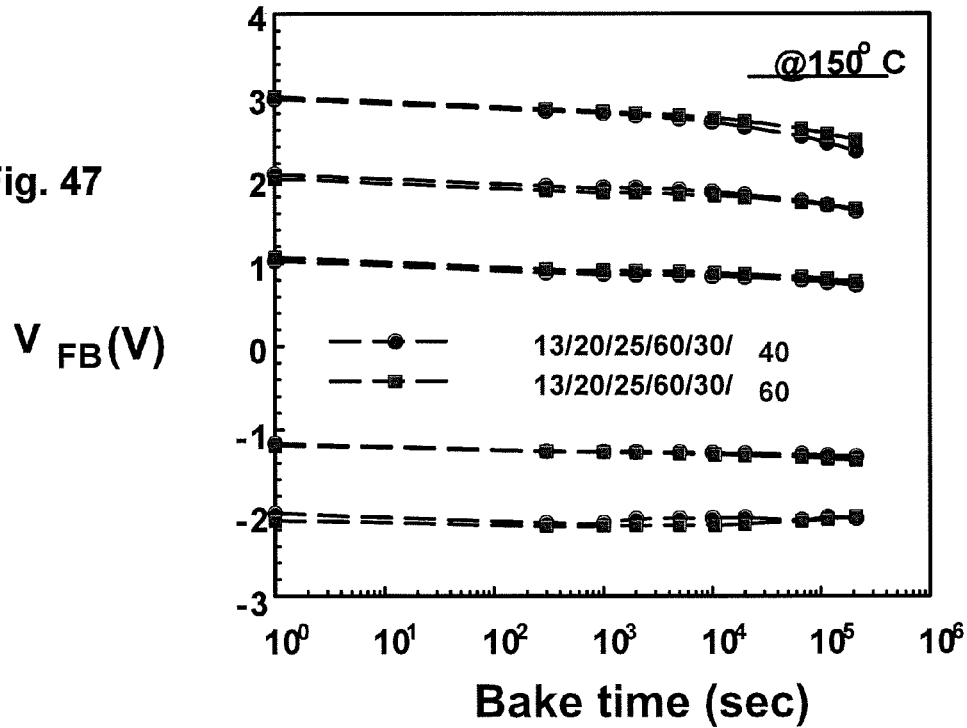
FIG. 47 shows bake retention of MA BE-SONOS with a $SiO_2$ buffer layer but various $Al_2O_3$ thicknesses at 150° C. The gate material is aluminum (Al).

The scaling capability of $Al_2O_3$ top dielectric was also investigated. In FIG. 46, various $Al_2O_3$ thickness in MA BE-SONOS are compared. It shows that both a 4 nm $Al_2O_3$ and 3 nm oxide buffer layer can maintain good erase performance. In FIG. 47, the 4 nm $Al_2O_3$ and 3 nm buffer oxide also possesses good data retention.

Although the above read function describes a random access read operation, one of ordinary skill in the art should recognize that a page read of multiple cells are possible without departing from the spirits of the present invention. The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. An integrated circuit, comprising:
    a semiconductor body;
    a plurality of AND device structures, comprising:
        a first plurality of parallel structures over the semiconductor body, respective parallel structures in the first plurality of parallel structures including a sub-gate positioned to create an inversion layer in the semiconductor body under the respective parallel structure in the first plurality of parallel structures; and
        a second plurality of parallel structures over the semiconductor body, the second plurality of parallel structures having a substantially perpendicular orientation relative to the first plurality of parallel structures, respective parallel structures in the second plurality of parallel structures including:
            a tunneling dielectric layer on the semiconductor body, wherein the tunneling dielectric layer includes a first silicon oxide layer adjacent the semiconductor body and having a thickness of 30 Å or less, a silicon nitride layer on the first silicon oxide layer having a thickness of 30 Å or less, and a silicon oxide layer on the silicon nitride layer having a thickness of 30 Å or less;
            a charge trapping layer on the tunnel dielectric layer, wherein the charge trapping layer comprises silicon nitride having a thickness of 50 Å or more;
            a blocking dielectric layer on the charge trapping layer; and
            a control gate on the blocking dielectric layer.

2. The circuit of claim 1, wherein the respective parallel structures in the second plurality of parallel structures are positioned to create a read current in the semiconductor body under the respective parallel structure in the second plurality of parallel structures.

3. The circuit of claim 1, wherein:
the tunneling dielectric layer includes a first silicon oxide layer adjacent the semiconductor body and having a thickness of 15 Å or less, a silicon nitride layer on the first silicon oxide layer having a thickness of 30 Å or less, and a silicon oxide layer on the silicon nitride layer having a thickness of 35 Å or less, and
the charge trapping layer comprises silicon nitride having a thickness of 50 Å or more.

4. The circuit of claim 1, further comprising:
circuitry coupled to the plurality of AND device structures, the circuitry providing at least one bias arrangement to cause hole tunneling across the tunneling dielectric layer.

5. The circuit of claim 1, wherein the respective parallel structures in the second plurality of parallel structures are positioned to create a read current in the semiconductor body under the respective parallel structure in the second plurality of parallel structures, and
wherein the read current electrically connects to at least one inversion layer created by at least one of the first plurality of parallel structures, the read current having a magnitude varying with charge at the charge trapping layer.

6. The circuit of claim 1, wherein every other parallel structure of the first plurality of parallel structures is electrically interconnected.

7. The circuit of claim 1, wherein every fourth parallel structure of the first plurality of parallel structures is electrically interconnected.

8. The circuit of claim 1, wherein the plurality of AND device structures further comprises:
a plurality of parallel diffusions in the semiconductor body, the plurality of plurality of parallel diffusions being parallel to the first plurality of parallel structures.

9. The circuit of claim 1, wherein the plurality of AND device structures further comprises:
a plurality of parallel diffusions in the semiconductor body, the plurality of plurality of parallel diffusions being parallel to the first plurality of parallel structures,
wherein the respective parallel structures in the second plurality of parallel structures are positioned to create a read current in the semiconductor body under the respective parallel structure in the second plurality of parallel structures, and
wherein the read current is electrically connected to at least one parallel diffusion of the plurality of parallel diffusions.

10. The circuit of claim 1, wherein the respective parallel structures in the second plurality of parallel structures are positioned to create a read current in the semiconductor body under the respective parallel structure in the second plurality of parallel structures, and
wherein the read current is electrically connected to at least two inversion layers created on both sides of the respective parallel structure in the second plurality of parallel structures, the read current having a magnitude varying with charge at the charge trapping layer.

11. The circuit of claim 1, wherein the respective parallel structures in the second plurality of parallel structures are positioned to create a read current in the semiconductor body under the respective parallel structure in the second plurality of parallel structures, and
wherein the read current is electrically connected to at least two inversion layers created on both sides of the respective parallel structure in the second plurality of parallel structures, parallel diffusions in the semiconductor body being absent between said at least two inversion layers, the read current having a magnitude varying with charge at the charge trapping layer.

12. The circuit of claim 1, wherein the first plurality of parallel structures are positioned to perform source-side injection during programming.

13. An integrated circuit, comprising:
a semiconductor body;
a first device structure positioned to create a read current in the semiconductor body under the first device structure, including:
a tunneling dielectric layer on the semiconductor body, wherein the tunneling dielectric layer includes a first silicon oxide layer adjacent the semiconductor body and having a thickness of 30 Å or less, a silicon nitride layer on the first silicon oxide layer having a thickness of 30 Å or less, and a silicon oxide layer on the silicon nitride layer having a thickness of 30 Å or less;
a charge trapping layer on the tunnel dielectric layer, wherein the charge trapping layer comprises silicon nitride having a thickness of 50Å or more;
a blocking dielectric layer on the charge trapping layer; and
a control gate on the blocking dielectric layer; and
a second device structure proximate to the first device structure and including a sub-gate positioned to create an inversion layer in the semiconductor body under the second device structure to control read access of the adjacent first device structure without controlling read access of nonadjacent device structures.

* * * * *